United States Patent [19]
Uchiyama et al.

[11] Patent Number: 5,737,272
[45] Date of Patent: Apr. 7, 1998

[54] LIQUID CRYSTAL DISPLAY APPARATUS, STRUCTURE FOR MOUNTING SEMICONDUCTOR DEVICE, METHOD OF MOUNTING SEMICONDUCTOR DEVICE, ELECTRONIC OPTICAL APPARATUS AND ELECTRONIC PRINTING APPARATUS

[75] Inventors: Kenji Uchiyama; Eiji Muramatsu; Masaru Kamimura; Shigetoshi Yamada; Kenichi Maruyama; Seiichi Sakura; Kazuaki Furuichi; Kinichi Maeda, all of Suwa, Japan

[73] Assignee: Seiko Epson Corporation, Tokyo, Japan

[21] Appl. No.: 117,899

[22] Filed: Sep. 8, 1993

[30] Foreign Application Priority Data

| Sep. 8, 1992 | [JP] | Japan | 4-239698 |
|---|---|---|---|
| Jun. 28, 1993 | [JP] | Japan | 5-157323 |
| Jun. 29, 1993 | [JP] | Japan | 5-158610 |
| Jun. 29, 1993 | [JP] | Japan | 5-158611 |
| Jun. 29, 1993 | [JP] | Japan | 5-158612 |
| Jun. 29, 1993 | [JP] | Japan | 5-158613 |
| Jul. 1, 1993 | [JP] | Japan | 5-163645 |
| Jul. 1, 1993 | [JP] | Japan | 5-163646 |
| Jul. 1, 1993 | [JP] | Japan | 5-163647 |
| Jul. 1, 1993 | [JP] | Japan | 5-163648 |
| Jul. 23, 1993 | [JP] | Japan | 5-182924 |
| Aug. 12, 1993 | [JP] | Japan | 5-200865 |

[51] Int. Cl.$^6$ .................................................. G09G 5/00
[52] U.S. Cl. ..................... 345/206; 345/87; 349/150
[58] Field of Search ........................... 345/87, 98, 206, 345/903, 905; 349/150

[56] References Cited

U.S. PATENT DOCUMENTS

| 4,613,855 | 9/1986 | Person et al. ....................... 345/206 |
| 4,655,551 | 4/1987 | Washizuka et al. ................. 349/150 |
| 4,758,896 | 7/1988 | Ito . | |
| 4,907,128 | 3/1990 | Solomon et al. . | |
| 5,029,984 | 7/1991 | Adachi et al. . | |

FOREIGN PATENT DOCUMENTS

| 0 027 017 | 4/1981 | European Pat. Off. . |
| 0 149 458 | 7/1985 | European Pat. Off. . |
| 3731787 A1 | 3/1989 | Germany . |
| 61-221779 | 10/1986 | Japan . |
| 63210914 | 9/1988 | Japan . |
| 2045998 | 2/1990 | Japan . |
| 2-137822 | 5/1990 | Japan . |
| 2-214826 | 8/1990 | Japan . |
| 2213147 | 8/1990 | Japan . |
| 2214826 | 8/1990 | Japan . |
| 2223925 | 9/1990 | Japan . |
| 3-83019 | 4/1991 | Japan . |
| 4-115228 | 4/1992 | Japan . |
| 4-283722 | 10/1992 | Japan . |
| 2 077 036 A | 12/1981 | United Kingdom . |
| WO 88/05251 | 7/1988 | WIPO . |

OTHER PUBLICATIONS

"Integrated Surface Mount Module I/O Attach;" 2244 Research Disclosure (1990); Aug., No. 316, Emsworth, GB.

*Primary Examiner*—Kee M. Tung
*Assistant Examiner*—Matthew Luu
*Attorney, Agent, or Firm*—Oliff & Berridge

[57] ABSTRACT

A liquid crystal display apparatus is provided which requires a small, thin and compact area for mounting semiconductor chips for driving liquid crystal and, accordingly, has a reduced cost. Semiconductor chips for driving liquid crystal are mounted on a surface (for example, a first layer) of a multi-layer substrate. The surface has input lines to the chips and output lines from the chips. The input lines have lands for connecting adjacent multi-layer substrates to each other. At least one intermediate layer is formed between an upper layer and a lower layer, the intermediate layer having bus lines. The bus lines and the input lines of the first layer are connected to one another via through holes in the first layer. The output lines of the first layer and terminals of the third layer are connected to one another via through holes in the first, second and third layers.

28 Claims, 82 Drawing Sheets

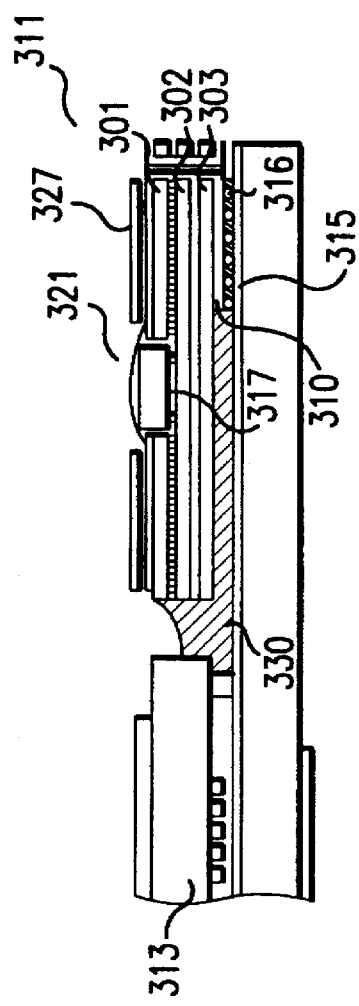
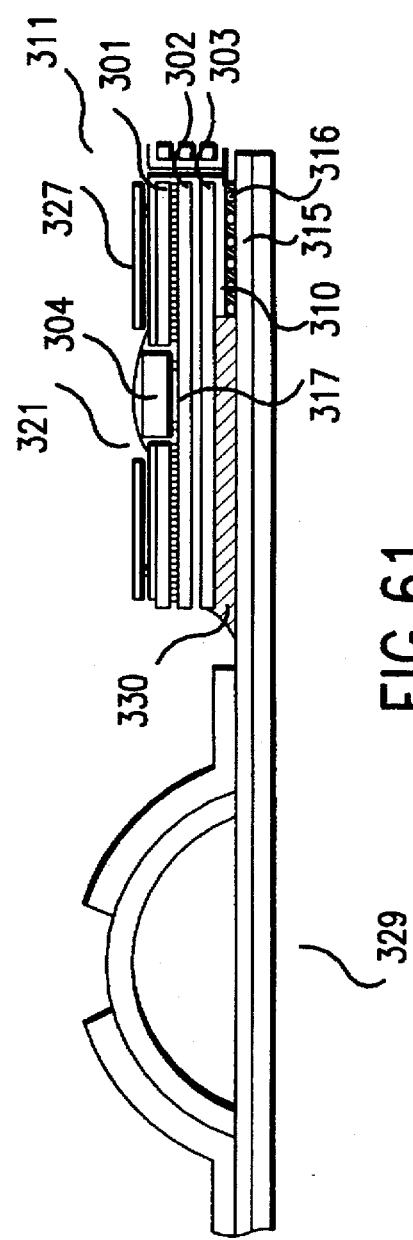
FIG. 60
FIG. 61

LIQUID CRYSTAL DISPLAY APPARATUS, STRUCTURE FOR MOUNTING SEMICONDUCTOR DEVICE, METHOD OF MOUNTING SEMICONDUCTOR DEVICE, ELECTRONIC OPTICAL APPARATUS AND ELECTRONIC PRINTING APPARATUS

BACKGROUND OF THE INVENTION

1. Field of the Invention

The present invention relates to a liquid crystal display apparatus having a plurality of semiconductor chips for driving the liquid crystal display.

2. Description of Related Art

Mounting of a driver IC for driving liquid crystal in a conventional liquid crystal display apparatus will now be described with reference to FIGS. 90, 91, 92 and 93. A driver IC 50041 is mounted on a tape-carrier package (hereinafter referred to as a "TCP") 50042 and connected to a panel 16 while interposing a connection member 19 between the TCP and panel 16. Input lines 50044 and output lines 50045 of the TCP 50042 to and from the driver IC 50041 are disposed on a common surface of the TCP 50042, the connection with the panel 16 being established by using the connection member 19 so that a leading portion 50046 of the output line pattern 50045 on the surface of the TCP substrate 50042 and a panel terminal 18 are connected to each other.

Another method of mounting the driver IC for driving liquid crystal in the conventional liquid crystal display apparatus will now be described with reference to FIGS. 90, 91, 92, 93, 94 and 95. The driver IC 50041 is mounted on the tape-carrier package 50042 and connected to the panel 16 while interposing an anisotropic conductive film 50049 between the TCP and panel 16. In the TCP 50042, the input lines 50044 to the driver IC 50041 and the output lines 50045 from the driver IC 50041 are disposed on the surface of the substrate TCP 50042 and are connected to the panel 16 in such a manner that the leading portion 50046 of the output line pattern 50045 on the surface of the substrate TCP 50042 and the panel terminal 18 are connected using the anisotropic conductive film 50049. The anisotropic conductive film 50049 is mainly made of conductive particles 50050 and an adhesive agent 50051. The thickness (H) of the adhesive agent 50051 is made to be larger than the particle size (D) of the conductive particles 50050. If the thickness (K) of the leading portion 50046 of the TCP 50042 is larger than the particle size (D) of the conductive particle 50050, a connection state shown in FIG. 95 is therefore realized in which the conductive particles 50050 are crushed so that conduction is established. If the thickness (k) of a connection terminal 50046 is smaller than the particle size (D) of the conductive particle 50050, as shown in FIG. 96, the adhesive agent 50051 cannot be displaced sufficiently to cause a reliable electrical connection. In this case, there arises a problem in that the electrical connection by the conductive particles 50050 cannot be established satisfactorily.

The input line 50044 to the driver IC 50041 is, by soldering, connected to another substrate (hereinafter called a "bus substrate") 50043 for supplying input signals and electric power to IC 50041. The bus substrate 50043 is formed into a two-layer shape so that the bus line can be wired in a cross manner. The detailed description about the wired portions and connection portions are omitted here. The major portion of the TCP 50042 and the bus substrate 50043 are positioned outside the outline of the panel 16 causing the area required to mount the semiconductor chip to be very wide. Further, the bus substrate must be used as an individual element and, accordingly, the cost cannot be reduced.

A COG (Chip On Glass) method will now be described with reference to FIG. 93. FIG. 93 is a cross sectional view which illustrates an essential portion in which the semiconductor chip is mounted by the COG method. If a bus line 50048 is intended to be wired on the panel substrate, it must be wired on the panel substrate in a manner crossing an input line 50047 to the driver IC 50041. Since the lines must be formed by thin metal films made of Au or Ni or the like, each line must have a large width in order to reduce its resistance value. Therefore, a large area is required to mount the semiconductor chip, and even worse, the cost cannot be reduced because wiring using the thin metal film must be performed in the cross manner.

A conventional liquid crystal display apparatus includes display pixels defined by a matrix of electrodes formed by line electrodes and column electrodes. Display signals for driving a semiconductor device disposed in the peripheral portion of the liquid crystal display device in a TAB (Tape-Automated-Bonding) manner are supplied to an electrode terminal of the display device, which is connected with an anisotropic conductive adhesive agent or a conductive rubber connector.

FIGS. 97 and 98 illustrate an example of the mounting structure employed in a liquid crystal display apparatus in which a semiconductor device mounted in the TAB manner is connected to a liquid crystal display device.

Referring to FIGS. 97 and 98, a TCP 50151 for driving liquid crystal comprises a semiconductor device 111 for driving liquid crystal which is mounted on a flexible wiring member 50152 in the so-called TAB method. Further, a TCP output terminal 50153 disposed on one side of the TCP 50151 is connected to the terminal portion of a liquid crystal member 110 with an anisotropic conductive agent 115, while a TCP input terminal 50154 and a drive control circuit substrate 50155 disposed on the other side are connected by soldering.

Since the foregoing conventional technology must comprise an individual wiring substrate (the bus substrate) for supplying input signals and electric power to the driver IC and metal thin film lines wired in the cross manner, the area required for mounting the semiconductor chip cannot be reduced. Therefore, there arises a problem in that a liquid crystal display apparatus, the cost and the size of which can be reduced, cannot be provided.

The foregoing conventional technology has an arrangement in which semiconductor devices for driving liquid crystal are, by a TAB mounting method, connected to the electrodes of the liquid crystal display devices in the sequential order of the column (sequentially connected in parallel to the pixels) while being formed into a TCP shape for each semiconductor device. Further, the semiconductor devices are connected to a drive control circuit substrate for supplying electric power for driving liquid crystal and control signals (hereinafter called "bus lines").

Since a liquid crystal display apparatus of the type having the foregoing mounting structure and adapted for color display requires a pixel density three times that of a black and white display apparatus when the same resolution as that realized by the black and white display apparatus is intended to be realized, the number of lines for mutually connecting the TCPs increases excessively, making it difficult if not impossible to maintain reliability in the connections. Further, the drive control circuit substrate must have a precise wiring rule due to the increase in the number of the terminals, and, accordingly, the substrate must be formed into a multi-layer shape. As a result, the size of the liquid crystal display apparatus cannot be reduced and the number of required elements increases undesirably. Therefore, the overall cost of the apparatus cannot be reduced.

FIG. 99 is a view which illustrates the structure of a conventional color liquid crystal display apparatus disclosed in Japanese Patent Laid-Open No. 2-214826. In order to be adaptable to the increased number of the color display pixels, TCPs 50151-1 to 50151-3 are formed into three layers. The portions of the foregoing TCPs 50151-1 to 50151-3 that are connected to the drive control circuit substrate 50155 are arranged in the same manner as those of the structure shown in FIG. 98. Therefore, the number of required connections increases due to the rise in the pixel density. Hence, the defect occurring in the connection cannot be prevented. Even worse, the structure, in which the TCPs are stacked, causes the semiconductor device to project in the direction of the thickness, resulting in a problem in that the size of the apparatus cannot be reduced.

SUMMARY OF THE INVENTION

The present invention is directed to overcome the foregoing problem.

Accordingly, an object of the present invention is to provide a liquid crystal display apparatus which requires a small area for mounting the semiconductor chip for driving liquid crystal thereof, the thickness and the size of which can be reduced and the cost of which can therefore be reduced satisfactorily.

Another object of the present invention is to provide a liquid crystal display apparatus capable of displaying precise and high density color images by a liquid crystal thereof while enabling reduced cost and size.

A liquid crystal display apparatus according to one embodiment of the present invention is characterized in that a semiconductor chip for driving liquid crystal is mounted on the surface of a multi-layer substrate. The multi-layer substrate is electrically connected to a panel terminal of an electro-optical device. An upper substrate in the multi-layer substrate has an upper surface in which an input line pattern to the chip and an output line pattern from the chip are formed. A lower surface of a lower substrate of the multi-layer substrate has a terminal to be connected to a terminal of the panel of the electro-optical device. At least one intermediate substrate is formed between the upper substrate and the lower substrate and has a portion of the input lines and/or the output lines as a circuit pattern. Each of the lines on the various substrates are connected via through holes in the substrates. A plurality of multi-layer substrates are electrically connected to one another by conduction and connection means.

The structure of the liquid crystal display apparatus according to the present invention has an arrangement in which bus lines and connection terminals are formed on the laminated substrates, and a plurality of the semiconductor devices are mounted to be connected to electrodes of the display device. As a result, the drive control circuit substrate can be omitted from the structure and the number of mutual connections between semiconductor devices can be decreased. Therefore, reliability can be improved and the size of the apparatus can be reduced.

Other and further objects, features and advantages of the invention will be appear more fully from the following description.

BRIEF DESCRIPTION OF THE DRAWINGS

FIG. 60 is a cross sectional view that illustrates a state where multi-layer circuit substrates are mounted on an electronic optical apparatus according to a thirtieth embodiment;

FIG. 61 is a cross sectional view that illustrates a state where multi-layer circuit substrates are mounted on an electronic printing apparatus according to a thirty-first embodiment;

DETAILED DESCRIPTION OF PREFERRED EMBODIMENTS

First Embodiment

A first embodiment of the present invention will now be described with reference to FIGS. 1, 2, 3 and 4.

Figure 1:
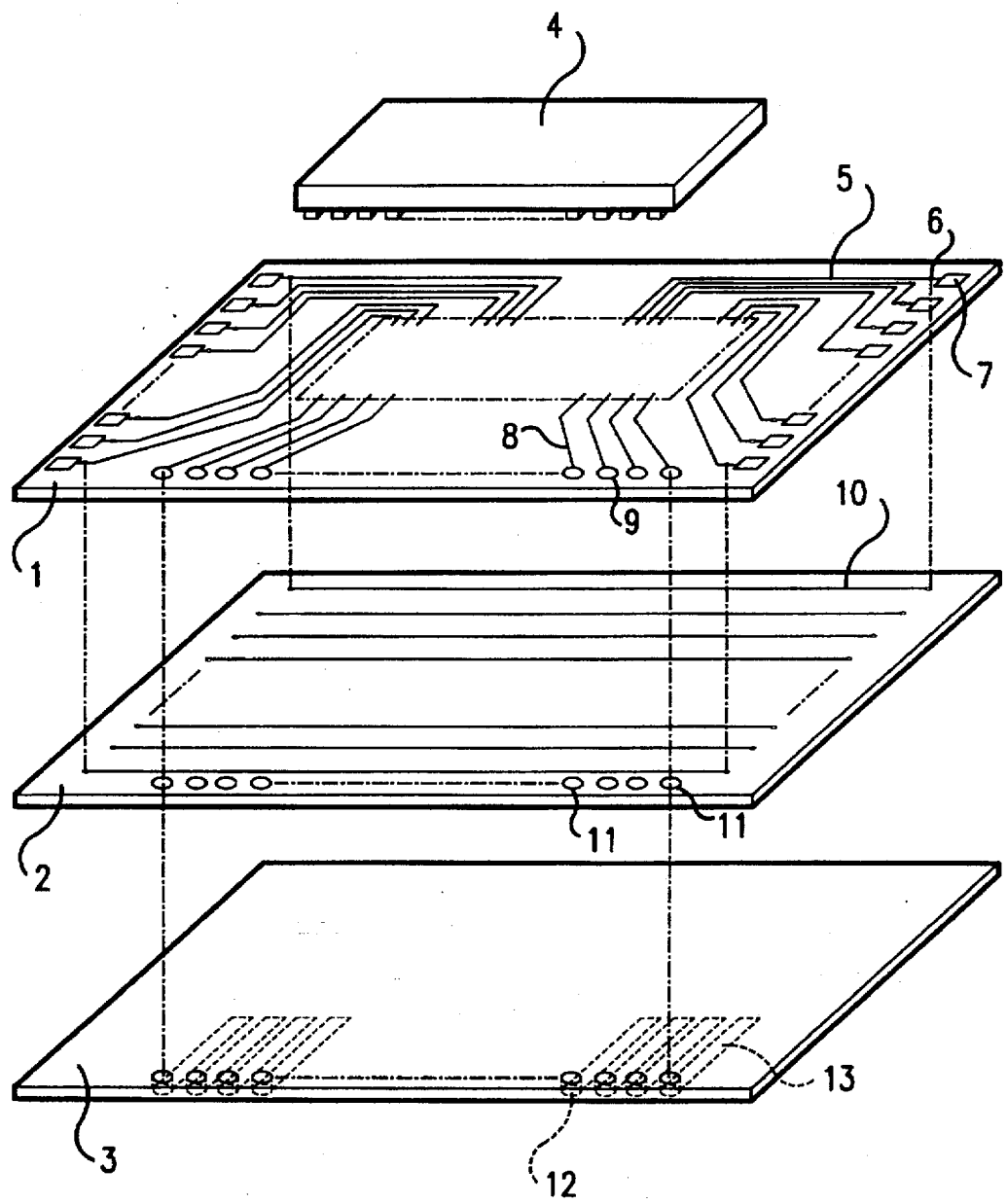
FIG. 1 is an exploded view which illustrates a multi-layer substrate according to a first embodiment of the present invention.

FIG. 1 is an exploded perspective view which illustrates a multi-layer substrate according to the first embodiment of the present invention in which a semiconductor chip for driving liquid crystal is mounted on the surface of a multi-layer substrate by a face-down bonding method.

Reference numerals 1, 2 and 3 represent layers of the multi-layer (three layer) substrate comprised of a first layer 1, a second layer 2 and a third layer 3. A semiconductor chip 4 for driving liquid crystal is mounted on the surface of the first layer 1 in the face-down bonding manner by a known method (for example, a method in which an Au bump of the semiconductor chip 4 is connected to the substrate 1 using Ag paste or a method in which an anisotropic conductive film is used or a flip chip method in which soldering to the bump is performed). After the semiconductor chip 4 for driving liquid crystal has been bonded as described above, molding members 20 (see FIG. 4) are respectively disposed around the semiconductor chip 4 and between the semiconductor chip 4 and the first layer 1 in order to prevent corrosion and to reinforce bonding. The molding members 20 are made solely of epoxy, acryl, urethane or polyester material, or mixtures or compounds thereof in the form of a solvent, or of a thermo-hardening or light hardening type or a mixture thereof. Input lines 5 corresponding to input pads of the semiconductor chip 4 are formed on the surface of the first layer 1 by patterning. The input lines 5 are connected to bus lines 10 of the second layer 2 via through holes 6. Further, lands 7 are formed at the leading portions of the input lines 5 for establishing a wire bonding connection with another multi-layer substrate formed similarly and positioned adjacently thereto.

Output lines 8 corresponding to output pads of the semiconductor chip 4 are formed on the surface of the first layer 1 by patterning. Since the pitch of the terminals of the panel is longer than the pitch of the output pads of the semiconductor chip 4, the line pattern is widened on the first layer 1 so that the output pads and the terminals of the panel are aligned to one another. Further, through holes 9 are formed at the leading portions of the output lines 8 so that the output lines 8 pass through holes 11 of the second layer 2 and connect to connection terminals 13 of the panel via through holes 12 of the third layer 3.

Each of the first, second and the third layers 1, 2 and 3 is made of ceramic substrates manufactured by simultaneously sintering alumina bases at low temperature to have a thickness of 0.25 mm. The input lines 5, the output lines 8 and the bus lines 10 are formed by sintering Au, Ag, AgPd or Cu metal paste. Similarly, the through holes 6, 9, 11 and 12 are formed by sintering Au, Ag, AgPd or Cu metal paste. Also the lands 7 and the connection terminals 13 are respectively formed by sintering Au, Ag, AgPd or Cu metal paste. The foregoing elements for each layer are formed by a known print patterning method, and the layers are stacked, sintered and integrated so that forming of the multi-layer substrate is completed. Each of the metal layers formed by patterning and sintering as described above usually has a thickness of about 0.001 mm to about 0.05 mm. The foregoing thickness may be about 0.05 mm to about 0.2 mm in order to reduce the resistance value.

Depending upon the pitch of the lines and upon the dimension accuracy, the input lines 5, the lands 7, the output lines 8 on the first layer 1 and the connection terminals 13 on the reverse side of the third layer 3 may be formed by photolithographic patterning after the Au, Ag, AgPd or Cu metal paste or their mixture has been printed on the entire surface. In this case, the thickness of the formed pattern is about 0.001 mm to about 0.2 mm. As an alternative to employing the printing method, the pattern may be formed by a photolithographic method or a plating method after Au, Ag or Cu has been evaporated or after the thin film has been formed by sputtering. In this case, the thickness of the formed pattern is about 0.0005 mm to about 0.1 mm.

Since the ceramic substrates subjected to the sintering process exhibit excellent dimensional stability against moisture, excellent connection stability can be realized in the portion in which the semiconductor chip 4 and the multi-layer circuit substrate 14 are connected to each other and in the portion in which the connection terminals 13 of the multi-layer circuit substrate 14 and the panel terminals 18 are connected to one another.

Each of the first, second and the third layers 1, 2 and 3 may be made of different materials, for example, a glass epoxy plate made of a composite material of glass fiber and epoxy resin. The thickness of the glass epoxy plate may be about 0.05 mm to about 0.8 mm in place of the employed thickness of 0.1 mm. The input lines 5, the output lines 8, the through holes 10, the lands 7 and the connection terminals 13 for each layer are formed by a known subtractive method or an additive method in which metal, such as copper, is patterned. The through holes 6, 9, 11 and 12 are, by a known plating method using metal such as copper, formed for each layer or collectively while stacking the layers. Although the thickness of the patterned metal is about 0.001 mm to about 0.035 mm, it may be about 0.035 mm to about 0.2 mm in order to reduce the resistance and to permit large electric currents to flow. The surface of each of the input lines 5, the output lines 8, the bus lines 10, the lands 7, the connection terminals 13, the through holes 6, 9, 11 and 12 may be applied with plating using solely metal, such as Ni, Au, Cr, Co, Pd, Sn, Pb or In or mixtures thereof, plating being performed to have a thickness of about 0.00005 mm to about 0.05 mm. If a glass epoxy plate is used, the thickness can be decreased as compared with the foregoing ceramic substrate. Further, the cost can be reduced because ordinary material and manufacturing process can be employed.

Each of the first, second and the third layers 1, 2 and 3 may be formed by an organic resin film made solely of polyimide (PI), polyethylene terephthalate (PET), polyether sulfon (PES), polycarbonate (PC), polyester (PS), cellulose triacetate (TAC), polysulfon (PS), acryl, epoxy, polyether ether ketone (PEEK) or polyarylate or mixtures thereof. Although the polyimide film having a thickness of 0.025 mm is employed as the organic resin film, the thickness of the organic resin film may be about 0.001 mm to about 0.5 mm. The input lines 5, the output lines 8, the bus lines 10, the lands 7 and the connection terminals 13 for each layer are formed by a known subtractive method or by an additive method in which metal, such as copper, is patterned. The through holes 6, 9, 11 and 12 are formed collectively for each layer or formed after the layers 1, 2 and 3 have been stacked by a known plating method using metal, such as copper. As an alternative to this, a member formed by applying a PI coat (by a known casting method or the like) to metal foil made of, for example, copper, may be patterned and stacked. Although the thickness of the patterned metal is about 0.001 mm to about 0.035 mm, the thickness may be made to be about 0.035 mm to about 0.2 mm in order to reduce the resistance or to permit large electric currents to flow. The surface of each of the lines 5, 8, 10, the lands 7, the connection terminals 13, the through holes 6, 9, 11 and 12 may be applied with plating using solely Ni, Au, Cr, Co, Pd, Sn, Pb or In or mixtures thereof. The thickness of the layers made by plating is about 0.0001 mm to about 0.05 mm. If the organic resin film is used, the thickness can be reduced as compared with the thickness realized by using the ceramic substrate or the epoxy glass plate and the connection between the panel terminal 18 and the connection member 19 can be established easily. Therefore, the connection reliability can be improved and the connection process can be simplified.

Figure 2:
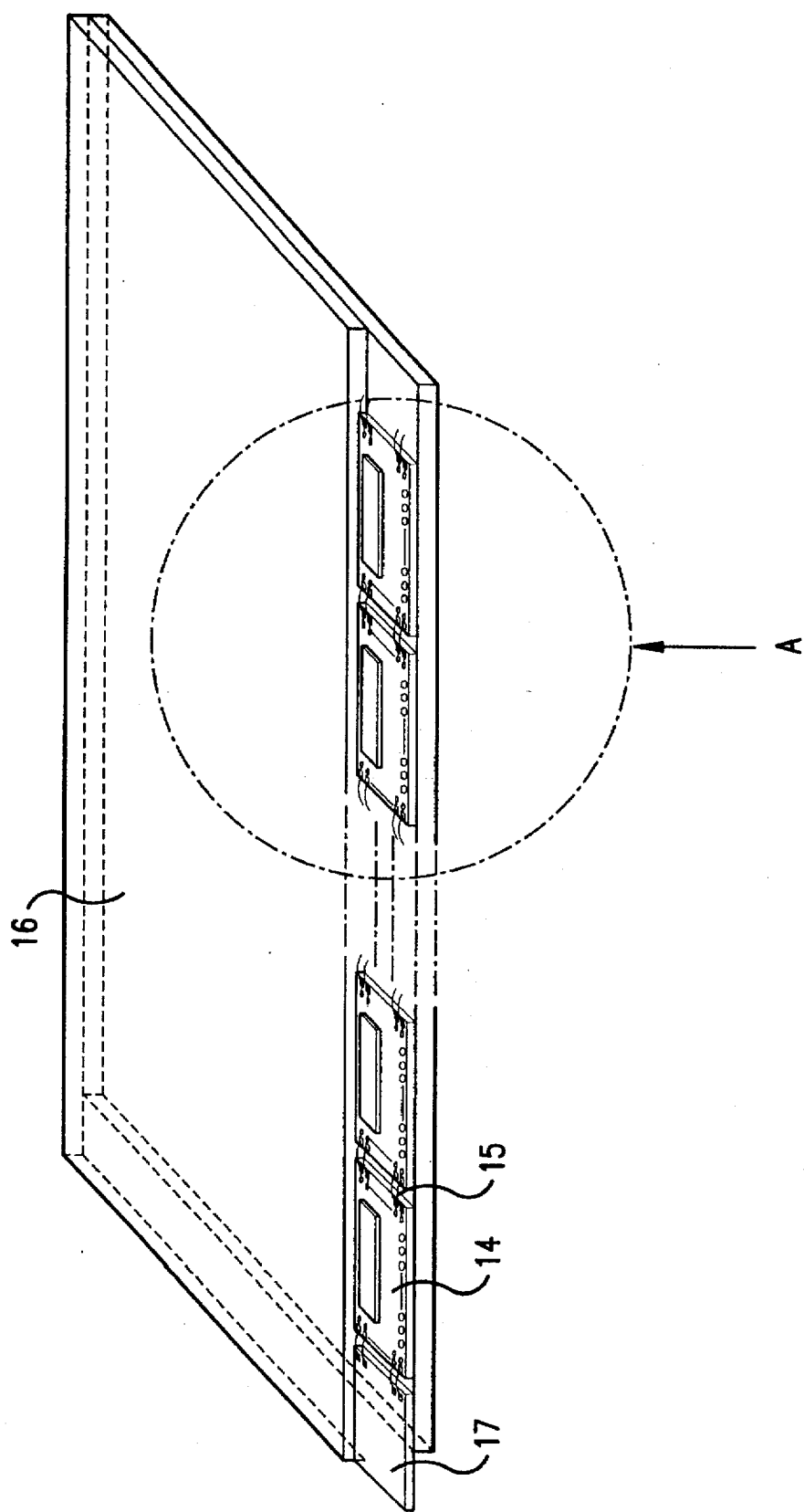
FIG. 2 illustrates a liquid crystal display apparatus according to the first embodiment of the present invention.

FIG. 2 illustrates an example in which the multi-layer substrate according to the first embodiment shown in FIG. 1 is connected to a liquid crystal display panel.

Figure 3:
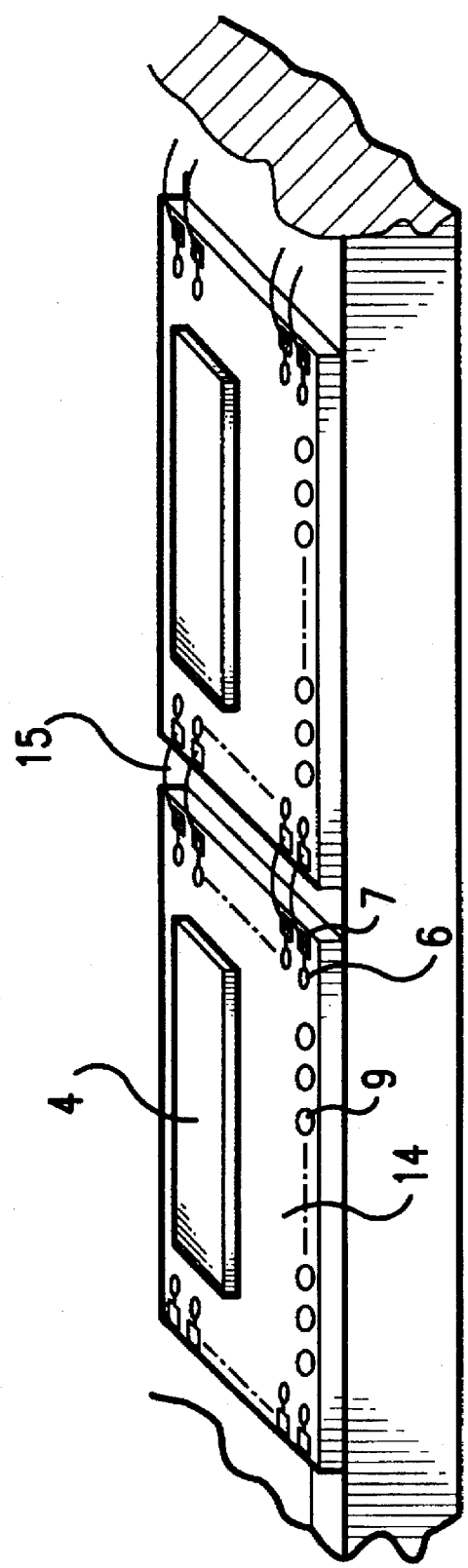
FIG. 3 illustrates a portion of the liquid crystal display apparatus according to the first embodiment of the present invention.

FIG. 3 is an enlarged view which illustrates a portion of the connection portion shown in FIG. 2.

Figure 4:
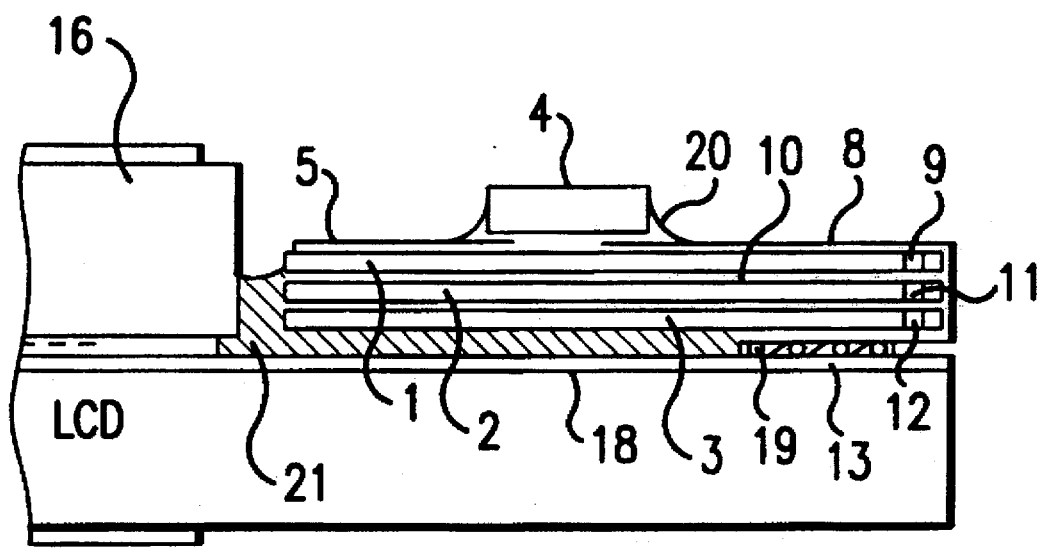
FIG. 4 is a cross sectional view which illustrates a portion of the liquid crystal display apparatus according to the first embodiment of the present invention.

FIG. 4 illustrates the cross section of the portion of the connection portion shown in FIG. 2.

A light crystal display panel (for example, 640 dots×480 dots) 16 has 16 multi-layer substrates 14 according to the first embodiment and shown in FIG. 1 mounted in an X direction and 5 multi-layer substrates 14 arranged in a Y direction, the multi-layer substrates 14 thus disposed being connected to the panel terminals 18. (The terminal portions of the column electrodes extend in the X direction; the terminal portions of the row electrodes extend in the Y direction.) However, 12 multi-layer substrates 14 in the X direction and all 5 multi-layer substrates 14 in the Y direction are omitted in FIG. 2. The input lines of the multi-layer substrates 14 positioned at ends on the X and Y sides of the panel 16 are wire-bonded to a relay substrate 17 by wires 15. The terminals 13 of the multi-layer substrates 14 and the panel terminals 18 are connected to one another by the connection member 19. The connection member 19 establishes electrical connections and somewhat mechanically fixes the multi-layer substrate 14 to the panel.

The connection member 19 is made of an anisotropic conductive film mainly composed of conductive particles and an adhesive agent. The conductive particles are solely soldering particles, solely Ni, Au, Ag, Cu, Pb or Sn particles, or mixtures thereof, or alloy, complex metal particles made by plating, particles formed by plating solely Ni, Co, Pd, Au, Ag, Cu, Fe, Sn or Pb or mixtures thereof on plastic particles (polystyrene, polycarbonate or acryl or the like) or carbon particles. The foregoing adhesive agent is solely styrene butadiene styrene (SBS), epoxy, acryl, polyester or urethane adhesive agent or mixtures or compounds thereof. The anisotropic conductive film is disposed between the panel terminals 18 and the connection terminals 13 of the multi-layer substrate 14. If the anisotropic conductive film is a thermo-hardening film or a blend of a thermoplastic film and a thermo-hardening film, a heating and pressurizing head is abutted against the multi-layer substrate 14 so that the anisotropic film is hardened and connected. If the anisotropic conductive film is an ultraviolet hardening type film, a pressurizing head is abutted against the multi-layer substrate 14 and ultraviolet rays are applied to the anisotropic conductive film from a position adjacent to the panel terminal 18 (adjacent to the glass) to harden the ultraviolet hardening type film.

As the other connection member, an anisotropic conductive adhesive agent mainly composed of conductive particles and an adhesive agent is used. The conductive particles are solely soldering particles, solely Ni, Au, Ag, Cu, Pb or Sn particles, or mixtures thereof or alloy, complex metal particles made by plating, particles formed by plating solely Ni, Co, Pd, Au, Ag, Cu, Fe, Sn or Pb, or mixtures thereof on plastic particles (polystyrene, polycarbonate or acryl or the like), or carbon particles. The foregoing adhesive agent is solely styrene butadiene styrene (SBS), epoxy, acryl, polyester or urethane adhesive agent, or mixtures or compounds thereof. The anisotropic conductive adhesive agent is a fluid or paste agent and is applied to the portion in which the panel terminal 18 is connected by a known method, for example, printing or a dispensing method using a dispenser. If the anisotropic conductive adhesive agent is a thermo-hardening agent or a blended agent of a thermoplastic agent and a thermo-hardening agent, a heating and pressurizing head is abutted against the multi-layer substrate 14 so that the agent is hardened and connected. If the anisotropic conductive film is an ultraviolet hardening type film, a pressurizing head is abutted against the multi-layer substrate 14 and ultraviolet rays are applied to the anisotropic conductive film from a position adjacent to the panel terminal 18 (adjacent to the glass) to harden the ultraviolet hardening type film.

A molding 21 is provided to protect the exposed portion of the panel terminal 18. The molding 21 also serves to fix the multi-layer substrate 14 to the panel. The molding 21 is made of solely epoxy, acryl, urethane or polyester material, or mixtures or compounds thereof of any one of solvent type, thermo-hardening type, or light hardening type or mixtures thereof.

The bus lines between adjacent multi-layer substrates 14 are connected by wire bonding with wires 15 via the lands 7. The wires 15 may be made of metal such as Au, Al or Cu or the like or their alloy (alloy containing Be, Si or Mg or the like included). The width of the wire-bonded portion is determined so as to be narrower than the width of the multi-layer substrate, resulting in that the wire-bonded portion can be mounted in a satisfactorily compact manner in which it is included within the outline of the panel 16.

Figure 21:
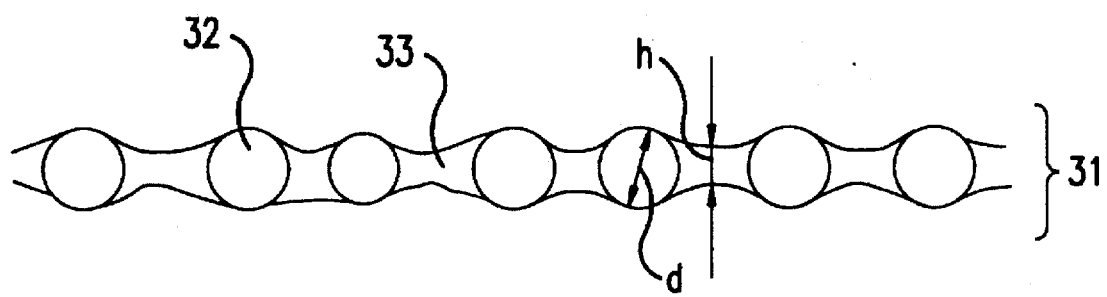
FIG. 21 is a cross sectional view which illustrates an anisotropic conductive film according to an embodiment of the present invention.
Figure 22:
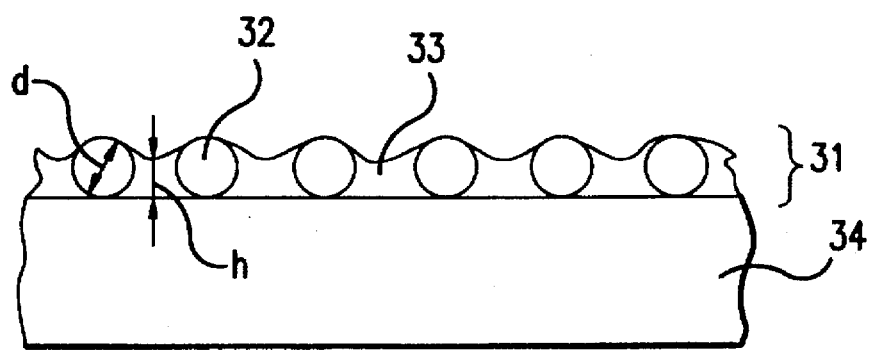
FIG. 22 is a cross sectional view which illustrates an anisotropic conductive film according to another embodiment of the present invention.

The connection member 19 may be an anisotropic conductive film 31 arranged as shown in FIG. 21 and mainly composed of conductive particles 32 and an adhesive agent 33. The thickness (h) of the adhesive agent 33 is made thinner than the particle size (d) of the conductive particles 32. The anisotropic conductive film 31 may be formed on a separator 34 (a teflon or a PET sheet (film) or a paper sheet). The conductive particles 32 are, as shown in FIG. 22, solely soldering particles, Ni, Au, Ag, Cu, Pb or Sn particles, or mixtures or alloys thereof, complex metal particles made by plating, particles formed by plating solely Ni, Au, Cu or Fe or mixtures thereof on plastic particles (polystyrene, polycarbonate or acryl or the like) or carbon particles. The particle size (d) is about 0.001 mm to about 0.020 mm. The adhesive agent 33 is solely styrene butadiene styrene (SBS), epoxy, acrylic, polyester or urethane adhesive agent, or mixtures or compounds thereof having a thickness (h) ranging from about 0.0005 mm to about 0.018 mm.

The anisotropic conductive film 31 is disposed between the panel terminal 18 and the connection terminal 13 of the multi-layer substrate 14. If the anisotropic conductive film 31 is a thermo-hardening agent or a blend type of a thermoplastic agent and a thermo-hardening agent, a heating and pressurizing head is abutted against the multi-layer substrate 14 so that the anisotropic adhesive agent is hardened and connected. If the anisotropic conductive film 31 is an ultraviolet hardening type adhesive agent, a pressuring head is abutted against the multi-layer substrate 14 and ultraviolet rays are applied to the anisotropic conductive adhesive agent from a position adjacent to the panel terminal 18 (adjacent to the glass) to harden and connect the ultraviolet hardening type film. Even if the thickness (k) of the connection terminal 13 of the multi-layer substrate 14 is thinner than the particle size (d) of the conductive particles 32 (in particular, if the pitch of the connection terminals is 0.1 mm or shorter), the adhesive agent 33 can be displaced satisfactorily at the time of applying pressure so that the panel terminal 18 and the connection terminal 13 of the multi-layer substrate 14 can be assuredly electrically connected to each other by the conductive particles 32 (see FIG. 10). The thus established connection state is maintained by the adhesive agent 33 so that satisfactory connection reliability is maintained.

Figure 23:
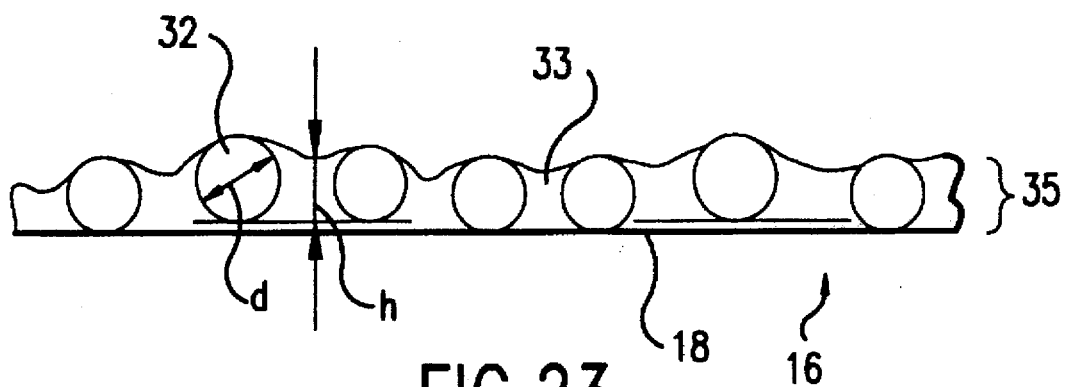
FIG. 23 is a cross sectional view which illustrates an anisotropic conductive film according to another embodiment of the present invention.
Figure 24:
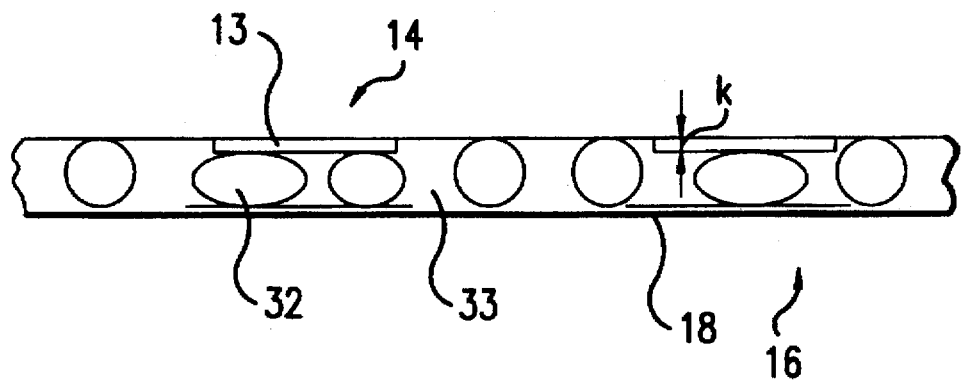
FIG. 24 is a cross sectional view which illustrates a portion of the connection portion of the anisotropic conductive film or an anisotropic conductive adhesive agent.

Another conductive member may be employed as shown in FIG. 23 which has an arrangement that an anisotropic adhesive agent 35 in the form of fluid or paste including the conductive particles 32 and the adhesive agent 33 is applied to the portion in which the panel terminal 16 is connected by a known method, such as a printing method or a dispensing method using a dispenser. At this time, the viscosity and the thixotropic characteristics of the anisotropic conductive agent 35 are controlled so as to make the thickness (h) of the adhesive agent 33 less than the particle size (d) of the conductive particles 32. As a result, the connection can reliably be established as shown in FIG. 24 by a method similar to that for connecting the foregoing anisotropic conductive film with pressure.

As described above, use of the multi-layer substrate according to this embodiment enables the lines to be wired in the cross manner in the same multi-layer substrate as contrasted with the conventional TAB method, which uses individual bus substrates to wire the bus lines in the cross manner. Therefore, the overall size can be reduced as compared with the TAB method by raising the density of the lines wired on the substrate. Further, the cost can be reduced because individual bus lines are not used.

Since the conventional COG method has the arrangement that the cross wiring of the bus lines is performed on the panel substrate, a wide area is required to wire the bus lines. Further, metal lines must be used to reduce the resistance value of the wired lines, resulting in an increase of the cost. However, use of the multilayer substrate according to this embodiment enables the space required to wire the bus lines and the cost to be reduced as compared with the COG method.

Second Embodiment

A second embodiment of the present invention will now be described with reference to FIG. 5.

Figure 5:
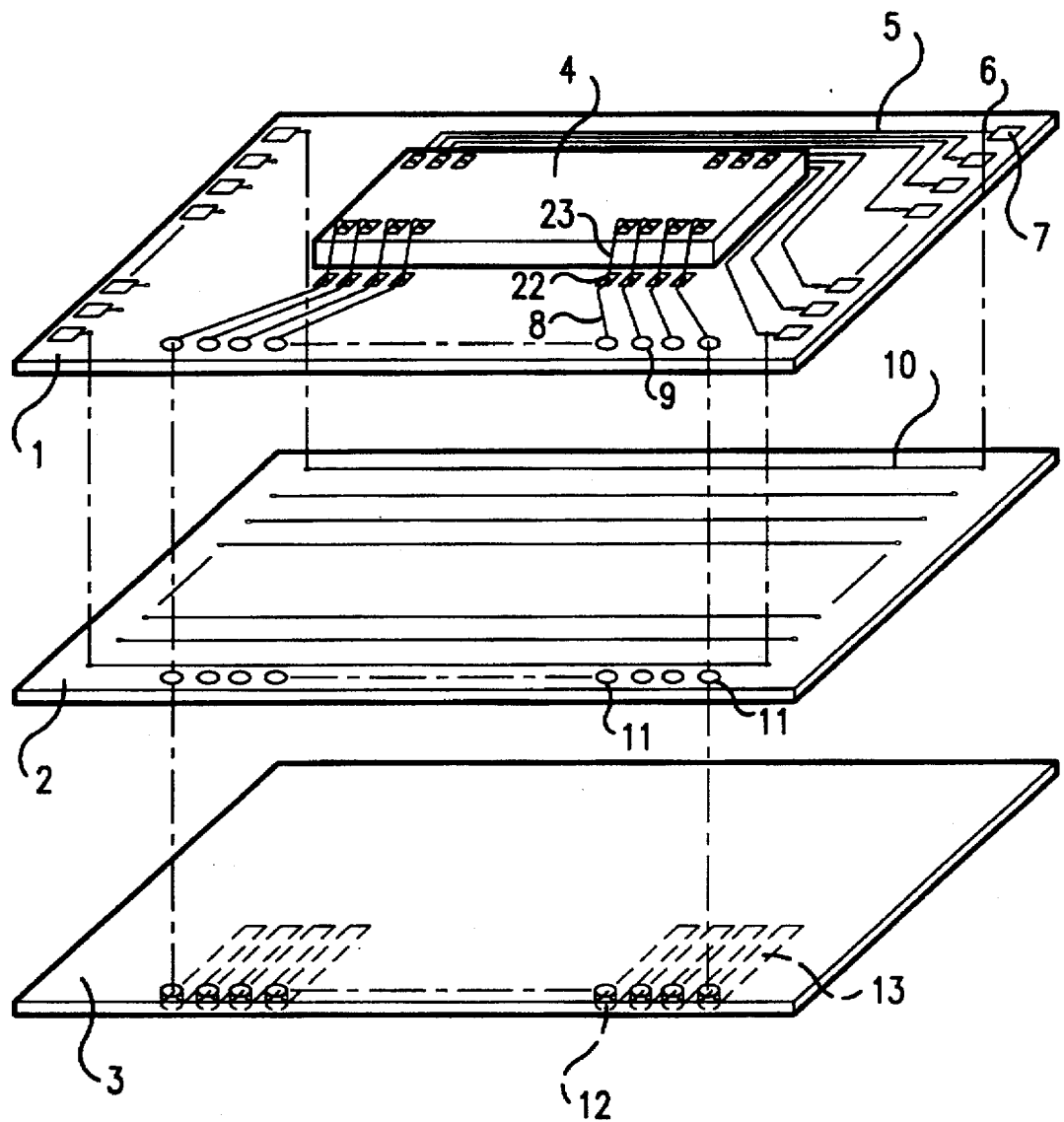
FIG. 5 is an exploded view which illustrates a multi-layer substrates according to a second embodiment of the present invention.

FIG. 5 is an exploded perspective view which illustrates a multi-layer substrate of a liquid crystal display apparatus according to a second embodiment of the present invention in which a semiconductor chip for driving liquid crystal is mounted on the surface of a multi-layer substrate by wire bonding.

Wire bonding lands 22 are, on the surface of the first layer 1 of the multi-layer substrate, formed for the input lines 5 and the output lines 8 to correspond to the input/output pads of the semiconductor chip 4. The other features, such as the pattern, through holes, the method of forming the multi-layer substrate, the arrangement and the structure are the same as those detailed earlier according to the first embodiment.

The lower side of the semiconductor chip 4 is secured to the surface of the multi-layer substrate. Further, the input/output pads of the semiconductor chip 4 and the lands 22 on the surface of the first layer 1 of the multi-layer substrate are wire-bonded to one another. Wire 23 may be used to connect the lands on semiconductor chip 4 to lands 22. Further, although omitted from illustration, a molding material is applied to the bonded portions and the wired portions so that they are protected and reinforced similar to the first embodiment.

The bus lines between the adjacent multi-layer substrates are connected by wire bonding similar to the first embodiment.

As described above, use of the multi-layer substrate according to this embodiment enables the size and the cost to be reduced similar to the first embodiment as compared with the conventional TAB method and the COG method.

Third Embodiment

A third embodiment will now be described with reference to FIG. 6.

Figure 6:
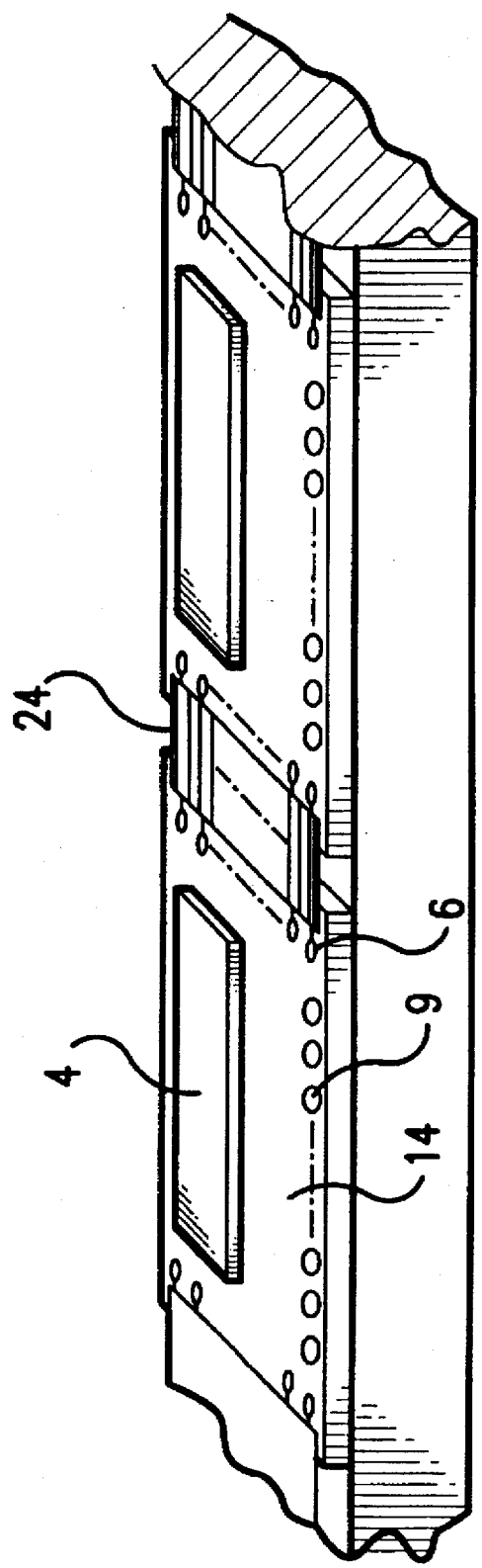
FIG. 6 illustrates a portion of the liquid crystal display apparatus according to a third embodiment of the present invention.

FIG. 6 illustrates a liquid crystal display apparatus according to the present invention in which the multi-layer substrates 14 having face-down-bonded semiconductor chips 4 thereon is connected to the panel terminal 18 of the liquid crystal display panel by using the anisotropic conductive film 19 similar to the first embodiment. A portion of the connection portion is arranged to be similar to that according to the first embodiment shown in FIG. 4. However, the leading portions of the input lines of the first layer 1 of the multi-layer substrate are formed into shapes adaptable to be connected to heat seals or flexible substrates instead of the wire bonding lands used for wires 15.

The bus lines of the adjacent multi-layer substrates 14 are connected to one another by using a connection substrate 24. The connection substrate 24 may be a heat seal or a flexible substrate.

The width of the portion in which the connection substrate 24 is connected is determined so as to be narrower than the width of the multi-layer substrate 14, resulting in that the connection substrate can be mounted in a satisfactorily compact manner in which it is included within the outline of the panel 16 as shown in FIG. 4.

As described above, use of the multi-layer substrate according to this embodiment enables the size and the cost to be reduced similar to the first embodiment as compared with the conventional TAB method and the COG method.

Further, the connection of the semiconductor chip for driving liquid crystal to the surface of the multi-layer substrate, and the electrical connection between the adjacent multi-layer substrates may be established by combining the methods according to the first, second and the third embodiments. In any case, the size and the cost can be reduced similarly.

Further, the multi-layer substrate having the semiconductor chip for use in the foregoing embodiments mounted thereon can be mounted on another display apparatus or on an electronic printing apparatus such that it can be mounted on a plasma display or an EL (Electro Luminescence) display apparatus by changing the foregoing semiconductor chip to a semiconductor chip for driving the plasma display or an appropriate semiconductor chip for driving the EL. By similarly mounting a semiconductor chip for driving a thermal head on the multi-layer substrate and by similarly connecting the multi-layer substrate to the thermal head, application to an electronic printing apparatus can be realized.

Fourth Embodiment

A fourth embodiment will now be described with reference to FIGS. 4, 7, 8, 9 and 10.

Figure 7:
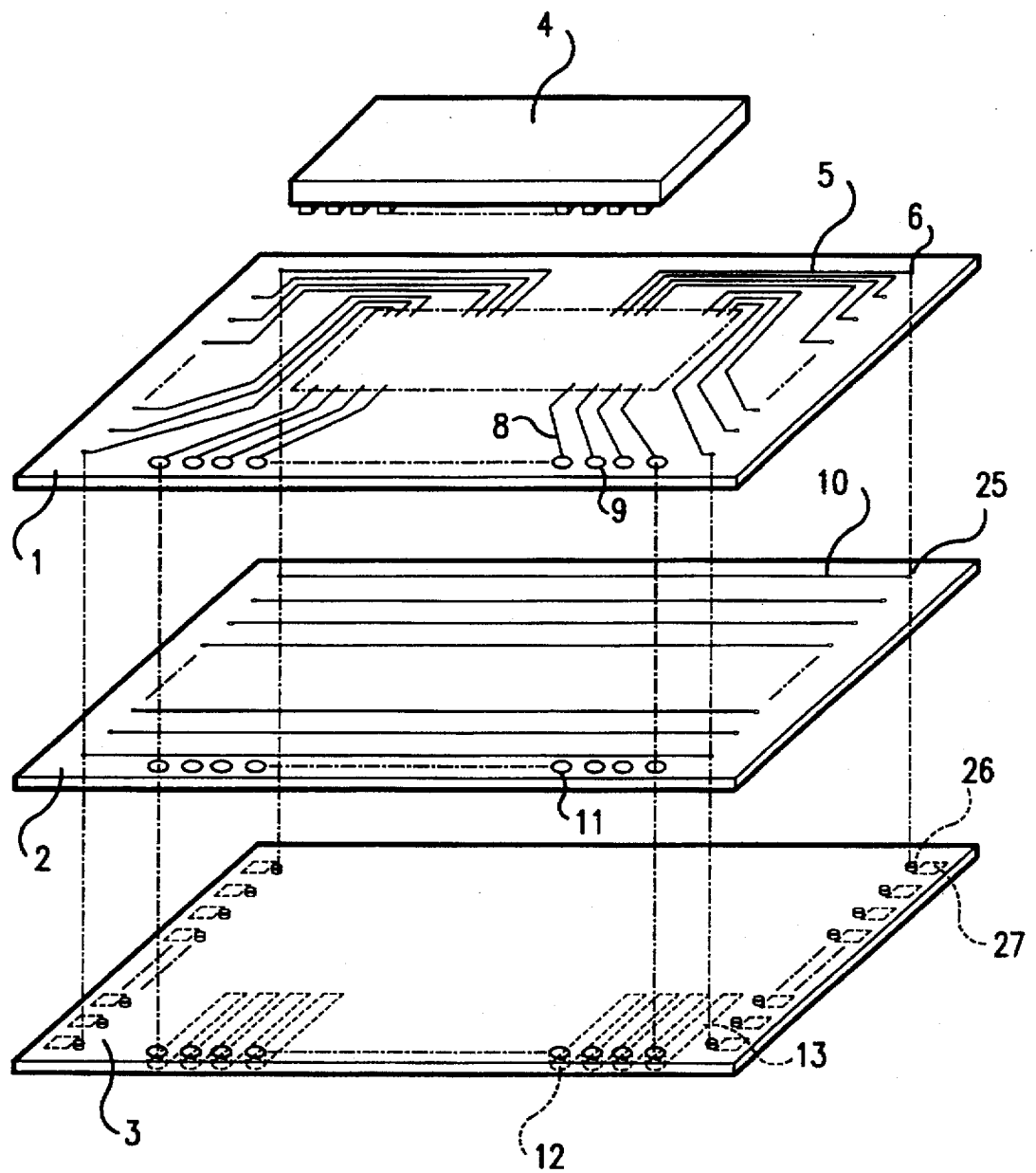
FIG. 7 is an exploded view which illustrates a multi-layer substrates according to a fourth embodiment of the present invention.

FIG. 7 is an exploded perspective view which illustrates a liquid crystal display apparatus according to the present invention in which a multi-layer substrate according to this embodiment includes a semiconductor chip for driving liquid crystal face-down bonded thereon.

Reference numerals 1, 2 and 3 represent layers of the multi-layer substrate comprised of a first layer 1, a second layer 2 and a third layer 3. A semiconductor chip 4 for driving liquid crystal is mounted on the surface of the first layer 1 in the face-down bonding manner by a known method (for example, a method in which an Au bump of the semiconductor is connected to the substrate by using Ag paste, or a method in which an anisotropic conductive film is used, or a flip chip method in which soldering is performed). After the semiconductor chip 4 has been bonded as described above, molding members 20 are respectively disposed around the semiconductor chip 4 and between the semiconductor chip 4 and the first layer 1 in order to prevent corrosion and to reinforce bonding. The molding members 20 are made solely of epoxy, acryl, urethane or polyester material, or mixtures or compounds thereof in the form of a solvent or thermo-hardening or light hardening type or mixtures thereof. Input lines 5 corresponding to input pads of the semiconductor chip 4 are formed on the surface of the first layer 1 by patterning. The input lines 5 are connected to bus lines 10 of the second layer 2 via through holes 6 and through holes 25. Further, the input lines 5 are connected to the connection terminals 27 formed on the reverse side of the third layer 3 via the through holes 26 formed in the third layer 3. The connection terminals 27 are respectively formed into a proper shape to have a proper size and a thickness to be connected to the connection terminals 29 of the bus lines 28 on the panel. The connection terminals 27 are disposed on the side of the multi-layer substrate 14 perpendicular to the side on which the connection terminals 13 for establishing the connection with the panel are disposed. Although the illustrated structure comprises the connection terminals 27 disposed in a line, a two-line configuration may be employed.

Output lines 8 corresponding to output pads of the semiconductor chip 4 are formed on the surface of the first layer 1 by patterning. Since the pitch of the terminals of the panel is longer than the pitch of the output pads of the semiconductor chip 4, the line pattern is widened on the first layer 1 so that the output pads and the terminals of the panel are aligned to one another. Further, through holes 9 are formed at the leading portions of the output lines 8 so that the output lines 8 pass through the through holes 11 of the second layer 2 and are connected to connection terminals 13 of the panel via through holes 12 of the third layer 3. Although a method of making coinciding the pitch of the pads of the semiconductor chip with the pitch of the terminals of the panel of the multi-layer substrate composed of the three layers is described here, the coincidence may be made over a plurality of layers (two or more layers) in place of making only one layer coincide.

Each of the first, second and the third layers 1, 2 and 3 is made of ceramic substrates manufactured by simultaneously sintering alumina bases at low temperature to have a thickness of 0.25 mm. The input lines 5, the output lines 8 and the bus lines 10 are formed by sintering solely or mixtures of Au, Ag, AgPd or Cu metal paste. Similarly, the through holes 6, 9, 11, 12, 25 and 26 are formed by sintering Au, Ag, AgPd or Cu metal paste. Also, the connection terminals 13 and 27 are respectively formed by sintering solely Au, Ag, AgPd or Cu metal paste or mixtures thereof. The foregoing elements for each layer are formed by a known print patterning method, and the layers are stacked sintered and integrated so that forming of the multi-layer substrate is completed. Each of the metal layers formed by patterning and sintering as described above usually has a thickness of about 0.001 mm to about 0.05 mm. The foregoing thickness may be about 0.05 mm to about 0.2 mm in order to reduce the resistance value.

Depending upon the pitch of the lines and upon the dimension accuracy, the input lines 5 and the output lines 8 on the surface of the first layer 1 and the connection terminals 13 and 27 on the third layer 3 may be formed by photolithographic patterning after the Au, Ag, AgPd or Cu metal paste or their mixture paste has been printed on the entire surface. In this case, the thickness of the formed pattern is about 0.001 mm to about 0.2 mm. As an alternative to employing the printing method, the pattern may be formed by a photolithographic method or a plating method after Au, Ag or Cu has been evaporated or after the thin film has been formed by sputtering. In this case, the thickness of the formed pattern is about 0.0005 mm to about 0.1 mm.

Figure 8:
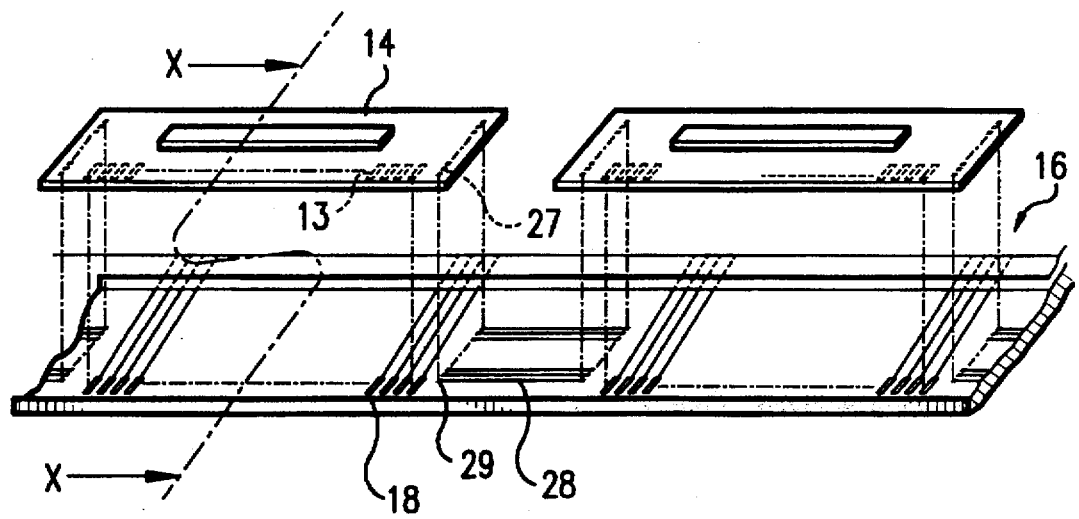
FIG. 8 illustrates a portion of the liquid crystal display apparatus according to the fourth embodiment of the present invention.

FIG. 8 is an exploded view which illustrates a portion in which the multi-layer substrate according to this embodiment shown in FIG. 7 is connected to the liquid crystal display panel. The cross section (section x—x of FIG. 8) of the portion of the connection portion is similar to that shown in FIG. 4 for the first embodiment. Connection terminals 18, bus lines 28 and connection terminals 29 to be disposed at the end portions of the bus lines 28 are, by patterning, formed on the panel 16 to correspond to the portion in which the multi-layer substrate 14 will be mounted. Although a straight-line pattern is formed in the structure shown in FIG. 8, the pattern may be formed to more fully cover the available area if the resistance of the circuit and that of the connections are intended to be reduced. The bus lines 28 on the panel serve as bus lines for establishing the connections between the foregoing multi-layer substrates.

Figure 9:
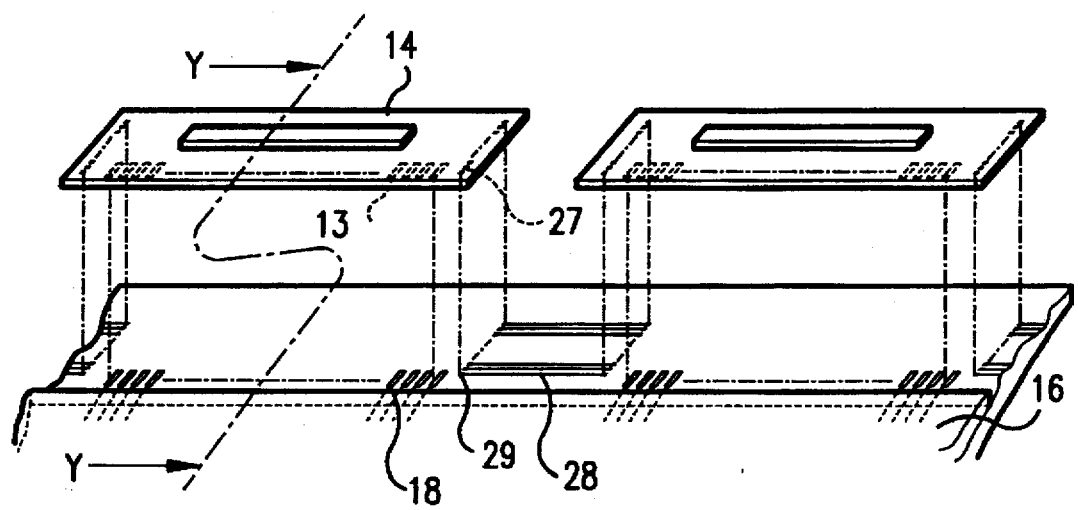
FIG. 9 illustrates a portion of the liquid crystal display apparatus according to the fourth embodiment of the present invention.
Figure 10:
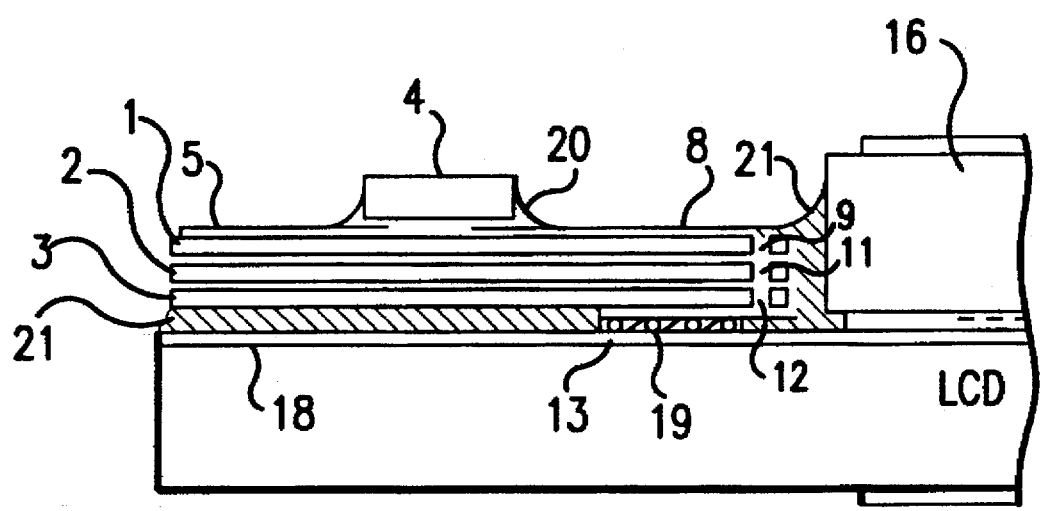
FIG. 10 is a cross sectional view which illustrates a portion of the liquid crystal display apparatus according to the fourth embodiment of the present invention.

FIG. 9 illustrates a structure arranged substantially similar to that according to the embodiment shown in FIG. 8 except for an arrangement in which the connection terminals 13 of the multi-layer substrate 14 are disposed inside the panel 16. The cross section (section y—y of FIG. 9) of the portion of the connection portion is shown in FIG. 10, whereby the length of each of the lines arranged from the panel terminals 18 to the inside portion of the panel can be shorter than that according to the embodiment shown in FIG. 4. As a result, an effect can be obtained in that the circuit resistance can be reduced.

The connection terminals 13, the panel terminals 18, the connection terminals 27 and the panel terminals 28 of the multi-layer substrate 14 are respectively connected to one another by connection members 19. The connection members 19 maintain the electrical connections and also act to fix somewhat the multi-layer substrates 14 to the panel.

The connection member 19 is made of an anisotropic conductive film mainly composed of conductive particles and an adhesive agent. The conductive particles are solely soldering particles, solely Ni, Au, Ag, Cu, Pb or Sn particles, or mixtures or alloys thereof, complex metal particles made by plating, particles formed by plating solely Ni, Co, Pd, Au, Ag, Cu, Fe, Sn or Pb, or mixtures thereof on plastic particles (polystyrene, polycarbonate or acryl or the like), or carbon particles. The foregoing adhesive agent is solely styrene butadiene styrene (SBS), epoxy, acryl, polyester or urethane adhesive agent or mixtures or compounds thereof. The anisotropic conductive film is disposed between the panel terminals 18 and the connection terminals 13 and 27 of the multi-layer substrate 14. If the anisotropic conductive film is a thermo-hardening film or a blend type of a thermoplastic film and a thermo-hardening film, a heating and pressurizing head is abutted against the multi-layer substrate 14 so that the anisotropic film is hardened and connected. If the anisotropic conductive film is an ultraviolet hardening type film, a pressurizing head is abutted against the multi-layer substrate 14 and ultraviolet rays are applied to the anisotropic conductive film from a position adjacent to the panel terminals 18 and 29 (adjacent to the glass) to harden the ultraviolet hardening type film. If the pressurizing head is formed into a U-shape facing sidewards or if a multiplicity of the pressurizing heads are used to correspond to the configuration of the connection terminals 13 and 27, the input/output terminals of the multi-layer substrate 14 can be collectively connected to the corresponding panel terminals 18 and 29 while necessitating only one pressurizing process.

As the other connection member, an anisotropic conductive adhesive agent is used which is mainly composed of conductive particles and an adhesive agent. The conductive particles are solely soldering particles, solely Ni, Au, Ag, Cu, Pb or Sn particles, or mixtures or alloys thereof, complex metal particles made by plating, particles formed by plating sole Ni, Co, Pd, Au, Ag, Cu, Fe, Sn or Pb, or mixtures thereof on plastic particles (polystyrene, polycarbonate or acryl or the like), or carbon particles. The foregoing adhesive agent is solely styrene butadiene styrene (SBS), epoxy, acryl, polyester or urethane adhesive agent, or mixtures or compounds thereof. The anisotropic conductive adhesive agent is a fluid or paste agent and applied to the portion in which the panel terminal 16 is connected by a known method, for example, printing or a dispensing method using a dispenser. If the anisotropic conductive adhesive agent is a thermo-hardening agent or a blended agent of a thermoplastic agent and a thermo-hardening agent, a heating and pressurizing head is abutted against the multi-layer substrate 14 so that the agent is hardened and connected. If the anisotropic conductive adhesive agent is an ultraviolet hardening type adhesive agent, a pressurizing head is abutted against the multi-layer substrate 14 and ultraviolet rays are applied to the anisotropic conductive film from a position adjacent to the panel terminals 18 and 19 (adjacent to the glass) to harden the ultraviolet hardening type film. If the pressurizing head is formed into a U-shape facing sidewards or if a multiplicity of the pressurizing heads are used to correspond to the configuration of the connection terminals 13 and 27, the input/output terminals of the multi-layer substrate 14 can be collectively connected to the corresponding panel terminals 18 and 29 while necessitating only one pressurizing process.

As described earlier, a molding 21 can be provided to protect the exposed portion of the panel terminal 18 from corrosion. The molding 21 also serves to fix the multi-layer substrate 14 to the panel. The molding 21 is made of solely epoxy, acryl, urethane or polyester material, or mixtures or compounds thereof of any one of solvent type, thermo-hardening type, or light hardening type or mixtures thereof.

As shown in FIG. 4, the multi-layer substrate can be mounted in a compact manner within the outline of the panel 16.

As described above, the bus lines formed on the panel to serve as the means for establishing the electrical connections between the multi-layer substrates enables the bus lines to be formed simultaneously with the other lines on the panel. Therefore, an individual forming process does not need to be performed. Further, individual elements such as the heat seal can be omitted. In addition, the fact that the connections of the input and output terminals can be collectively established causes the manufacturing process to be simplified.

Fifth Embodiment

A fifth embodiment will now be described with reference to FIGS. 4, 10, 11, 12, 13 and 14.

Figure 11:
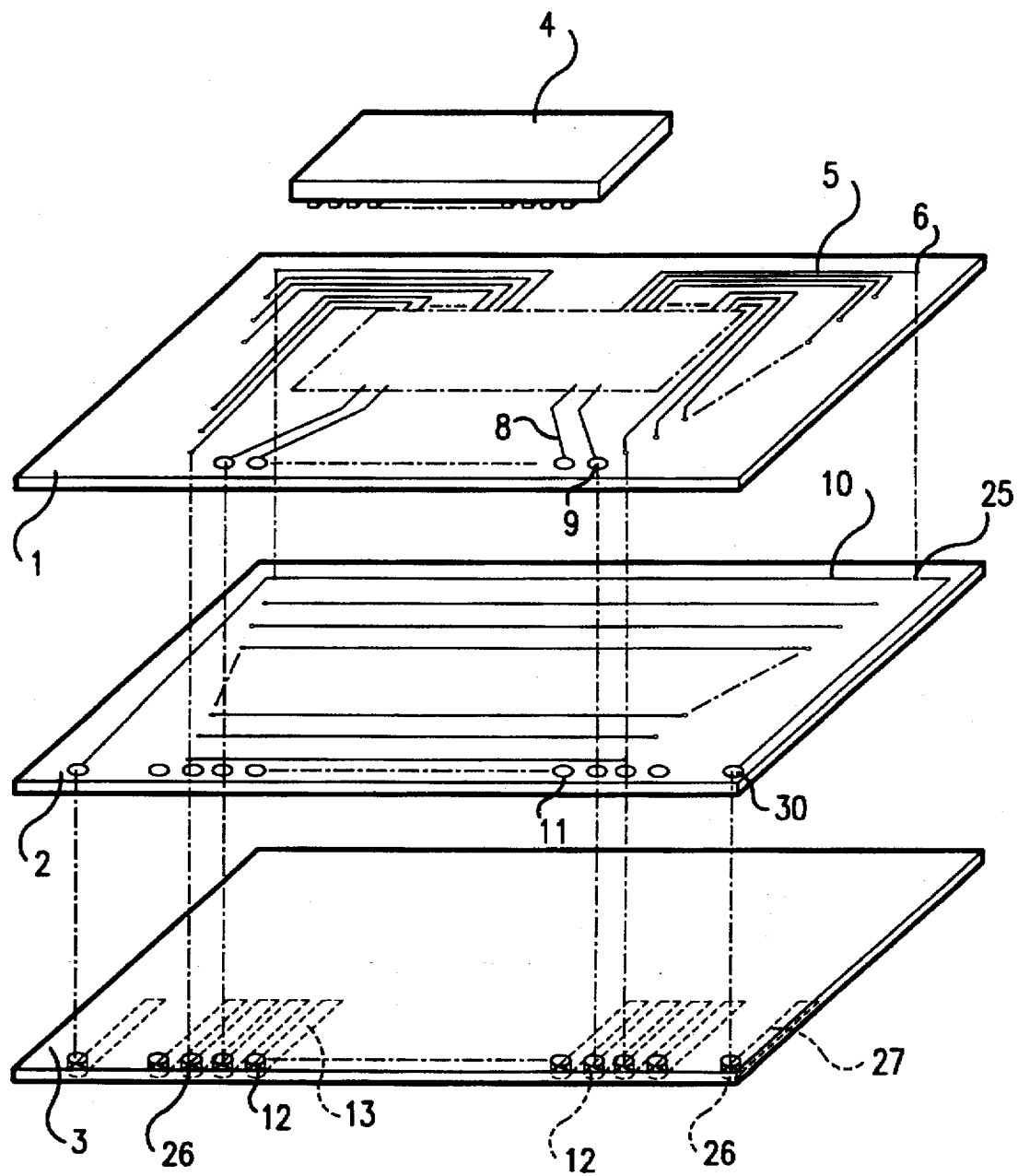
FIG. 11 is an exploded view which illustrates a multi-layer substrate according to a fifth embodiment of the present invention.

FIG. 11 is an exploded perspective view which illustrates a liquid crystal display apparatus according to the present invention in which a multi-layer substrate according to this embodiment includes a semiconductor chip for driving liquid crystal face-down bonded thereon.

Reference numerals 1, 2 and 3 represent layers of the multi-layer substrate comprised of a first layer 1, a second layer 2 and a third layer 3. A semiconductor chip 4 for driving liquid crystal is mounted on the surface of the first layer 1 in the face-down bonding manner by a known method. After the semiconductor chip 4 has been bonded as described above, molding members 20 are respectively disposed around the semiconductor chip 4 and between the semiconductor chip 4 and the first layer 1 in order to prevent corrosion and to reinforce bonding. The molding members 20 are made solely of epoxy, acryl, urethane or polyester material or mixtures or compounds thereof in the form of a solvent or thermo-hardening or light hardening type or mixtures thereof. Input lines 5 corresponding to input pads of the semiconductor chip 4 are formed on the surface of the first layer 1 by patterning. The input lines 5 are connected to bus lines 10 of the second layer 2 via through holes 6 and through holes 25. The bus lines 10 are connected to through holes 30 of the second layer 2 and connected to the connection terminals 27 formed on the reverse side of the third layer 3 via the through holes 30 and the through holes 26 of the second layer 2. The connection terminals 27 are disposed to substantially run parallel to the connection terminals 13. The connection terminals 27 and the connection terminals 13 are formed into the same shape, have the same size and thickness. Although FIG. 11 illustrates the structure in which the connection terminals 13 and 27 respectively have the same shape and are disposed at the same pitch, the connection terminals 13 and 27 may be respectively different from one another. Although the through holes 13 and 26 are disposed in one line, they may be disposed to form plural lines.

Output lines 8 corresponding to output pads of the semiconductor chip 4 are formed on the surface of the first layer 1 by patterning. Since the pitch of the terminals of the panel is longer than the pitch of the output pads of the semiconductor chip 4, the line pattern is widened on the first layer 1 so that the output pads and the terminals of the panel are aligned to one another. Further, through holes 9 are formed at the leading portions of the output lines 8 so that the output lines 8 pass through the through holes 11 of the second layer 2 and are connected to connection terminals 13 of the panel via through holes 12 of the third layer 3. Although a method of making coinciding the pitch of the pads of the semiconductor chip with the pitch of the terminals of the panel of the multi-layer substrate composed of the three layers is described here, the coincidence may be made over a plurality of layers (two or more layers) in place of making only one layer coincide.

Each of the first, second and the third layers 1, 2 and 3 is made of ceramic substrates manufactured by simultaneously sintering alumina bases at low temperature to have a thickness of 0.25 mm. The input lines 5, the output lines 8 and the bus lines 10 are formed by sintering solely or mixtures of Au, Ag, AgPd or Cu metal paste. Similarly, the through holes 6, 9, 11, 12, 25, 26 and 30 are formed by sintering Au, Ag, AgPd or Cu metal paste. Also, the connection terminals 13 and 27 are respectively formed by sintering solely Au, Ag, AgPd or Cu metal paste or mixtures thereof. The foregoing elements for each layer are formed by a known print patterning method, and the layers are stacked, sintered and integrated so that forming of the multi-layer substrate is completed. Each of the metal layers formed by patterning and sintering as described above usually has a thickness of about 0.001 mm to about 0.05 mm. The foregoing thickness may be about 0.05 mm to about 0.2 mm in order to reduce the resistance value.

Depending upon the pitch of the lines and upon the dimensional accuracy, the input lines 5 and the output lines 8 on the surface of the first layer 1 and the connection terminals 13 and 27 on the third layer 3 may be formed by photolithographic patterning after the Au, Ag, AgPd or Cu metal paste or their mixture paste has been printed on the entire surface. In this case, the thickness of the formed pattern is about 0.001 mm to about 0.2 mm. As an alternative to employing the printing method, the pattern may be formed by a photolithographic method or a plating method after Au, Ag or Cu has been evaporated or after the thin film has been formed by sputtering. In this case, the thickness of the formed pattern is about 0.0005 mm to about 0.1 mm.

Figure 12:
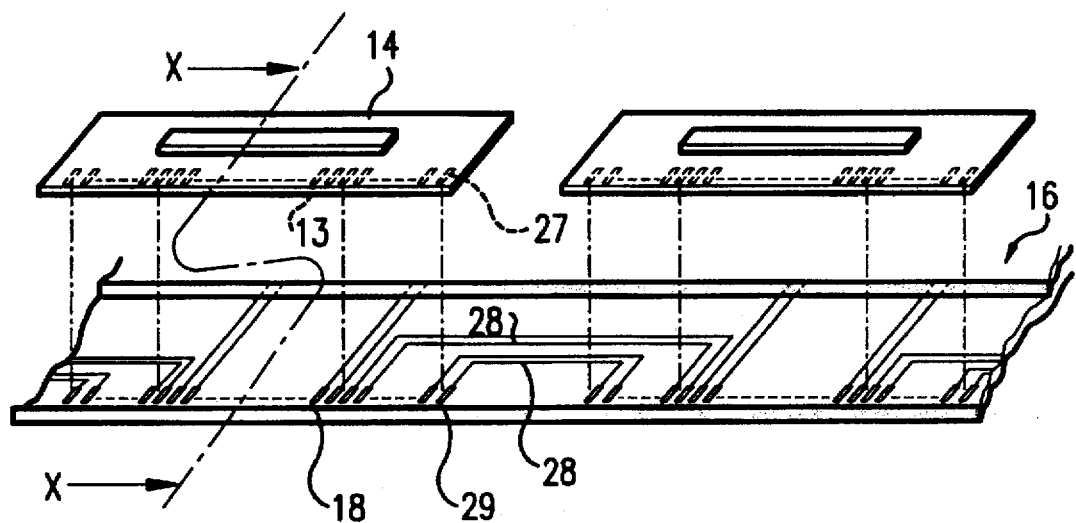
FIG. 12 illustrates a portion of the liquid crystal display apparatus according to the fifth embodiment of the present invention.

FIG. 12 is an exploded view which illustrates a portion in which the multi-layer substrate according to this embodiment shown in FIG. 11 is connected to the liquid crystal display panel. The cross section (section x—x of FIG. 12) of the portion of the connection portion is as shown in FIG. 4, similar to the first embodiment. Connection terminals 18, bus lines 28 and connection terminals 29 to be disposed at the end portions of the bus lines 28 are, by patterning, formed on the panel 16 to correspond to the portion in which the multi-layer substrate 14 will be mounted. The connection terminals 18 and 29 are disposed on one straight line. Although the bus lines 28 are simply illustrated by a continuous line in FIG. 12, they may be arranged to have different pattern widths upon consideration of the circuit resistance and the connection resistance so that the resistance values of the lines are made to be the same. The bus lines 28 on the panel serve as bus lines for establishing the connections between the foregoing multi-layer substrates.

The connection terminals 13, the panel terminals 18, the connection terminals 27 and the panel terminals 28 of the multi-layer substrate 14 are connected to one another by connection members 19. The connection members 19 maintain the electrical connections and also act to fix somewhat the multi-layer substrates 14 to the panel.

The connection member 19 is made of an anisotropic conductive film mainly composed of conductive particles and an adhesive agent. The conductive particles are solely soldering particles, solely Ni, Au, Ag, Cu, Pb or Sn particles, or mixtures or alloys thereof, complex metal particles made by plating, particles formed by plating solely Ni, Co, Pd, Au, Ag, Cu, Fe, Sn or Pb or mixtures thereof on plastic particles (polystyrene, polycarbonate or acryl or the like) or carbon particles. The foregoing adhesive agent is solely styrene butadiene styrene (SBS), epoxy, acryl, polyester or urethane adhesive agent or mixtures or compounds thereof. The anisotropic conductive film is disposed between the panel terminals 18 and the connection terminals 13 and 27 of the multi-layer substrate 14. If the anisotropic conductive film is a thermo-hardening film or a blend type of a thermoplastic film and a thermo-hardening film, a heating and pressurizing head is abutted against the multi-layer substrate 14 so that the anisotropic film is hardened and connected. If the anisotropic conductive film is an ultraviolet hardening type film, a pressurizing head is abutted against the multi-layer substrate 14 and ultraviolet rays are applied to the anisotropic conductive film from a position adjacent to the panel terminals 18 and 29 (adjacent to the glass) to harden the ultraviolet hardening type film. Since the connection terminals 13 and 27 are disposed on one straight line, the pressurizing head may be formed into a simple straight shape so that the connections can be established by using a simple pressurizing and connecting device. Further, the input/output terminals of the multi-layer substrate 14 can be collectively connected to the corresponding panel terminals 18 and 29 while necessitating only one pressurizing process.

As the other connection member, an anisotropic conductive adhesive agent is used which is mainly composed of conductive particles and an adhesive agent. The conductive particles are solely soldering particles, solely Ni, Au, Ag, Cu, Pb or Sn particles or mixtures or alloys thereof, complex metal particles made by plating, particles formed by plating sole Ni, Co, Pd, Au, Ag, Cu, Fe, Sn or Pb or mixtures thereof on plastic particles (polystyrene, polycarbonate or acryl or the like) or carbon particles. The foregoing adhesive agent is solely styrene butadiene styrene (SBS), epoxy, acryl, polyester or urethane adhesive agent or mixtures or compounds thereof. The anisotropic conductive adhesive agent is a fluid or paste agent and is applied to the portion in which the panel terminal 16 is connected by a known method, for example, printing or a dispensing method using a dispenser. If the anisotropic conductive adhesive agent is a thermo-hardening agent or a blended agent of a thermoplastic agent and a thermo-hardening agent, a heating and pressurizing head is abutted against the multi-layer substrate 14 so that the agent is hardened and connected. If the anisotropic conductive adhesive agent is an ultraviolet hardening type adhesive agent, a pressurizing head is abutted against the multi-layer substrate 14 and ultraviolet rays are applied to the anisotropic conductive film from a position adjacent to the panel terminals 18 and 19 (adjacent to the glass) to harden the ultraviolet hardening type film. Since the connection terminals 13 and 27 are disposed on one straight line, the pressurizing head may be formed into a simple straight shape so that the connections can be established by using a simple pressurizing and connecting device. Further, the input/output terminals of the multi-layer substrate 14 can be collectively connected to the corresponding panel terminals 18 and 29 while necessitating only one pressurizing process.

As shown in FIG. 4, the multi-layer substrate can be mounted in a compact manner within the outline of the panel 16.

As described above, the bus lines formed on the panel to serve as the means for establishing the electrical connections between the multi-layer substrates enable the bus lines to be formed simultaneously with the other lines on the panel. Therefore, an individual forming process does not need to be performed. Further, individual elements such as the heat seal can be omitted. In addition, the fact that the connections of the input and output terminals can be collectively established causes the manufacturing process to be simplified.

Figure 13:
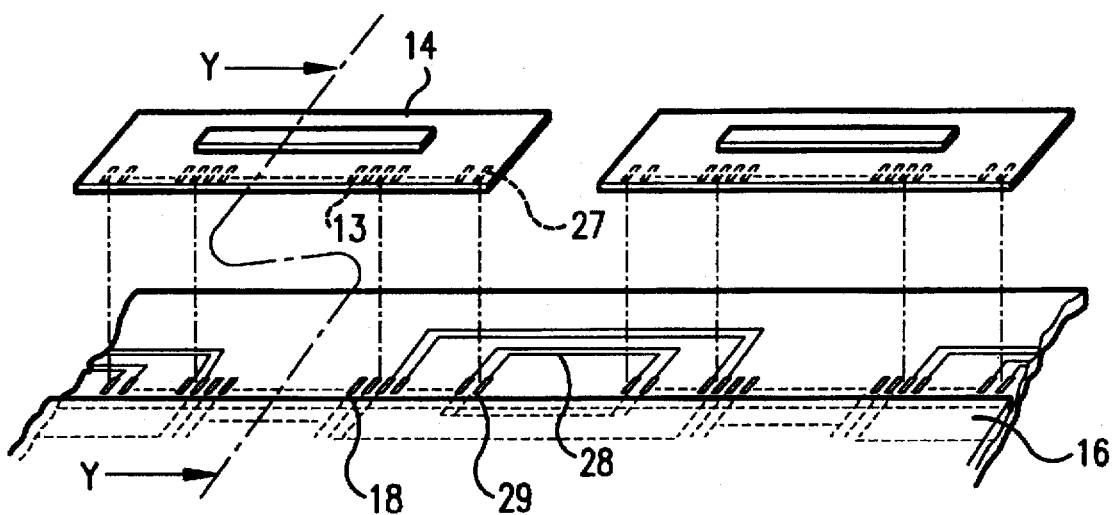
FIG. 13 illustrates a portion of the liquid crystal display apparatus according to the fifth embodiment of the present invention.

FIG. 13 illustrates a structure arranged substantially similar to that according to the embodiment shown in FIG. 12 except for an arrangement in which the connection terminals 13 of the multi-layer substrate 14 are disposed inside the panel 16. The cross section (section Y—Y of FIG. 13) of the portion of the connection portion is as shown in FIG. 10 whereby the length of each of lines arranged from the panel terminals 18 to the inside portion of the panel can be shorter than that according to the embodiment shown in FIG. 4. As a result, an effect can be obtained in that the circuit resistance can be reduced.

The connection terminals 13, the panel terminals 18, the connection terminals 27 and the panel terminals 28 of the multi-layer substrate 14 are connected to one another by connection members 19. The connection members 19 maintain the electrical connections and also act to fix somewhat the multi-layer substrates 14 to the panel.

Figure 14:
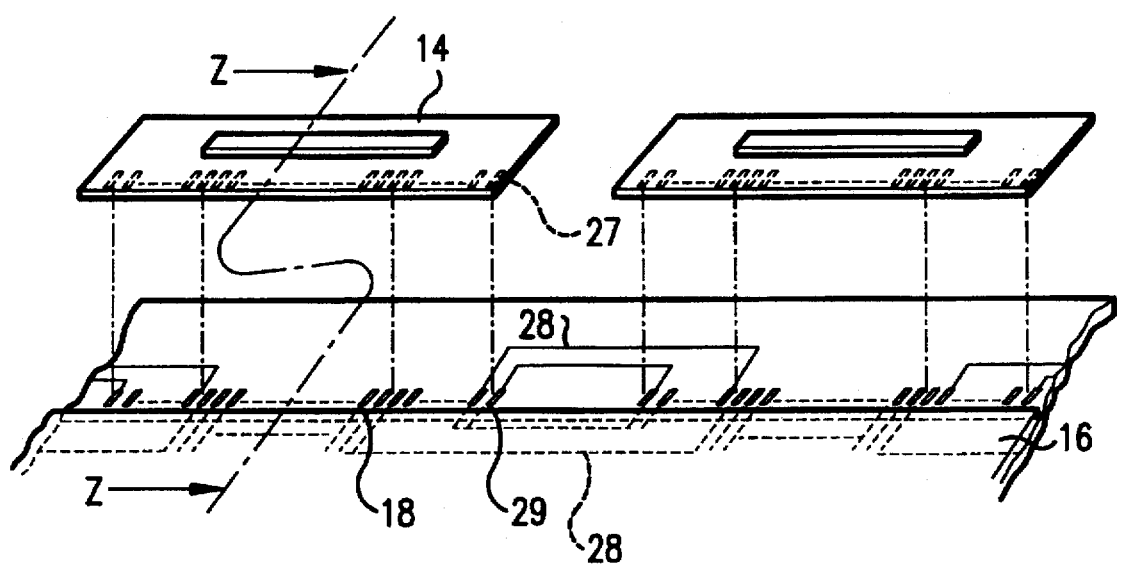
FIG. 14 illustrates a portion of the liquid crystal display apparatus according to the fifth embodiment of the present invention.

FIG. 14 illustrates a structure arranged similar to that according to the embodiment shown in FIG. 12 except for an arrangement that the bus lines 28 on the panel are also disposed in an area in the panel that does not affect the display in addition to the area on which the multi-layer substrate 14 will be mounted. Therefore, the area that can be used to form the bus lines 28 can be widened, allowing the width of the bus lines to be enlarged to reduce the circuit resistance, while eliminating a necessity of enlarging the area required to mount the multi-layer substrates 14. The reduction in the resistance value of the bus lines enables an effect to be obtained in that the quality of display made by the liquid crystal display apparatus can be improved. The cross section (section Z—Z of FIG. 14) of the portion of the connection portion is as shown in FIG. 10. As shown in the drawing, a liquid crystal display apparatus can be provided in which the area required to mount the multi-layer substrate 14 can further be reduced and which exhibits excellent quality of display.

As described above, use of the multi-layer substrate according to this embodiment enables the lines to be wired in the cross manner in the same multi-layer substrate as contrasted with the conventional TAB method using individual bus substrate to wire the bus lines in the cross manner. Therefore, the overall size can be reduced as compared with the TAB method by raising the density of the lines wired on the substrate. Further, the cost can be reduced because individual bus lines are not used.

Since the conventional COG method has the arrangement that the cross wiring of the bus lines is performed on the panel substrate, a wide area is required to wire the bus lines. Further, metal lines must be used to reduce the resistance value of the wired lines, resulting in an increase of the cost. However, use of the multi-layer substrate according to this embodiment enables the space required to wire the bus lines and the cost to be reduced as compared with the COG method.

Sixth Embodiment

A sixth embodiment of the present invention will now be described with reference to FIGS. 15, 16, 17 and 18.

Figure 15:
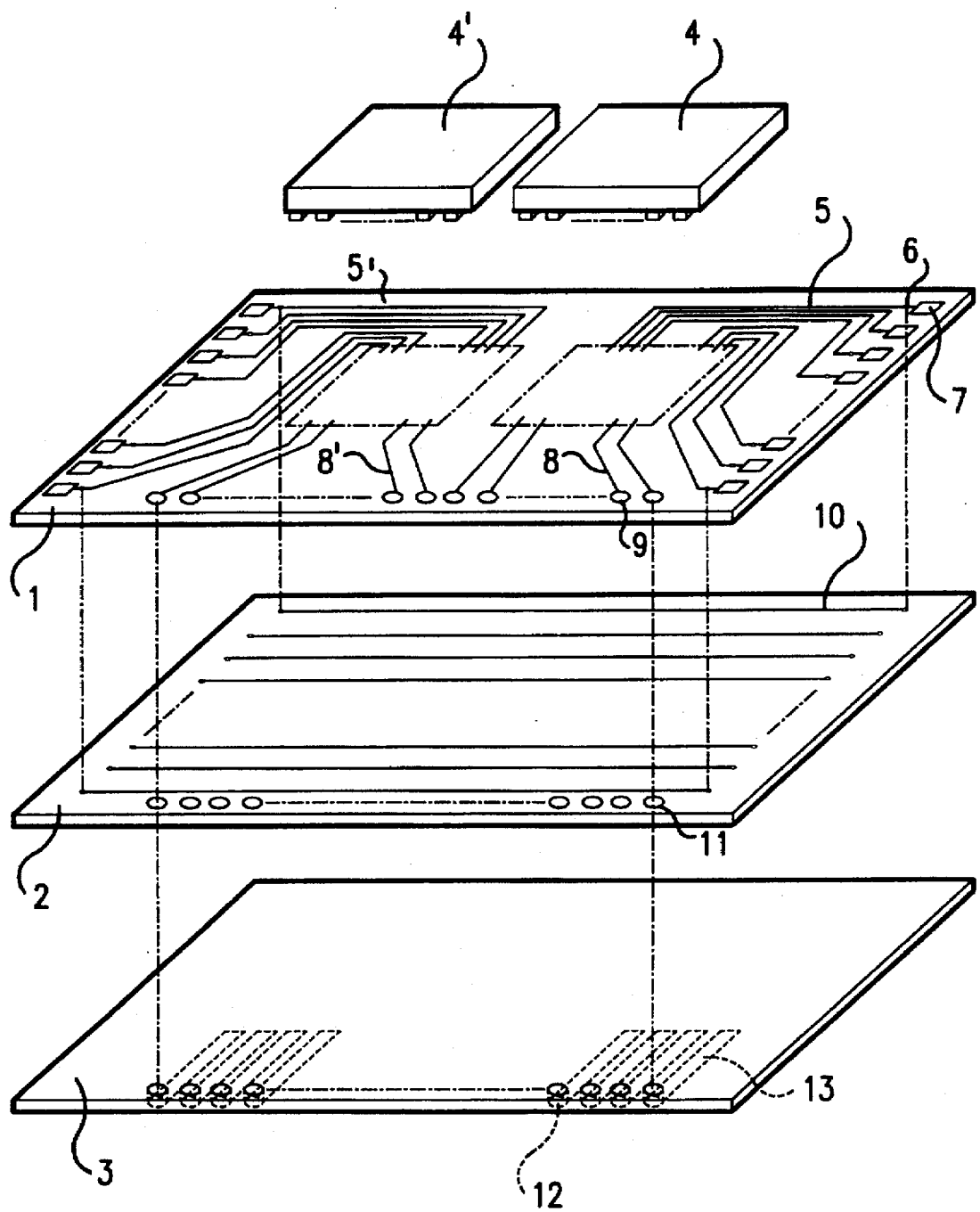
FIG. 15 is an exploded view which illustrates a multi-layer substrate according to a sixth embodiment of the present invention.

FIG. 15 is an exploded perspective view which illustrates a liquid crystal display apparatus according to the present invention in which a multi-layer substrate according to this embodiment includes two semiconductor chips for driving liquid crystal face-down bonded thereon.

Reference numerals 1, 2 and 3 represent layers of the multi-layer substrate comprised of a first layer 1, a second layer 2 and a third layer 3. Semiconductor chips 4 and 4' for driving liquid crystal are mounted on the surface of the first layer 1 in the face-down bonding manner by a known method. After the semiconductor chips 4 and 4' have been bonded as described above, molding members 20 are respectively disposed around the semiconductor chips 4 and 4' and between the semiconductor chips 4 and 4' and the first layer 1 in order to prevent corrosion and to reinforce bonding. Input lines 5 and 5' corresponding to input pads of the semiconductor chips 4 and 4' are formed on the surface of the first layer 1 by patterning. The input lines 5 and 5' are connected to bus lines 10 of the second layer 2 via through holes 6. Further, lands 7 are formed at the leading portions of the input lines 5 and 5' for wire-bonding with another multi-layer substrate.

Output lines 8 and 8' corresponding to output pads of the semiconductor chips 4 and 4' are formed on the surface of the first layer 1 by patterning. Since the pitch of the terminals of the panel is longer than the pitch of the output pads of the semiconductor chips 4 and 4', the line pattern is widened on the first layer 1 so that the output pads and the terminals of the panel are aligned to one another. Further, through holes 9 are formed at the leading portions of the output lines 8 and 8' so that the output lines 8 and 8' pass through the through holes 11 of the second layer 2 and connect to connection terminals 13 of the panel via through holes 12 of the third layer 3.

The arrangement in which the two semiconductor chips for driving liquid crystal are bonded on one multi-layer substrate enables the input/output lines to be wired efficiently as compared with an arrangement in which one semiconductor chip for driving liquid crystal is provided on one multi-layer substrate. Further, the semiconductor chips can be disposed efficiently. Therefore, the required area for the multi-layer substrate can be reduced and, accordingly, the parts cost can be reduced. Further, the process for separating (dicing or breaking) the multi-layer substrate and the process for setting/resetting the multi-layer substrate for bonding and molding the semiconductor chip can also be simplified. Therefore, the cost can be reduced.

Figure 16:
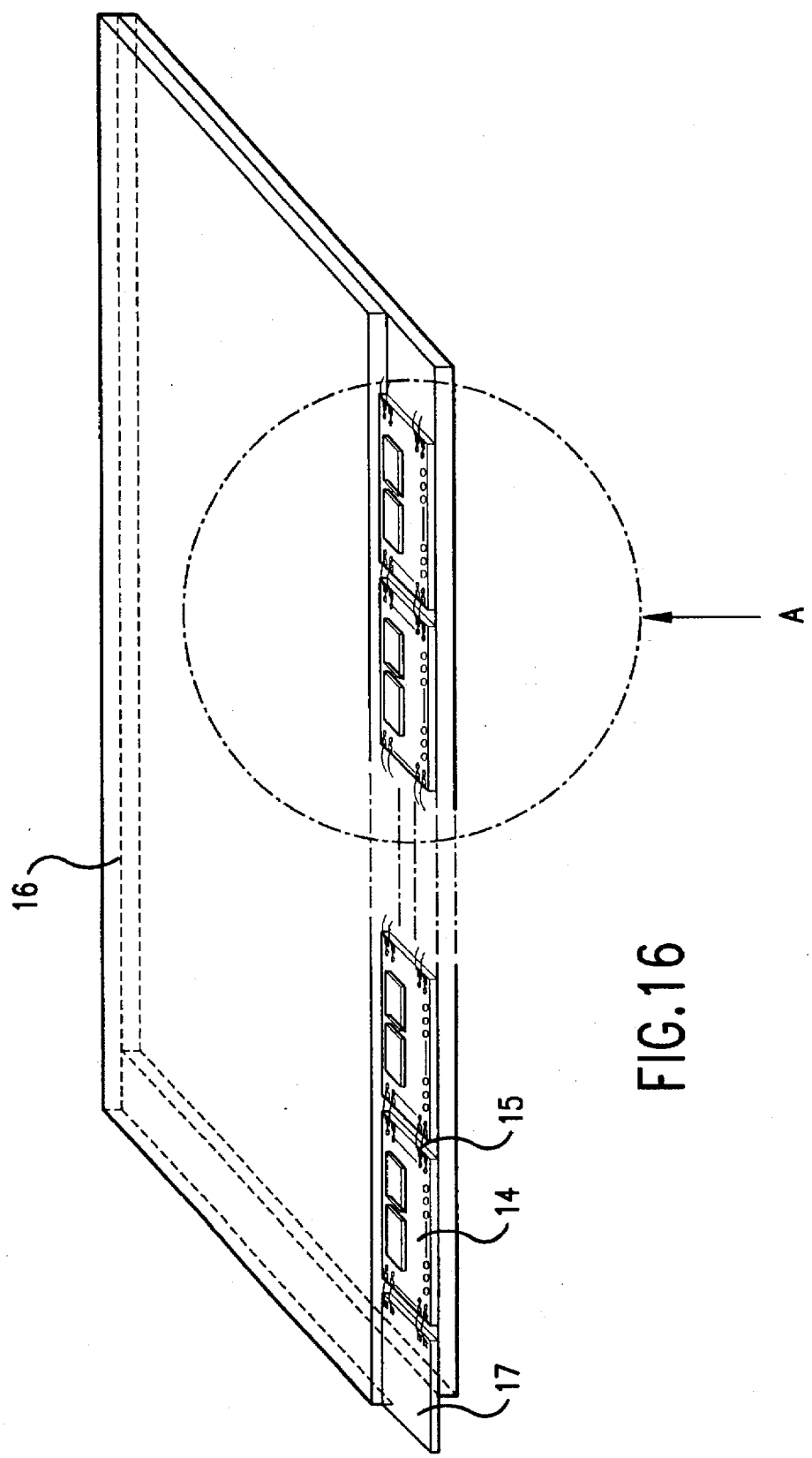
FIG. 16 is a perspective view which illustrates a liquid crystal display apparatus according to the sixth embodiment of the present invention.

FIG. 16 illustrates an embodiment in which the multi-layer substrate according to an embodiment shown in FIG. 15 is connected to a liquid crystal display panel.

Figure 17:
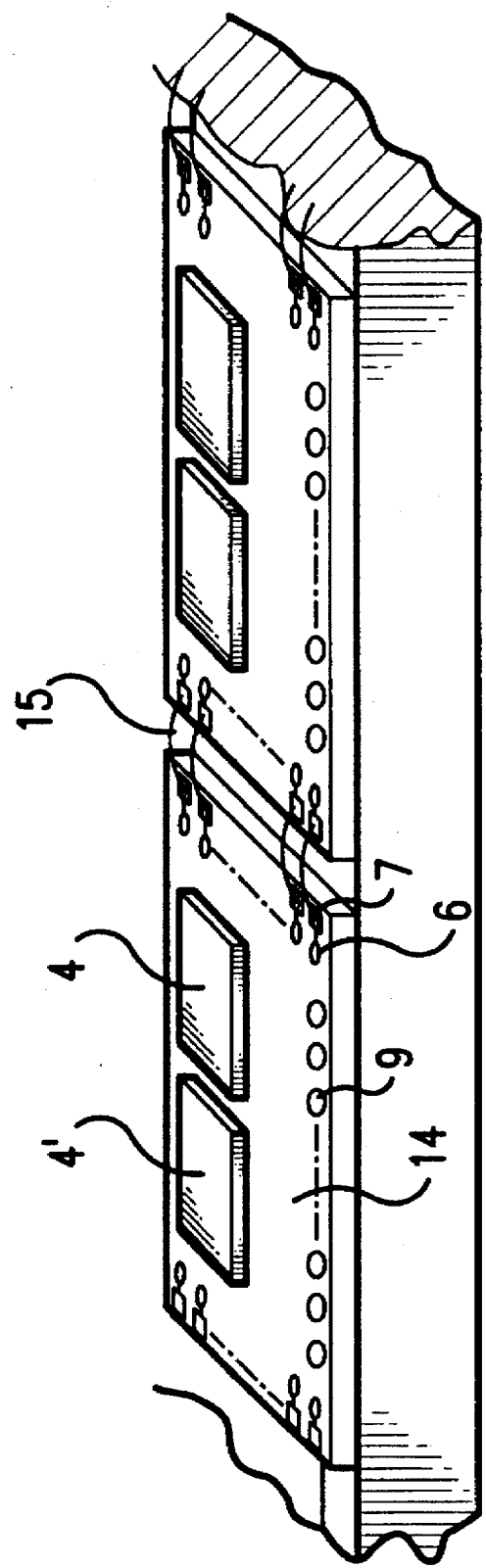
FIG. 17 illustrates a portion of the liquid crystal display apparatus according to the sixth embodiment of the present invention.

FIG. 17 is an enlarged view which illustrates a portion of the connection portion.

Figure 18:
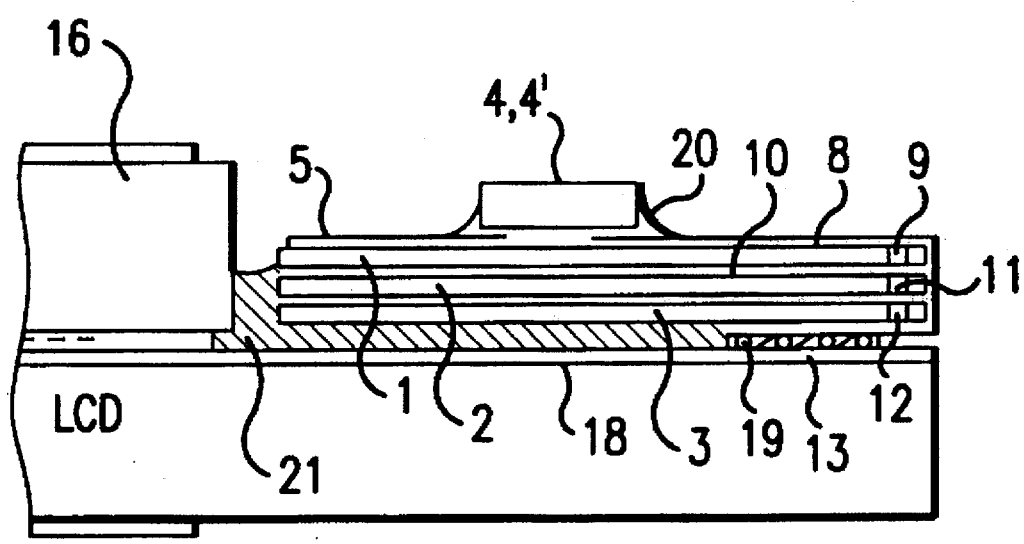
FIG. 18 is a cross sectional view which illustrates the liquid crystal display apparatus according to the sixth embodiment of the present invention.

FIG. 18 illustrates the cross section of a portion of the connection portion.

A liquid crystal display panel (for example, 640×480 dot display) 16 has a panel terminal 18 to which 8 multi-layer substrates 14 according to the embodiment shown in FIG. 15 are connected in the X direction thereof and 5 multi-layer substrates 14 in the Y direction thereof. However, four multi-layer substrates 14 in the X direction and five multi-layer substrates 14 in the Y direction are not shown in FIG. 16. The conductive member 19 maintains the electrical connection and also fixes somewhat the multi-layer substrate 14 to the panel.

The bus lines between the adjacent multi-layer substrates 14 are connected by wire bonding performed by using wires 15 via the lands 7. The wires 15 are made of metal, such as Au, Al, or Cu or the like or their alloys (alloys containing Be, Si or Mg or the like included). The width of the portion to be wire-bonded is narrower than the width of the multi-layer substrate so that the multi-layer substrate is mounted within the outline of the panel 16 as shown in FIG. 18.

Since the two semiconductor chips for driving liquid crystal are bonded on one multi-layer substrate, eight connection portions can be decreased to connect the multi-layer substrates (14 connection portions can be reduced to 6 connection portions). Therefore, the number of wires 15 can be reduced and the wire bonding process can be simplified.

As described above, use of the multi-layer substrates according to this embodiment enables the lines to be wired in the cross manner in the same multi-layer substrate as contrasted with the conventional TAB method using an individual bus substrate to wire the bus lines in the cross manner. Therefore, the overall size can be reduced as compared with the TAB method by raising the density of the lines wired on the substrate. Further, the cost can be reduced because individual bus lines are not used.

Since the conventional COG method has the arrangement that the cross wiring of the bus lines is performed on the panel substrate, a wide area is required to wire the bus lines. Further, metal lines must be used to reduce the resistance value of the wired lines, resulting in an enlargement of the cost. However, use of the multi-layer substrate according to this embodiment enables the space required to wire the bus lines and the cost to be reduced as compared with the COG method.

Seventh Embodiment

A seventh embodiment will now be described with reference to FIG. 19.

Figure 19:
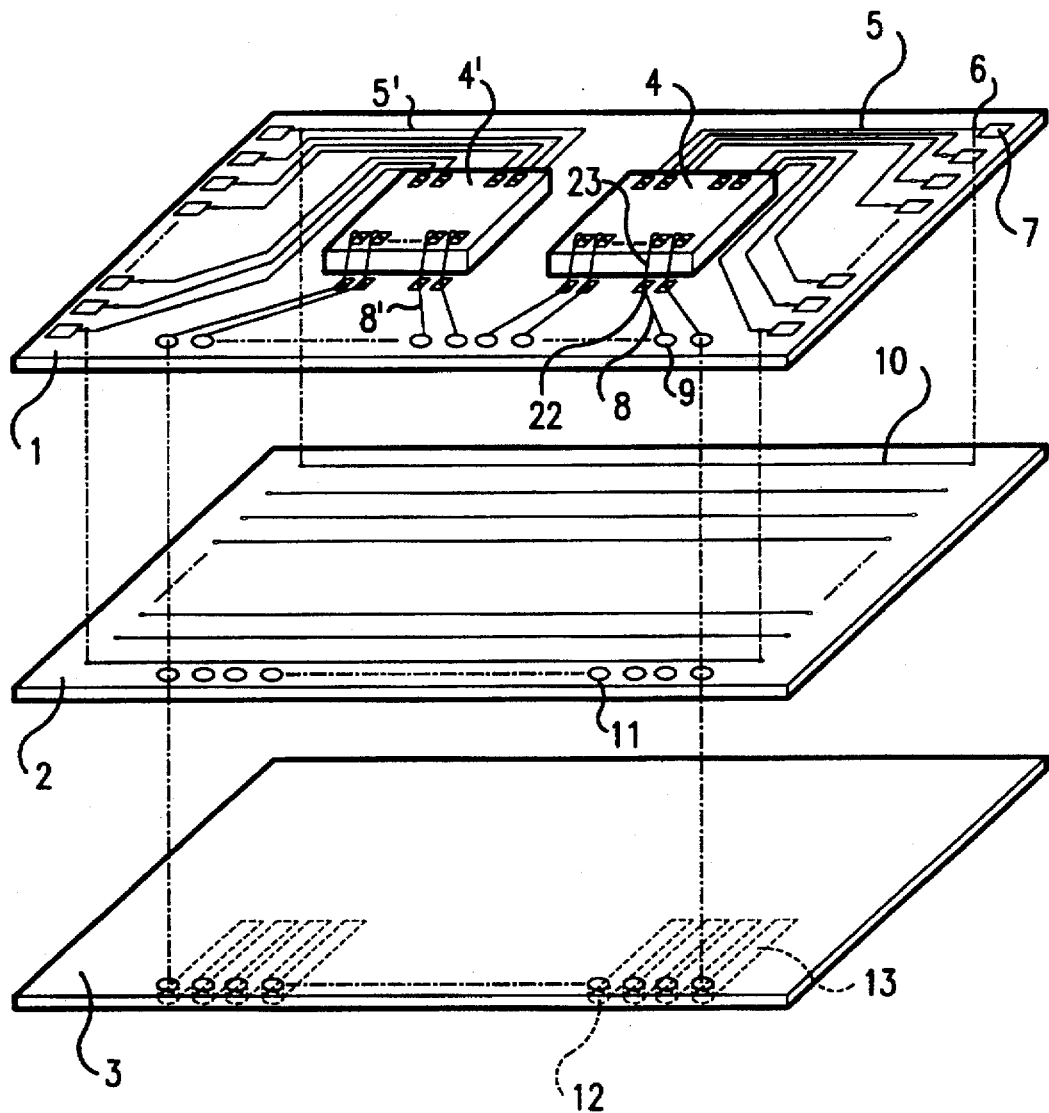
FIG. 19 is an exploded view which illustrates the liquid crystal display apparatus according to a seventh embodiment of the present invention.

FIG. 19 is an exploded perspective view which illustrates a multi-layer substrate of a liquid crystal display apparatus according to the present invention in which two semiconductor chips for driving liquid crystal are wire-bonded to the surface of one multi-layer substrate.

The surface of the first layer 1 of the multi-layer has input lines 5 and 5' corresponding to input/output pads of the semiconductor chips 4 and 4'. Further, the output lines 8 and 8' have wire bonding lands 22. The pattern, the through holes, the method of forming the multi-layer substrate, the arrangement and the structure are the same as those according to the sixth embodiment.

The reverse side of the semiconductor chips are secured to the surface of the multi-layer substrate. Further, the input/output pads of the semiconductor chips 4 and 4' and lands 22 on the surface of the first layer 1 of the multi-layer substrate are wire bonded. The wires may be wires of the same type as those used to connect the multi-layer substrates according to the first embodiment. Although omitted from the illustration, the bonding portions and the wiring portions are protected by molding members made similar to the sixth embodiment.

The bus lines between the adjacent multi-layer substrates are wire-bonded similar to the sixth embodiment. Although omitted from the illustration, the bonding portions and the wiring portions are protected by molding members made similar to the sixth embodiment.

As described above, use of the multi-layer substrate according to this embodiment also enables the size and the cost to be reduced similar to the first embodiment as compared with the conventional TAB method and the COG method.

Eighth Embodiment

An eighth embodiment will now be described with reference to FIG. 20.

Figure 20:
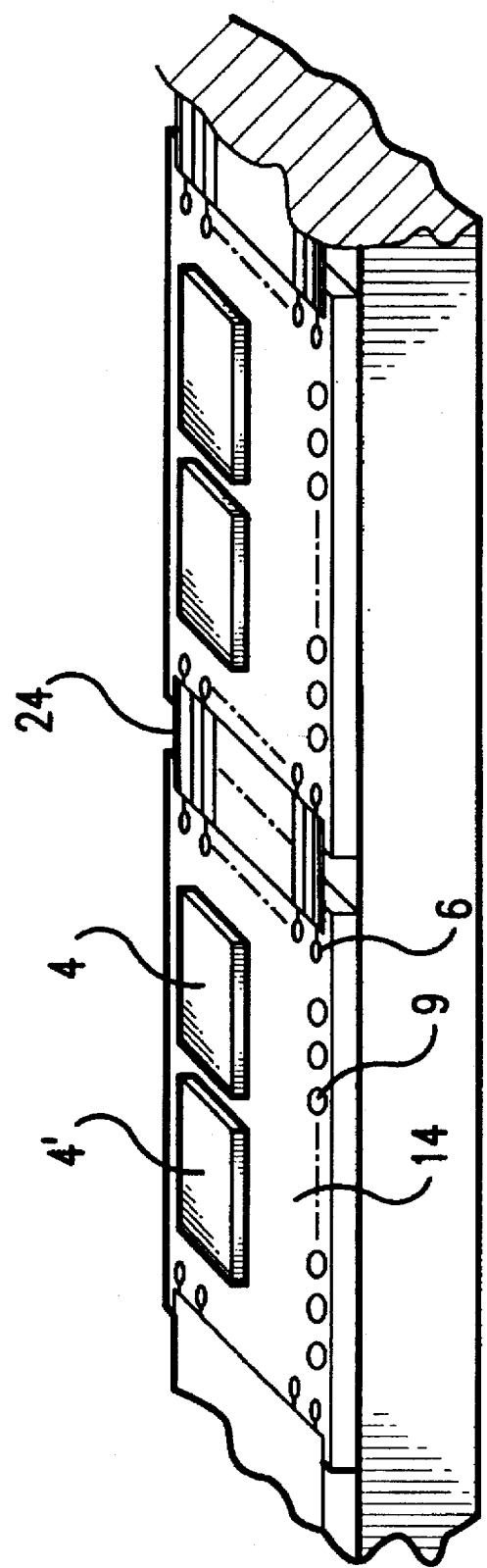
FIG. 20 illustrates a portion of the liquid crystal display apparatus according to an eighth embodiment of the present invention.

FIG. 20 illustrates a liquid crystal display apparatus according to the present invention in which a multi-layer substrate 14 having two semiconductor chips 4 and 4' for driving liquid crystal, face-down-bonded on the surface thereof, is connected to the terminal 18 of the liquid crystal display panel by using a connection member 19. A portion of the connection portion is arranged to be similar to that according to the embodiment shown in FIG. 18. However, the leading portions of the input lines on the first layer 1 of the multi-layer substrate are formed into heat seals or shapes that are suitable to connect the flexible substrate in place of the wire bonding lands.

The bus lines between the adjacent multi-layers 14 are connected by using a connection substrate 24. The connection substrate 24 may be a heat seal or a flexible substrate.

The width of a portion to which the connection substrate 24 is connected is smaller than the width of the multi-layer substrate 14 so that the multi-layer substrate 14 can be mounted within the outline of the panel 16.

As described above, use of the multi-layer substrate according to this embodiment also enables the size and the cost to be reduced as compared with the conventional TAB method and the COG method.

The connection of the semiconductor chips to the surface of the multi-layer substrate and the electrical connection between the adjacent multi-layer substrates may be performed by methods which use a combination of the methods according to the first, second and the third embodiments. In any case, the size and the cost can also be reduced.

Further, the multi-layer substrate having the semiconductor chip for use in the foregoing embodiments mounted thereon can be mounted on another display apparatus or on an electronic printing apparatus such that it can be mounted on a plasma display or an EL display apparatus by changing the foregoing semiconductor chip to a semiconductor chip for driving the plasma display or a semiconductor chip for driving the EL. By similarly mounting a semiconductor chip for driving a thermal head on the multi-layer substrate and by similarly connecting the multi-layer substrate to the thermal head, application to an electronic printing apparatus can be realized.

Ninth Embodiment

A ninth embodiment will now be described with reference to FIGS. 25 to 28.

Figure 25:
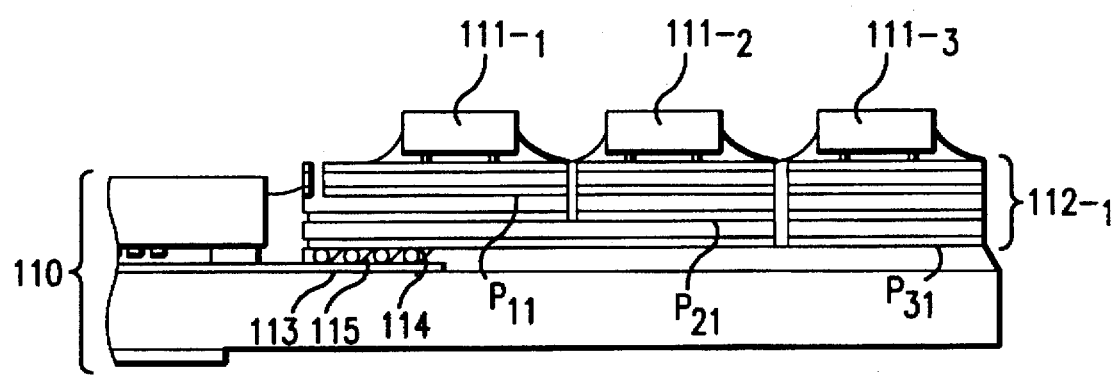
FIG. 25 is a cross sectional view which illustrates the structure for mounting a semiconductor device and a state where it is connected to a display device according to a ninth embodiment of the present invention.
Figure 26:
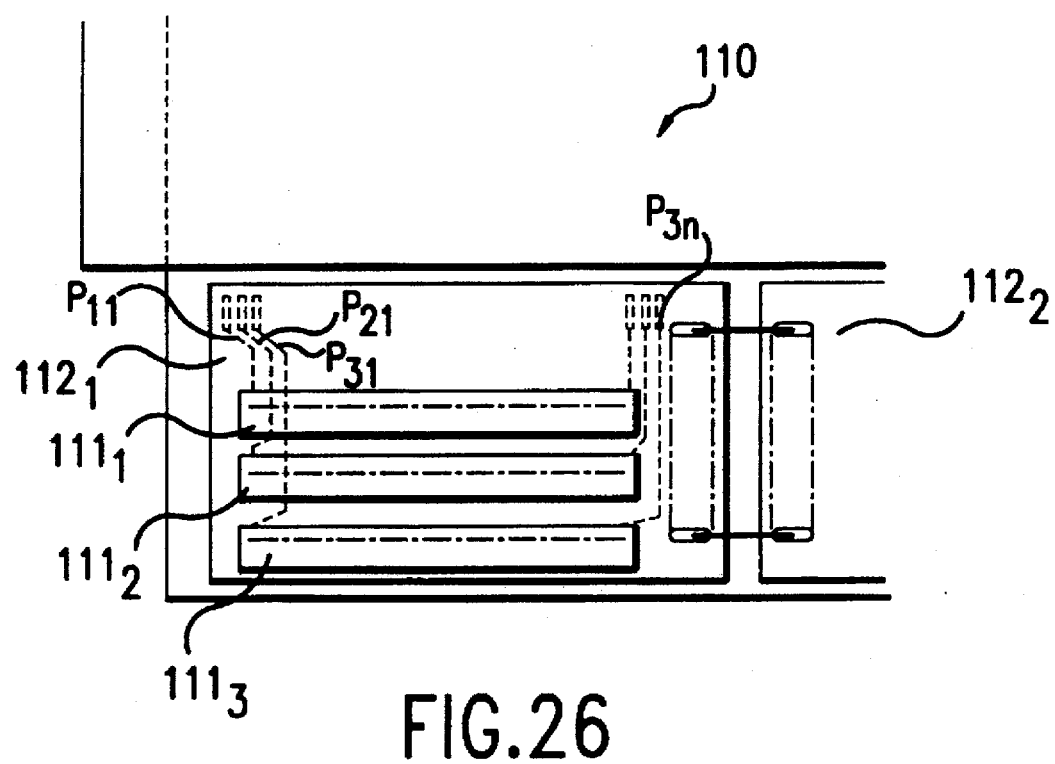
FIG. 26 is a plan view which illustrates the structure for mounting a semiconductor device and a state where it is connected to a display device according to the ninth embodiment of the present invention.
Figure 27:
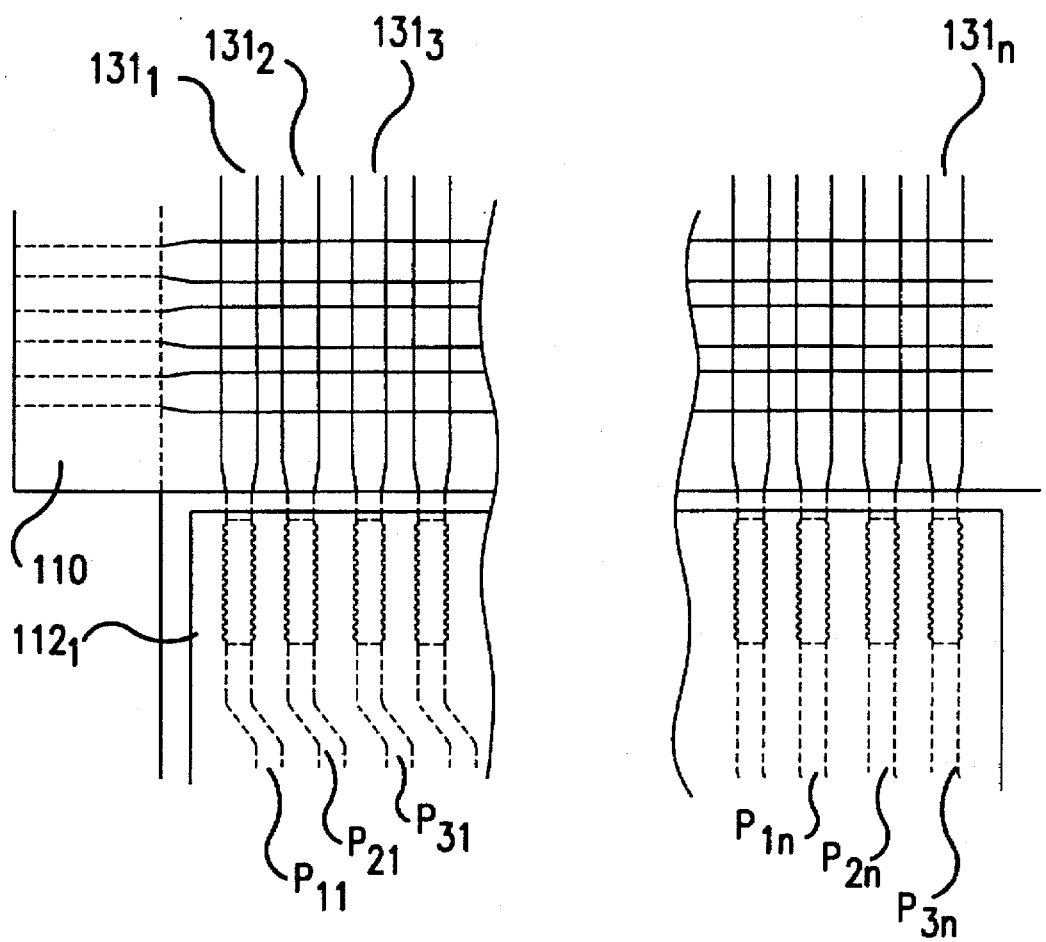
FIG. 27 is a circuit diagram of a connection portion according to the ninth embodiment of the present invention.
Figure 28:
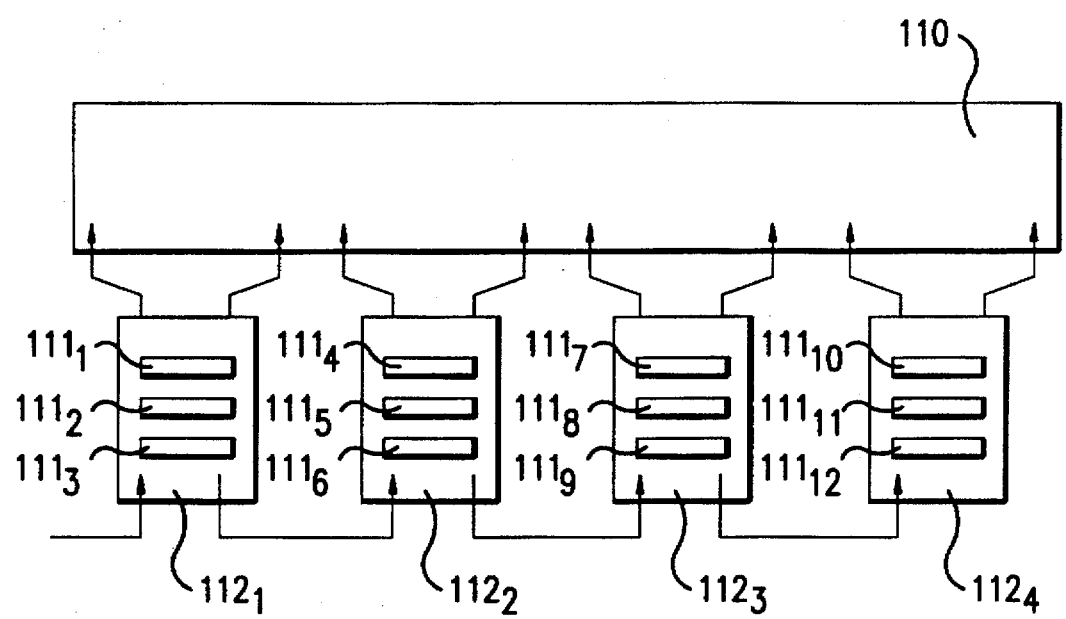
FIG. 28 is a circuit block diagram for a liquid crystal display apparatus according to the ninth embodiment of the present invention.

FIG. 25 is a cross sectional view which illustrates an embodiment of a mounting structure adapted to a liquid crystal display apparatus according to the present invention in which a semiconductor device mounted on a laminated substrate is connected to a liquid crystal display device. FIG. 26 is a plan view which illustrates the mounting structure shown in FIG. 25. FIG. 27 is a detailed plan view which illustrates the terminal connection portion of the foregoing liquid crystal display device. FIG. 28 is a block diagram which illustrates a color liquid crystal apparatus structured by using the foregoing mounting structure.

Referring to FIG. 25, a liquid crystal display device 110 is a display substrate including a line electrode group, a column electrode group and a color filter. A liquid crystal composition is enclosed among the foregoing elements and electrode terminal group 113 is formed.

Laminated substrates 112-1 and 112-2 shown in FIGS. 25 and 26 have output lines P11 to P3n and bus lines formed by patterning to establish the vertical electrical connections between the substrate layers. Semiconductor devices 111-1, 111-2 and 111-3 are ICs which drive liquid crystal and which have connection terminals formed by bumps. Each of the semiconductor devices 111 is connected to the connection terminals formed on the laminated substrate 112 in a face-down mounting manner. Although three semiconductor devices 111-1, 111-2 and 111-3 are mounted to correspond to three-color pixels in this embodiment, the number of the semiconductor devices may be determined to be adaptable to the number of the pixels.

The laminated substrate 112 has terminals for connecting each semiconductor device formed on the surface layer thereof, with input/output line P11 of the semiconductor device 111-1 formed on the first layer thereof, input/output line P21 of the semiconductor device 111-2 formed on the second layer thereof, input/output line P31 of the semiconductor device 111-3 formed on the third layer thereof and bus lines formed on the surface of the third layer thereof. Although the laminated substrate 112 is formed into three layers, the present invention is not limited to the number of layers if an efficient wiring pattern can be formed. Although this embodiment employs ceramic to make laminated substrate 112, depending upon consideration of expansion and contraction occurring due to thermal expansion, a polyimide film or the like, which is a flexible substrate, may be used.

As can be seen from FIG. 25, the structure for mounting a semiconductor device according to this embodiment has the arrangement that the lines for driving the liquid crystal display device 110 and the bus lines are formed on a common substrate thereof. Therefore, the drive control circuit substrate can be omitted from the structure and, accordingly, the number of required elements can be decreased considerably. Therefore, the cost of the elements can be reduced significantly.

Referring to FIG. 27, the laminated substrate 112-1 and the liquid crystal display device 110 are connected to each other via, for example, anisotropic conductive film connection member 116 (FIG. 25) such that alignment is established between the liquid crystal display device electrode terminal group 113 respectively pulled out for color pixel R (red) 131-1, G (green) 131-2 and B (blue) 131-3 and the laminated substrate terminal group 114 connected to the semiconductor devices 111-1 (for red), 111-2 (for green) and 111-3 (for blue) corresponding to each pixel and formed at the extensions of the liquid crystal driving output line P11 (the output from the semiconductor device 111-1), P21 (the output from the semiconductor device 111-2) and P31 (the output from the semiconductor device 111-3). Further, a pressing machine is used to press and connect them under pressing conditions: 180° C., 30 Kg/cm$^2$ and 20 seconds so that the connection is established.

Color display suffers from a problem in that the contrast is unsatisfactory due to excessive cross talk as compared with black and white display because the drive method must use a high duty cycle. However, the connection method according to this embodiment is able to reduce the cross talk and, accordingly, a high-contrast display can be realized because individual output lines for semiconductor devices are connected for each color electrode and, therefore, a proper drive waveform can be supplied.

FIG. 28 is a block diagram which illustrates an embodiment of a color liquid crystal display apparatus using the foregoing mounting structure according to this embodiment. A display device 110 is a 640×480 dots STN color liquid crystal display, and semiconductor devices 111-1 to 111-12 are segment drivers for driving liquid crystal having 160 outputs.

Each of the laminated substrates 112-1 to 112-4 has semiconductor devices 111-1 to 111-12 for R (red), G (green) and B (blue) mounted thereon. The laminated substrates 112-1 to 112-4 are mounted in parallel on electrode terminals formed on the periphery of the liquid crystal display device 110. The laminated substrates 112-1 to 112-4, on which the semiconductor devices 111-1 to 111-12 are mounted, are mutually connected at four points for the purpose of supplying electric power and control signals.

When a color liquid crystal display apparatus was manufactured by employing the foregoing mounting structure, a compact liquid crystal display apparatus was formed because the density of the structure for mounting the semiconductors was raised. Further, the number of connections required to connect the liquid crystal display devices could be reduced to ⅓ as compared with the conventional structure. Therefore, the connection reliability was improved.

A liquid crystal display apparatus using the structure for mounting the semiconductor device according to this embodiment was manufactured and a reliability test was performed. As a result, satisfactory results were obtained in a TS test (between −30° C. and 80° C.) in 1000 cycles and a TH test (at 60° C. and 90%RH) for 1000 hours. Excellent connection reliability was realized.

Tenth Embodiment

Figure 29:
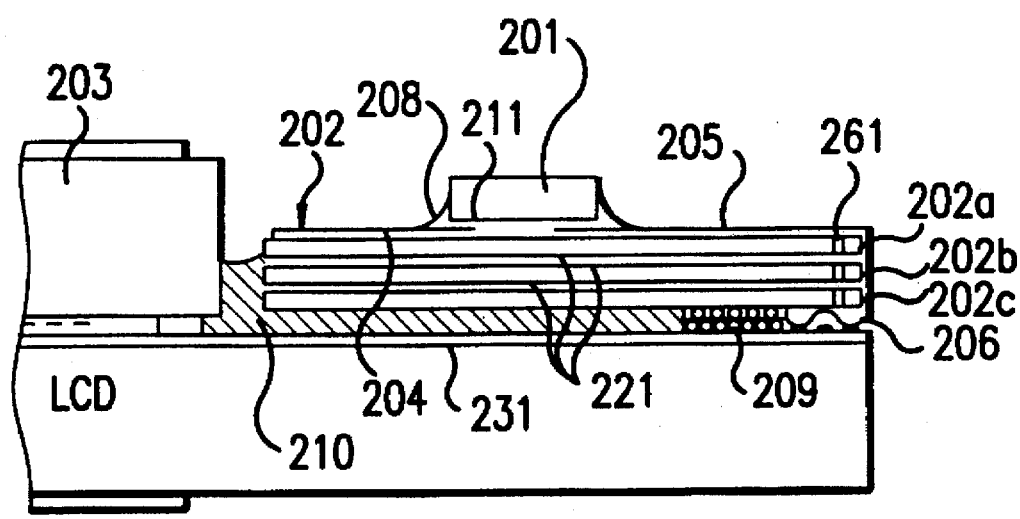
FIG. 29 is a cross sectional view of a structure for mounting a semiconductor device according to a tenth embodiment of the present invention.

FIG. 29 is a cross sectional view which illustrates a portion of the structure for mounting a semiconductor device according to this embodiment. In this embodiment, a liquid crystal display device (hereinafter referred to as an "LCD") 203 is used as the electronic device.

Referring to FIG. 29, an LSI 201 (Large Scale Integrated Circuit) is, at a predetermined position, mounted on a laminated substrate 202 having an internal conductive layer 221, an input line 204, an output line 205, a via-hole 261 and a bump 206 and the like, the LSI 201 being mounted by a face down method. The input and output terminals 211 of the LSI 201 are connected to the input line 204 and the output line 205. The LSI 201 mounted as described above may be secured by an adhesive agent 208 if necessary to improve reliability, such as moisture resistance. A molding material 210 is provided to protect the exposed portion of a terminal 231 of LCD 203. The laminated substrate 202 includes an internal conductive layer 221 which electrically connects the two sides of each substrate 202a, 202b and 202c to transmit each signal to the input line 204 and to make the internal conductive portion 221 to have a ground level so that noise is prevented. The bump portion 206 of the laminated substrate 202 and a terminal 231 of the LCD 203 are electrically connected to each other by using an ACF 209. Although the ACF (Anisotropic Conductive Film) 209 shown in FIG. 29 is used in a limited space adjacent to the bump 206, it may be disposed on the entire surface of the laminated substrate 202.

Figure 30:
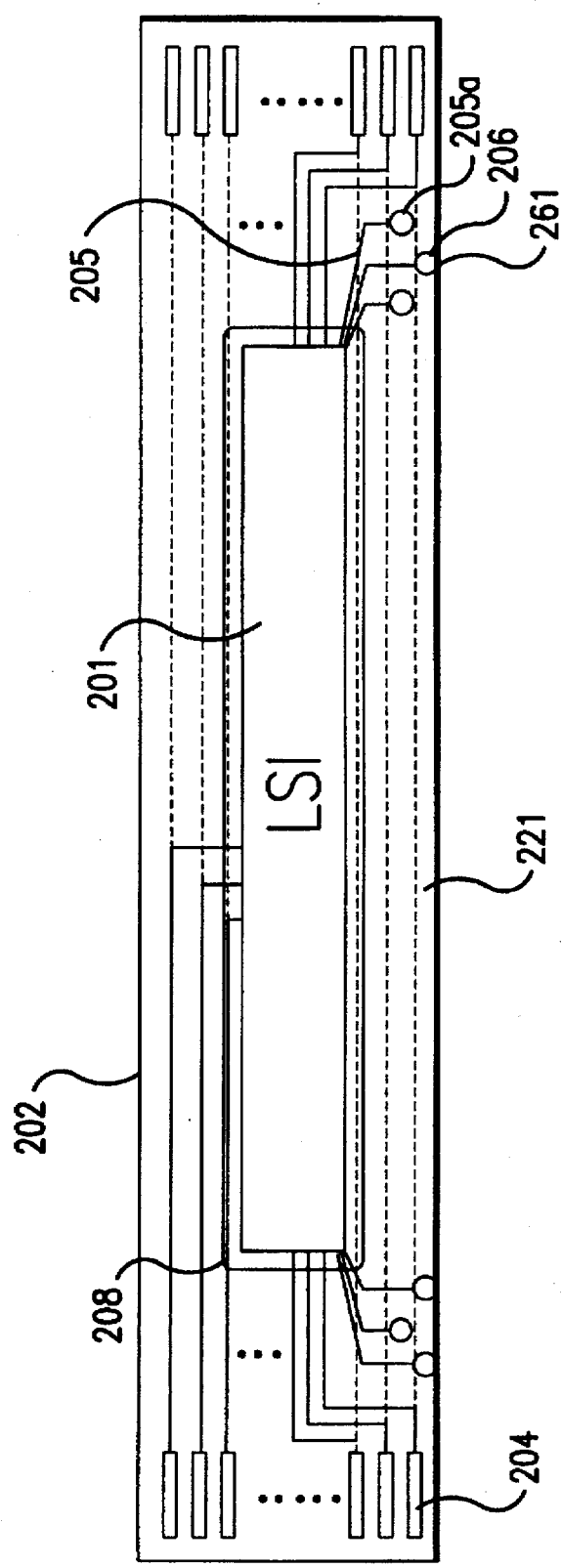
FIG. 30 illustrates a structure for mounting a semiconductor device according to the tenth embodiment of the present invention.
Figure 31:
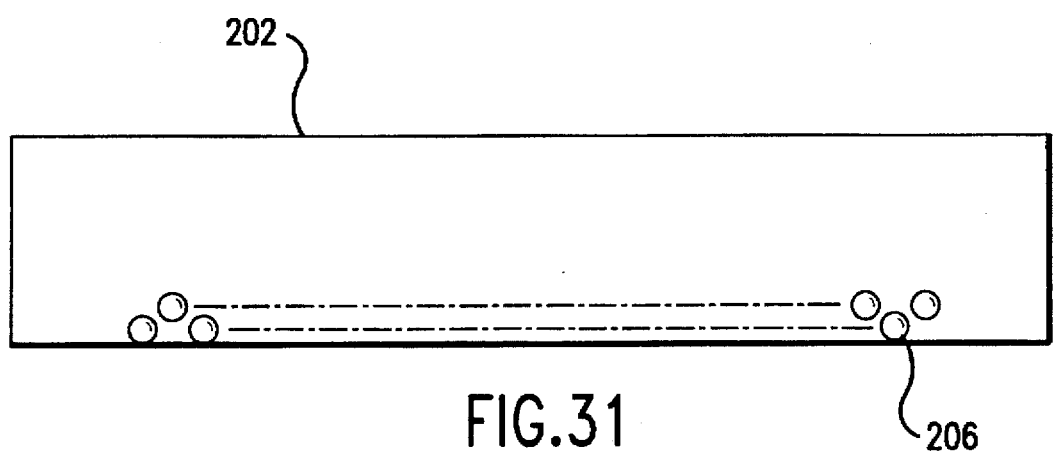
FIG. 31 illustrates a structure for mounting a semiconductor device according to the tenth embodiment of the present invention.

FIG. 30 is a plan view which illustrates one laminated substrate 202 adapted to the mounting structure according to this embodiment. Referring to FIG. 30, the output line 205 connected to the output terminal of an LSI 201 is electrically connected between the two sides of the laminated substrate 202 via the via-hole 261 and connected to the bump 206. FIG. 31 is a plan view which illustrates one laminated substrate 202 and which illustrates the reverse side. Referring to FIG. 31, bumps 206 for receiving signals from the output terminals of the LSI 201 are disposed in a zigzag manner. If the pitch of the output terminals is shortened to correspond to a fine pitch, it can be realized by increasing the zigzag lines to three or four lines.

The characteristics of the elements according to this embodiment are as follows:

LSI 201 is formed into a square-like shape or an elongated shape arranged so as to have a ratio of the shorter side and the longer side of 1:5 or more. If an elongated LSI is used, an LSI of a type having output terminals and input terminals concentrated on one side as much as possible is used. Each terminal has a bump.

Laminated substrate 202 is made of ceramics or glass epoxy resin and is comprised of three stacked layers 202a, 202b, 202c.

Electronic device 203 is an electronic device such as a liquid crystal display device.

Input line 204 is made of only Au or formed by applying Ni and Au plating to an AgPd base or a Cu base.

Output line 205 is arranged similar to the input line 204 formed by a method in which a conductive material is charged into the through hole and half-cut and a method in which it is printed on the side surface of the laminated substrate.

Output terminal 205a is arranged similar to the output line 205.

Bump 206 is arranged similar to the input line 204. It is preferable that the bump is formed into a circular or a rectangular shape having a top flat surface. Although the size of the bump is, of course, varied depending upon the pitch of the wire pattern, it is preferable to have a maximum size in a range in which the insulation can be maintained.

Mold 208 is epoxy adhesive agent.

ACF 209 is a thermo-hardening ACF such as #6000 series or #7000 series from Hitachi Chemical.

The adhesive agent is an ultraviolet hardening adhesive agent or thermo-hardening epoxy adhesive agent.

Figure 32:
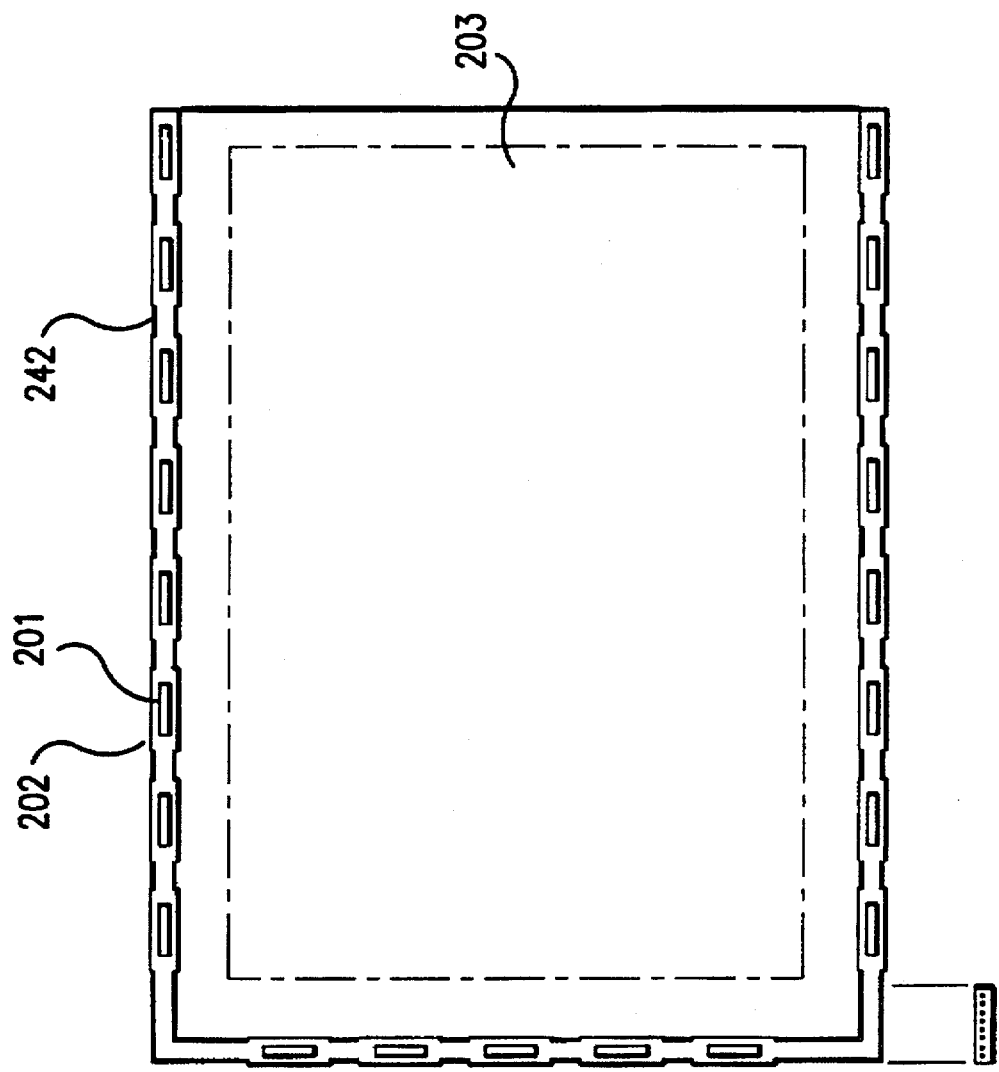
FIG. 32 illustrates an embodiment of an LCD module on which the semiconductor device according to the tenth embodiment of present invention is mounted.

FIG. 32 is a plan view which illustrates an LCD module having the structure for mounting a semiconductor device and the mounting method according to the present invention. Referring to FIG. 32, a plurality of laminated substrates 202 are mounted on the terminals of the LCD 203. Although the laminated substrates 202 are connected to each other by using conductive wires 242 made of Au, CU or Al or the like, a method using a heat seal or an FPC may be employed. Use of the mounting structure according to this embodiment, even in a large-size LCD, realizes a very compact mounting area.

Eleventh Embodiment

Figure 33:
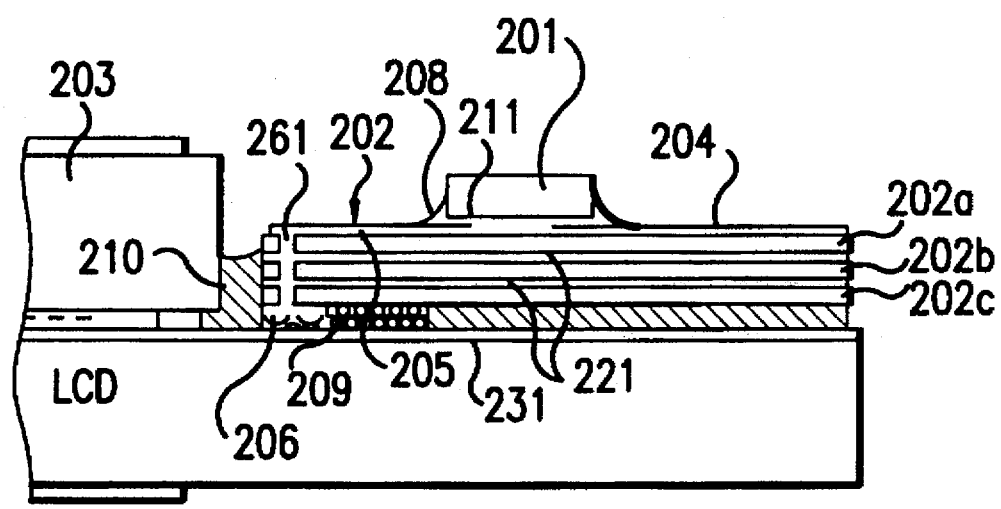
FIG. 33 is a cross sectional view that illustrates a structure for mounting a semiconductor device according to an eleventh embodiment of the present invention.

FIG. 33 is a cross sectional view which illustrates an essential portion of the structure for mounting a semiconductor device according to an eleventh embodiment, this embodiment having an arrangement in which an LCD 203 is used as the electronic device. As contrasted with the tenth embodiment, this embodiment is characterized in that the laminated substrate 202 is mounted so that the bumps 206 are placed adjacent to the LCD 203.

Twelfth Embodiment

Figure 34:
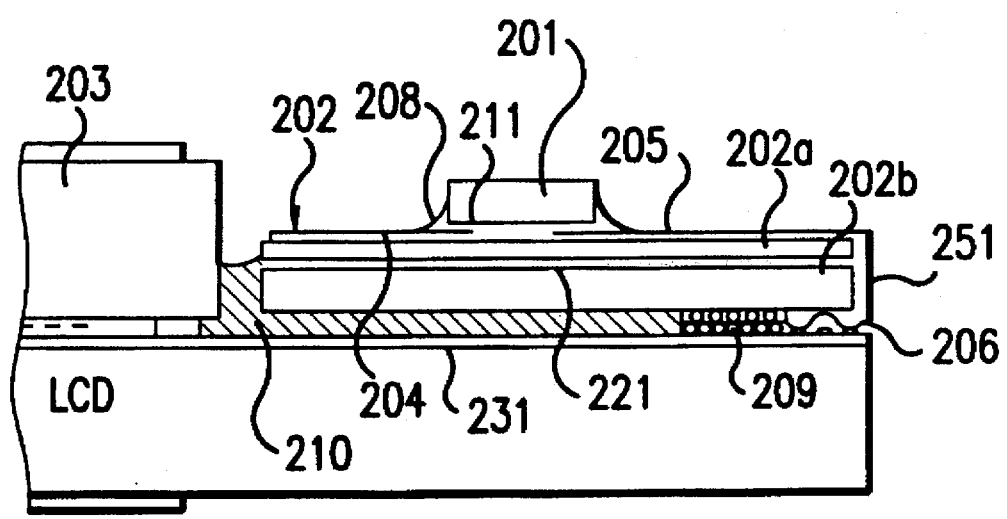
FIG. 34 is a cross sectional view that illustrates a structure for mounting a semiconductor device according to a twelfth embodiment of the present invention.

FIG. 34 is a cross sectional view which illustrates an essential portion of the structure for mounting a semiconductor device according to a twelfth embodiment, this embodiment having an arrangement in which an LCD 203 is used as the electronic device. As contrasted with the tenth embodiment, this embodiment is characterized in that the output lines 205 of the laminated substrate 202 are electrically connected by lines 251 on the side surface of substrate 202 instead of the via hole, the output lines 205 being connected to the bumps 206 on the reverse side.

Thirteenth Embodiment

Figure 35:
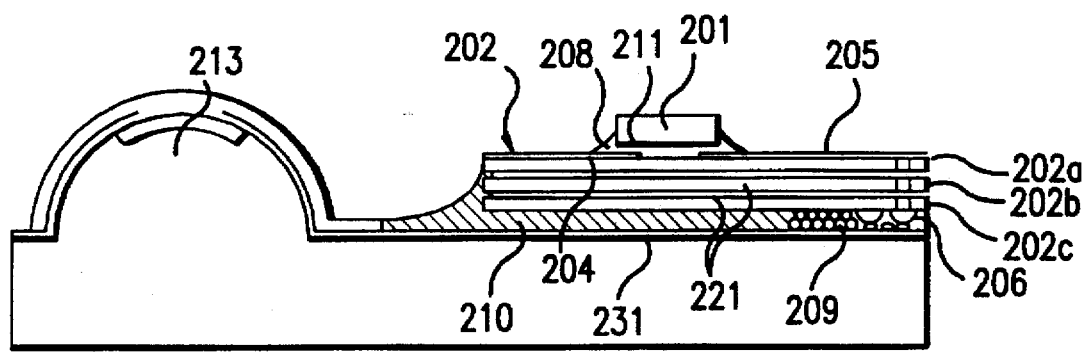
FIG. 35 is a cross sectional view that illustrates a structure for mounting a semiconductor device according to a thirteenth embodiment of the present invention.
Figure 36:
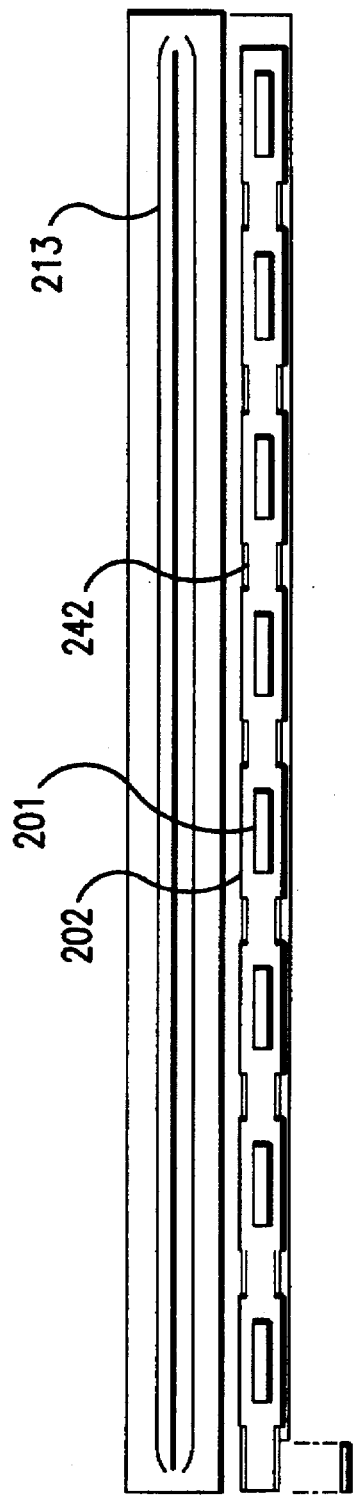
FIG. 36 is a plan view that illustrates an embodiment of an electronic printing apparatus on which the semiconductor device according to the thirteenth embodiment of the present invention is mounted.

FIG. 35 is a cross sectional view which illustrates a thermo-sensitive electronic printing apparatus (hereinafter called an "electronic printing apparatus") according to a thirteenth embodiment and using the structure for mounting a semiconductor device according to the present invention. Referring to FIG. 35, a plurality of laminated substrates 202 are mounted on the terminal of a thermal print head, which is the electronic printing device 213. FIG. 36 is a plan view which illustrates an electronic printing apparatus according to this embodiment. The laminated substrates 202 are interconnected by wires 242. Similar to the structure using the LCD, a very compact mounting area can be realized.

Fourteenth Embodiment

Figure 37:
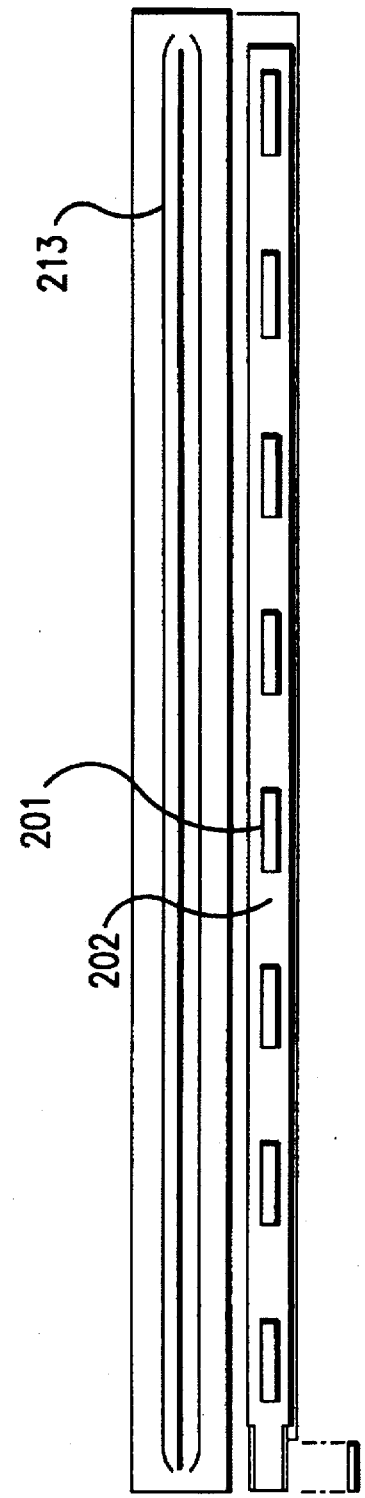
FIG. 37 is a plan view that illustrates an embodiment of an electronic printing apparatus on which the semiconductor device according to a fourteenth embodiment of the present invention is mounted.

FIG. 37 is a plan view which illustrates an embodiment of an electronic printing apparatus using the structure for mounting a semiconductor device according to the present invention. As contrasted with the thirteenth embodiment, this embodiment is characterized in that the laminated substrate 202 is formed into one integrated substrate.

Fifteenth Embodiment

Figure 38:
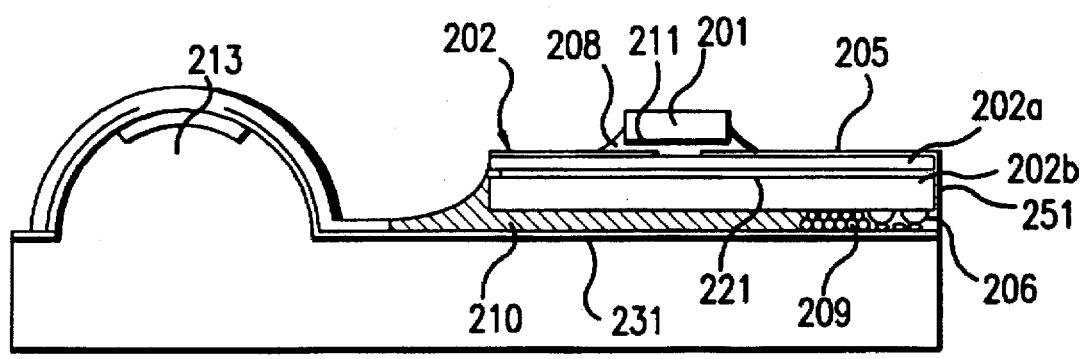
FIG. 38 is a cross sectional view that illustrates a structure for mounting a semiconductor device according to a fifteenth embodiment of the present invention.

FIG. 38 is a cross sectional view which illustrates an embodiment of an electronic printing apparatus using the structure for mounting a semiconductor device according to the present invention. As contrasted with the thirteenth embodiment, this embodiment is characterized in that a similar laminated substrate 202 to that according to the twelfth embodiment is used, in which a line 251 on the side of the laminated substrate is used instead of a via.

Sixteenth Embodiment

Figure 39:
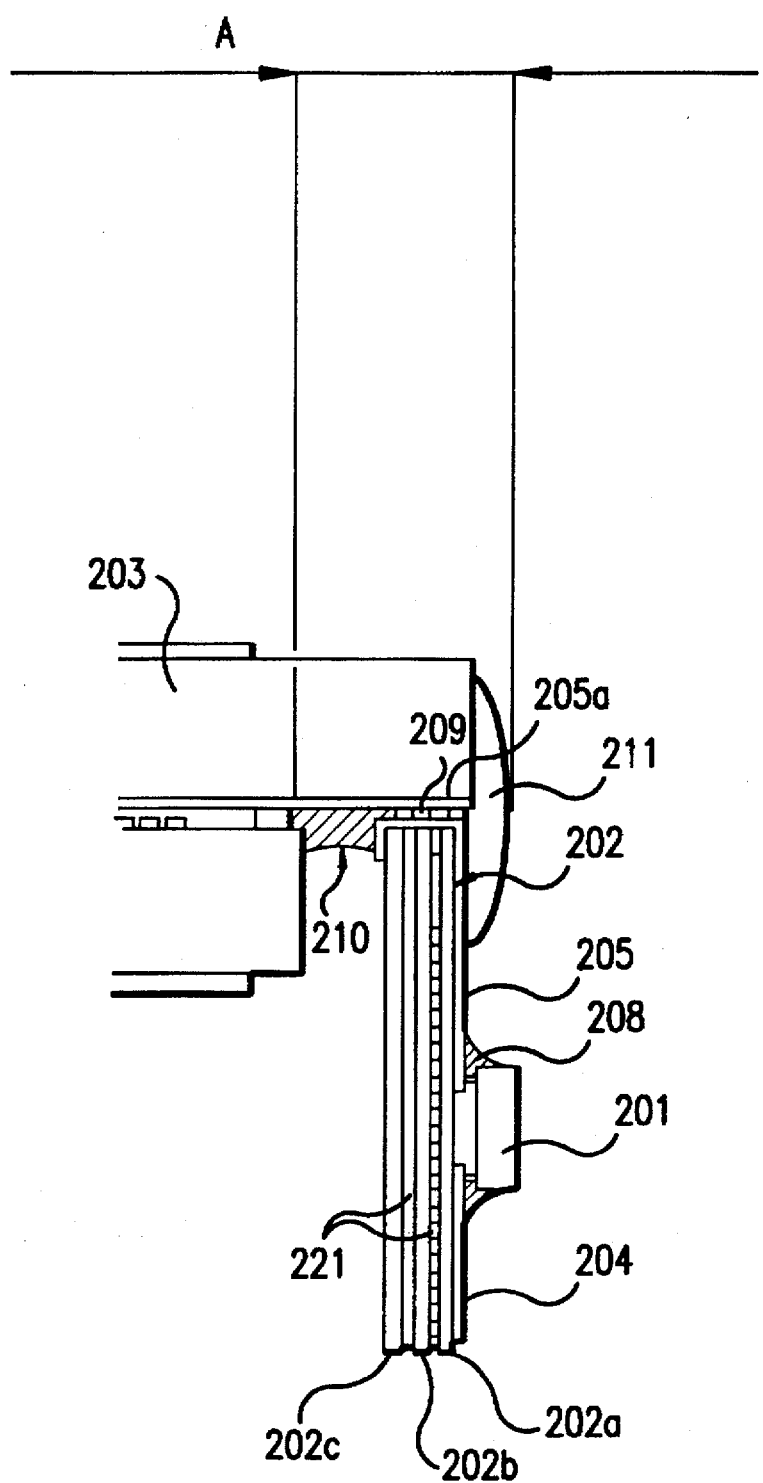
FIG. 39 is a cross sectional view that illustrates a structure for mounting a semiconductor device according to a sixteenth embodiment of the present invention.

FIG. 39 is a cross sectional view which illustrates an embodiment of the structure for mounting a semiconductor device according to the present invention, wherein a liquid crystal display device is used as the electronic device. Referring to FIG. 39, an LSI 201 is, at a predetermined position, mounted on a laminated substrate 202 having an internal conductive layer 221, an input line 204 and an output line 205, the LSI 201 being mounted by a face down method. The input and output terminals of the LSI 201 are connected to the input line 204 and the output line 205. The LSI 201 mounted as described above may be secured by an adhesive agent 208 if necessary to improve the reliability, such as moisture resistance. The laminated substrate 202 includes an internal conductive layer 221 which electrically connects the two sides of each substrate 202a, 202b, 202c to transmit each signal to the input line 204 and to make the internal conductive portion 221 have a ground level so that noise is prevented.

Figure 40:
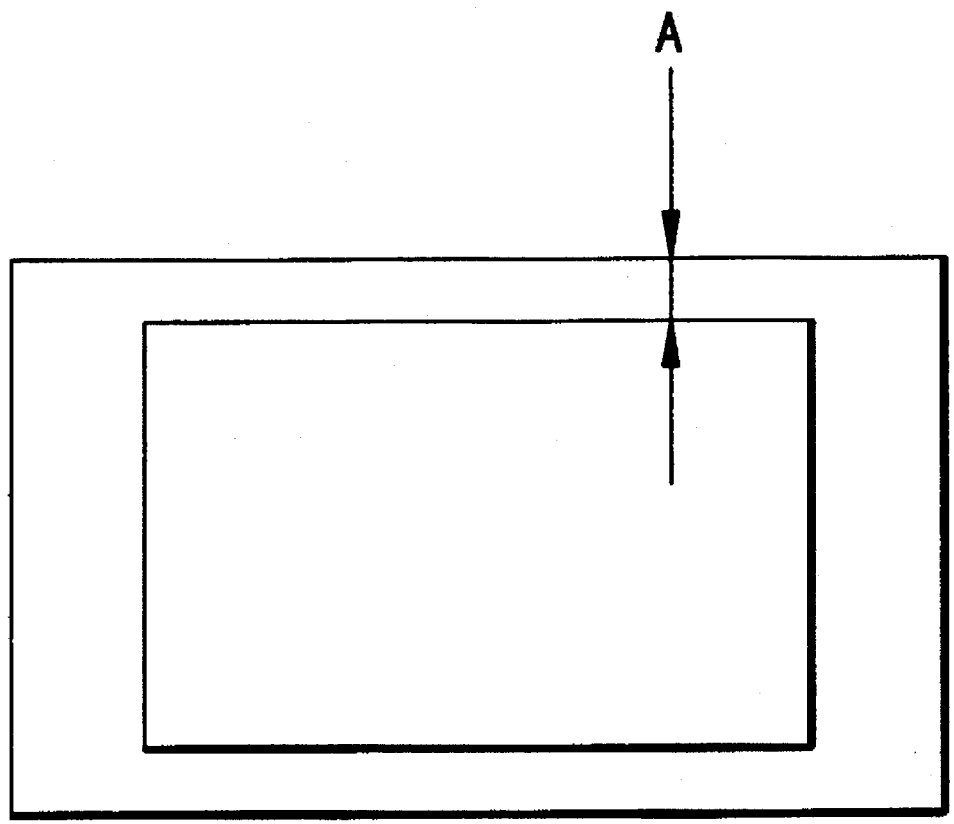
FIG. 40 is a plan view which illustrates a liquid display apparatus according to the sixteenth embodiment of the present invention.

The output line 205 of the laminated substrate 202 is extended to reach the side surface of the laminated substrate 202, the output line 205 having the side surface portion which is formed into an output terminal 205a which can be connected to another electronic device. The output terminal 205a and an electronic device 203 (which is a liquid crystal display device) are mounted and electrically connected to each other by using an ACF 209 so that the surface of the laminated substrate 202 and that of the electronic device (LCD) 203 are disposed perpendicular to each other. After the laminated substrate 202 is mounted, the laminated substrate 202 and the electronic device (LCD) 203 may be bonded and fixed by an adhesive agent 211 in order to strengthen the fixation. As a result of the employment of the foregoing mounting method, the mounting area A at the end portion of the electronic device 203 can be made 2 mm or smaller. FIG. 40 is a plan view which illustrates a liquid crystal apparatus. It is preferable that the size of the portion A shown in FIG. 40 is minimized to satisfy the characteristics required for a product. If a back-light is mounted on the reverse side of the LCD, the size of the portion A can be reduced significantly by using the mounting structure according to this embodiment. As a result, the quality of a manufactured LCD module can be improved considerably.

The characteristics of the elements according to this embodiment are as follows:

LSI 201 is formed into a square-like shape or an elongated shape arranged to have a ratio of the shorter side and the longer side of 1:5 or more. If an elongated LSI is used, an LSI of a type having output terminals and input terminals concentrated on one side as much as possible is used. Each terminal has a bump.

Laminated substrate 202 is made of ceramics or glass epoxy resin or the like having three stacked layers.

Electronic device 203 is an electronic device such as a liquid crystal display device.

Input line 204 is made of only Au or is formed by applying Ni and Au plating to an AgPd base or to a Cu base.

Output line 205 is similar to the input line 204.

Output terminal 205a is similar to the input line 204. A method in which a through hole (via hole) is formed and a terminal is formed by cutting at the central portion or a method in which a conductive pattern is printed and formed on the side surface of the substrate may be employed.

Mold 208 is an epoxy adhesive agent.

ACF 209 is a thermo-hardening ACF, such as AC 6000 series or 7000 series of Hitachi Chemical, the conductive particle density of which is 1000 particles/mm$^2$ prior to pressurization.

Adhesive Agent 211 is an ultraviolet hardening type adhesive agent or a thermo-hardening epoxy adhesive agent.

Seventeenth Embodiment

Figure 41:
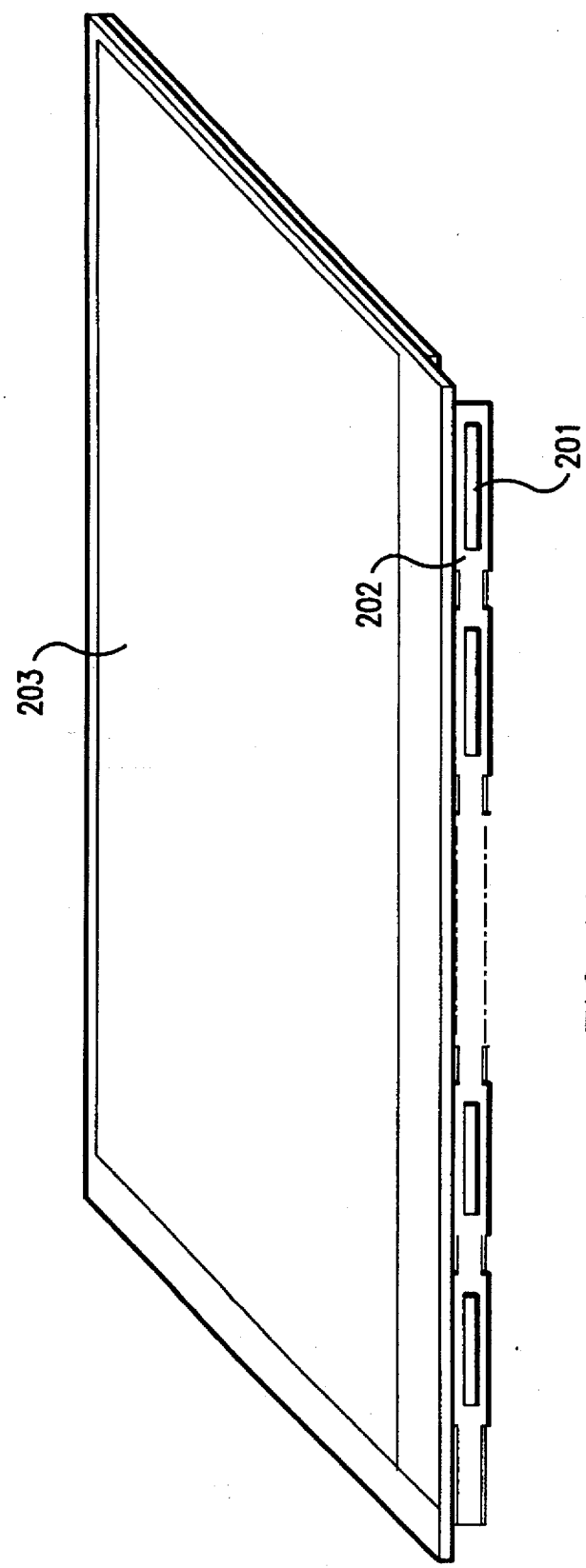
FIG. 41 is a perspective view that illustrates an embodiment of a liquid crystal display apparatus on which the semiconductor device according to a seventeenth embodiment of the present invention is mounted.

FIG. 41 illustrates an embodiment of a liquid crystal display apparatus using the structure for mounting a semiconductor device according to the present invention. Referring to FIG. 41, a plurality of laminated substrates 202 are mounted on the terminal of the LCD 203 by using the structure for mounting a semiconductor device according to the present invention. The substrates are connected by wire bonding by using metal wires made of, for example, Au, Cu or Al or the like. The connection may be established by using a heat seal or an FPC using an ACF. By using the mounting structure according to this embodiment, a very compact mounting area can be realized even in a large LCD as shown in FIG. 41.

Eighteenth Embodiment

Figure 42:
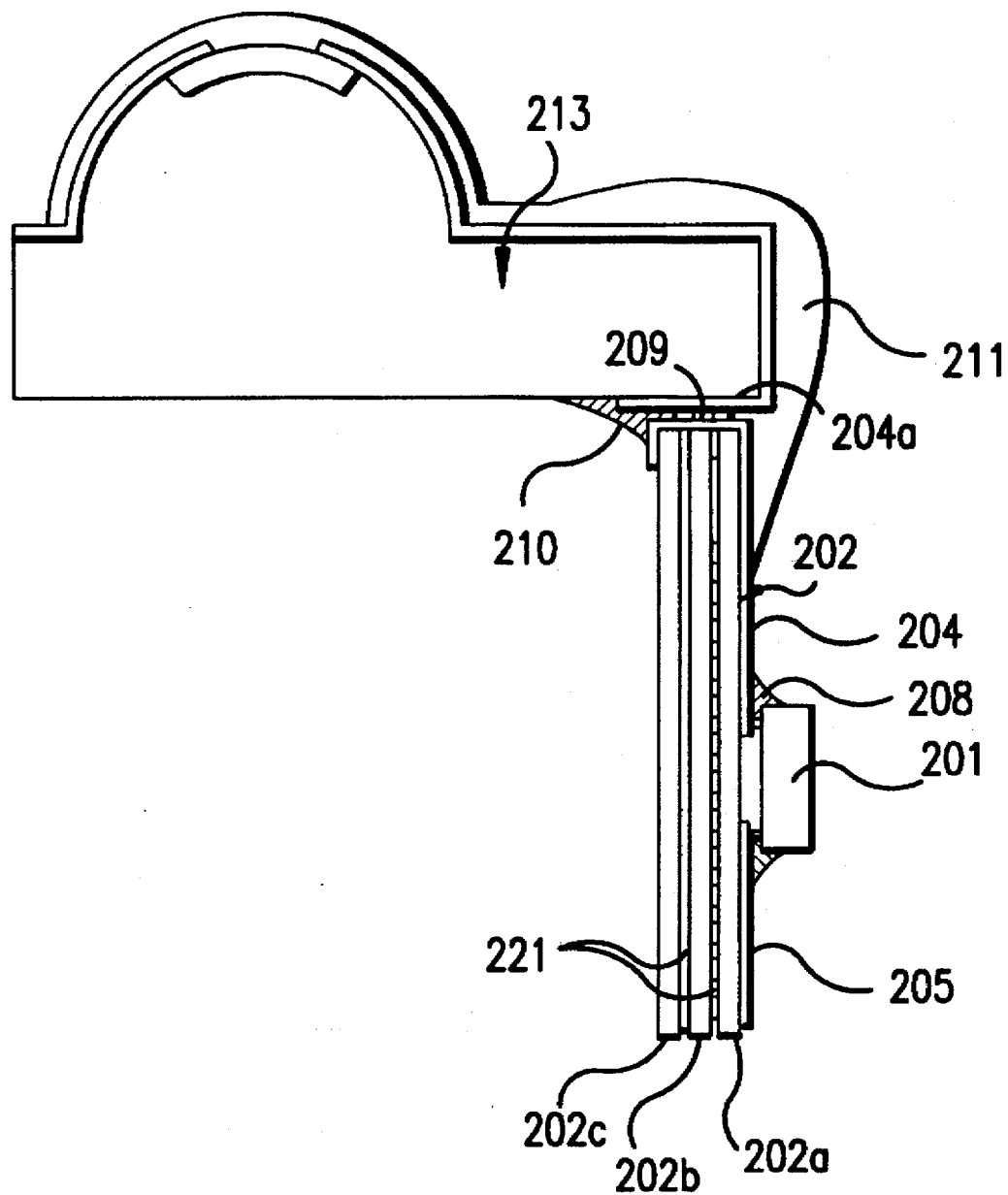
FIG. 42 is a cross sectional view that illustrates a structure for mounting a semiconductor device according to an eighteenth embodiment of the present invention.

FIG. 42 illustrates an example of a thermo-sensitive electronic printing apparatus (hereinafter called an "electronic printing apparatus") using the structure for mounting a semiconductor device according to the present invention. A laminated substrate 202 is mounted on the terminal of a thermal printer head, which is the electronic printing device 213. Similar to the structure in which the LCD is used, a very compact mounting area can be realized.

Nineteenth Embodiment

A nineteenth embodiment will now be described with reference to FIG. 43.

Figure 43:
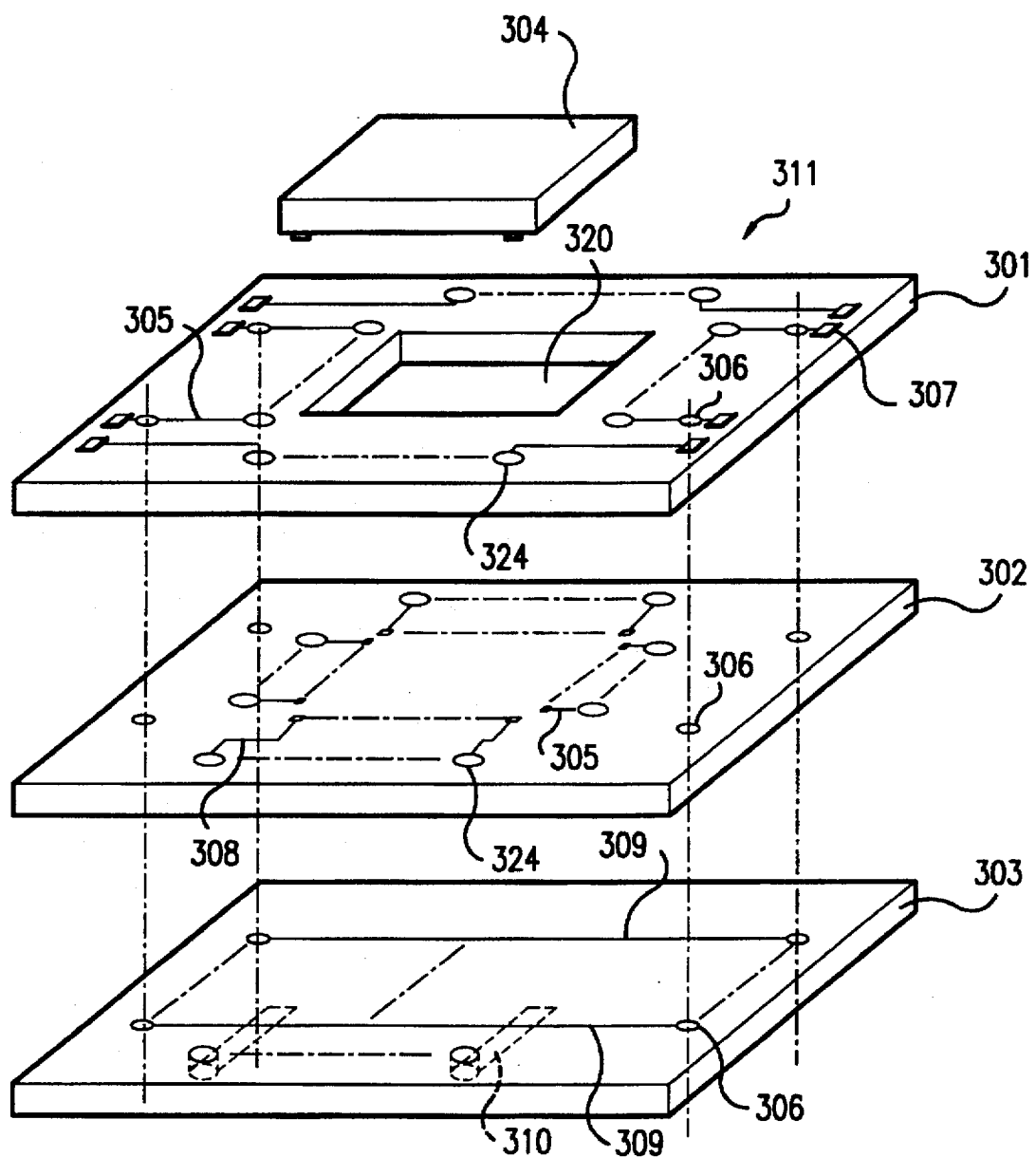
FIG. 43 is an exploded view which illustrates a multi-layer substrate according to a nineteenth embodiment of the present invention.

FIG. 43 is an exploded perspective view which illustrates a multi-layer circuit substrate 311 according to an embodiment in which a semiconductor device 304 is, by using the method of mounting a semiconductor according to the present invention, face-down bonded on the multi-layer circuit substrate 311 having an opening portion 320 formed in the first layer 301, the semiconductor device 304 having its input terminals and output terminals disposed such that only an output terminal group is disposed on any one of peripheral sides of the semiconductor device and an input terminal group is disposed on one or two sides that are perpendicular to the foregoing side on which only the output terminal group is disposed. Reference numerals 301, 302 and 303 represent layers of the multi-layer circuit substrate. Reference numeral 301 represents a first layer, 302 represents a second layer and 303 represents a third layer, the first layer 301 having the opening portion 320. The second layer 302 has, on the surface thereof, input lines 305 corresponding to the input electrodes of the semiconductor device 304, the input lines 305 being formed by patterning. The input lines 305 are connected to bus lines 309 of the third layer 303 via through holes 306. The input lines 305 have, at the leading portions thereof, lands 307 for establishing the connections between bus lines with an adjacent and similar multi-layer substrate 311.

Further, the output lines 308 on the second layer 302 have output terminal through holes 324 at the leading portion thereof, the output lines 308 being connected to external connection terminals 310 via through holes formed in the third layer 303.

In this embodiment, the layers 301, 302 and 303 are made of a ceramic substrate obtained by simultaneously sintering alumina substrates at a low temperature. Each layer is formed into a thin layer having a thickness of about 0.25 mm. The input lines 305, the output lines 308 and the bus lines 309 are made by sintering paste of metal, such as Au, Ag, AgPd or Cu or the like. Similarly, the through holes 306 and 324 are formed by sintering paste of metal, such as Au, Ag, AgPd or Cu or the like. Also the lands 307 and the external connection terminals 310 are formed by sintering paste of metal, such as Au, Ag, AgPd or Cu or the like. The foregoing elements for the corresponding layers are formed by patterning performed by a known printing method, and the layers are stacked, sintered and integrated. As a result, forming of the layers is completed. The thickness of the metal patterned and sintered is usually about 0.001 mm to about 0.05 mm. The thickness may be about 0.05 mm to about 0.2 mm in order to reduce the resistance value.

Depending upon the pitch of the lines and upon the dimensional accuracy, the input lines 305 and the lands 307 on the first layer 301, the output lines 308 on the second layer 302 and the external connection terminals 310 on the third layer 303 may be formed by photolithographic patterning after the Au, Ag, AgPd or Cu metal paste has been printed on the entire surface. In this case, the thickness of the formed pattern is about 0.001 mm to about 0.2 mm. As an alternative to employing the printing method, the pattern may be formed by a photolithographic method or a plating method after Au, Ag or Cu has been evaporated or after the thin film has been formed by sputtering. In this case, the thickness of the formed pattern is about 0.0005 mm to about 0.1 mm.

Although the multi-layer circuit substrate is made of ceramic in this embodiment, it may be made of color-epoxy, paper phenol or polyimide.

Twentieth Embodiment

A twentieth embodiment will now be described with reference to FIGS. 44 and 45.

Figure 44:
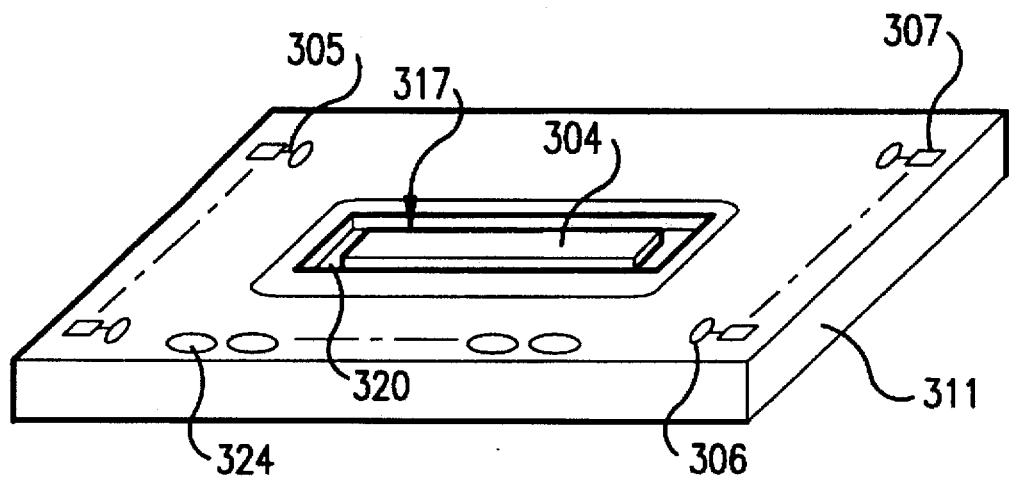
FIG. 44 is a perspective view that illustrates a state in which a semiconductor device is mounted on a multi-layer circuit substrate according to a twentieth embodiment of the present invention.
Figure 45:
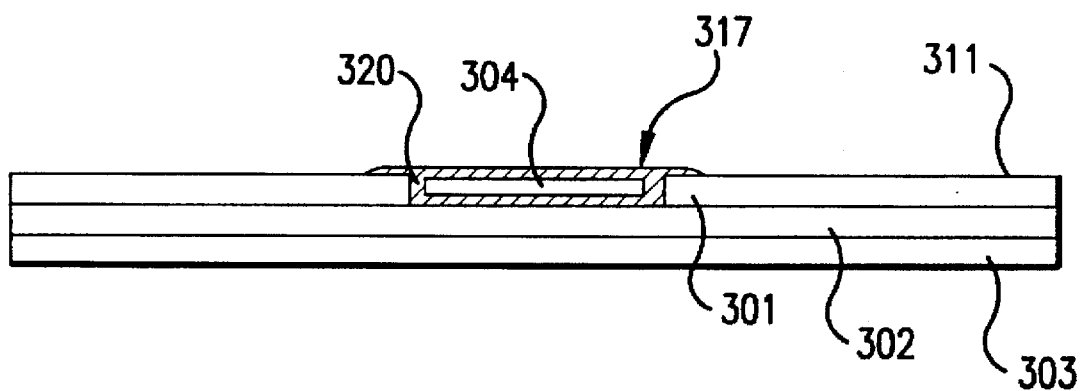
FIG. 45 is a cross sectional view that illustrates a state where a semiconductor device is mounted on a multi-layer circuit substrate according to the twentieth embodiment of the present invention.

FIG. 44 is a perspective view which illustrates an embodiment of the structure for mounting a semiconductor device according to this embodiment. In this embodiment, a semiconductor device 304 is mounted on the multi-layer circuit substrate 311 according to the nineteenth embodiment such that the semiconductor device 304 is face-down bonded on the surface of the second layer 302 via the opening portion 320 of the first layer 301 by a known method (for example, a method in which Au bumps of the semiconductor are connected to the substrate by using Ag paste or a method using an anisotropic conductive film or the like).

After the face-down bonding process is performed, molding material 317 is supplied around the semiconductor device 304 and to the portion between the semiconductor device 304 and the surface of the second layer 302 in order to prevent corrosion and reinforce fixation. The surface of the second layer 302 has input lines 305 corresponding to the input electrodes of the semiconductor device 304 and formed by patterning.

Twenty-First Embodiment

A twenty-first embodiment will now be described with reference to FIGS. 46 and 47.

Figure 46:
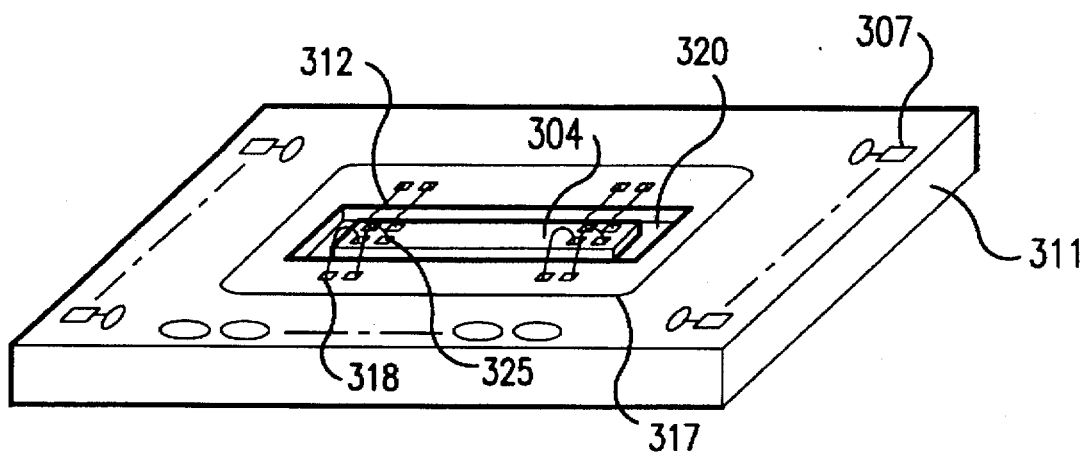
FIG. 46 is a perspective view that illustrates a state where a semiconductor device is mounted on a multi-layer circuit substrate according to a twenty-first embodiment of the present invention.

FIG. 46 is a perspective view which illustrates an embodiment of the structure in which the semiconductor device 304 is fixed by an adhesive agent while passing through the opening portion 320 formed in the first layer 301 of the multi-layer circuit substrate 311 according to the nineteenth embodiment such that the upper surface of the active surface of the semiconductor device 304 faces upwards. The electrodes 325 of the semiconductor device 304 and the wire bonding lands 318 of the first layer 301 of the multi-layer circuit substrate 311 are connected by a wire bonding mounting method. This embodiment is characterized in that the pitch of the wire bonding lands 318 is made to be 60 μm to 300 μm and that the electrodes 325 and the wire bonding lands 318 are connected by Au wires 312.

Figure 47:
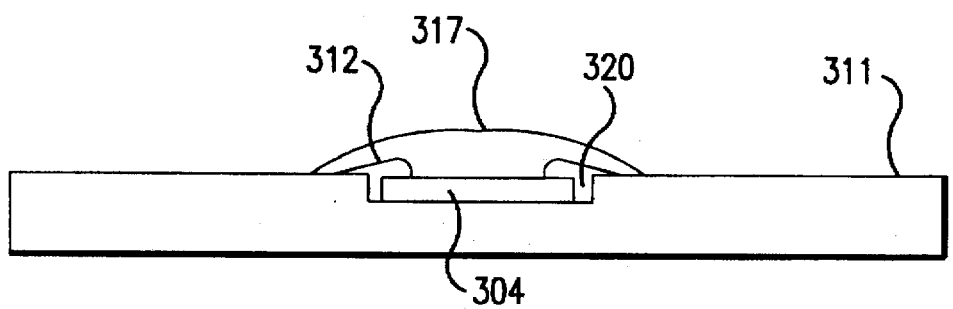
FIG. 47 is a cross sectional view that illustrates a state where a semiconductor device is mounted on a multi-layer circuit substrate according to the twenty-first embodiment of the present invention.

FIG. 47 is a cross sectional view which illustrates an embodiment of the method of mounting the semiconductor device according to the twenty-first embodiment.

Twenty-Second Embodiment

A twenty-second embodiment will now be described with reference to FIGS. 48 and 49.

Figure 48:
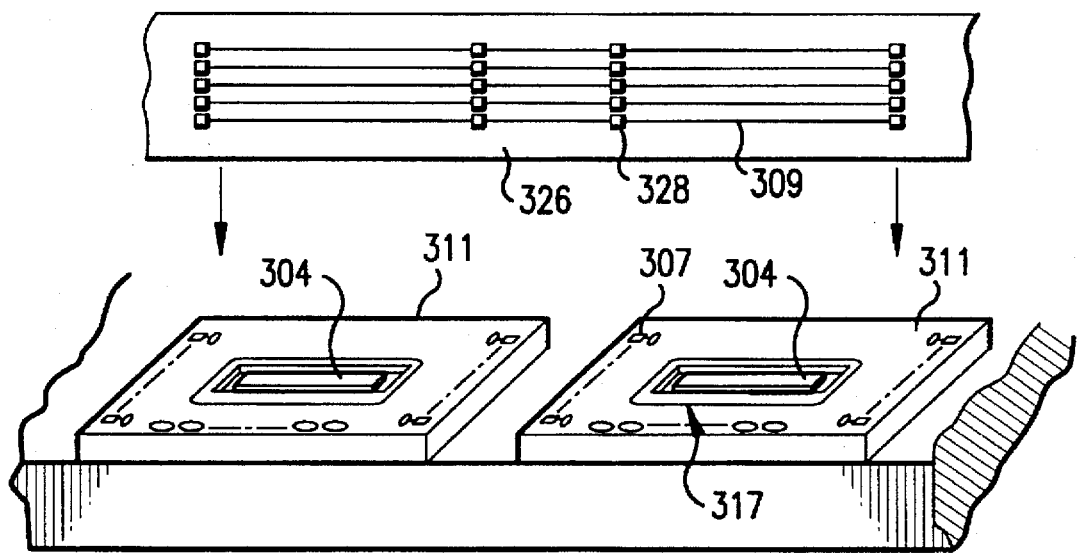
FIG. 48 illustrates a state where a plurality of semiconductor devices are mounted on a multi-layer circuit substrate according to a twenty-second embodiment of the present invention.

FIG. 48 is an exploded perspective view which illustrates each element of an embodiment of the structure for mounting a semiconductor device according to this embodiment. FIG. 48 shows an embodiment of a method of mounting a bus line in which the semiconductor device 304 according to the twentieth embodiment passes through the opening portion 320 formed in the first layer 301 of the multi-layer circuit substrate 311, and the semiconductor device 304 is face-down mounted on the second layer 302. The bus lines 309 of the multi-layer circuit substrate 311, on which a plurality of semiconductor devices 304 are mounted, are wired (i.e., electrically connected to each other) by using an FPC 326 for wiring bus lines. This embodiment is characterized in that the FPC for wiring bus lines has connection lands 328 for wiring bus lines to correspond to the lands 307 of the multi-layer circuit substrate 311. Further, the lands 307 and the lands 328 for wiring bus lines are connected to one another by soldering or by using anisotropic conductive films or the like.

Figure 49:
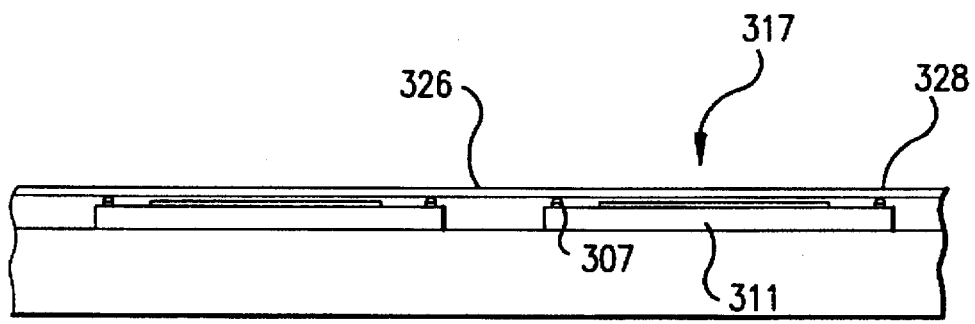
FIG. 49 is a front elevational view that illustrates a state where a plurality of semiconductor devices are mounted on a multi-layer circuit substrate according to the twenty-second embodiment of the present invention.

FIG. 49 is a front elevational view which illustrates a state where the semiconductor devices 304 shown in FIG. 48 have been mounted.

Twenty-Third Embodiment

A twenty-third embodiment will now be described with reference to FIGS. 50 and 51.

Figure 50:
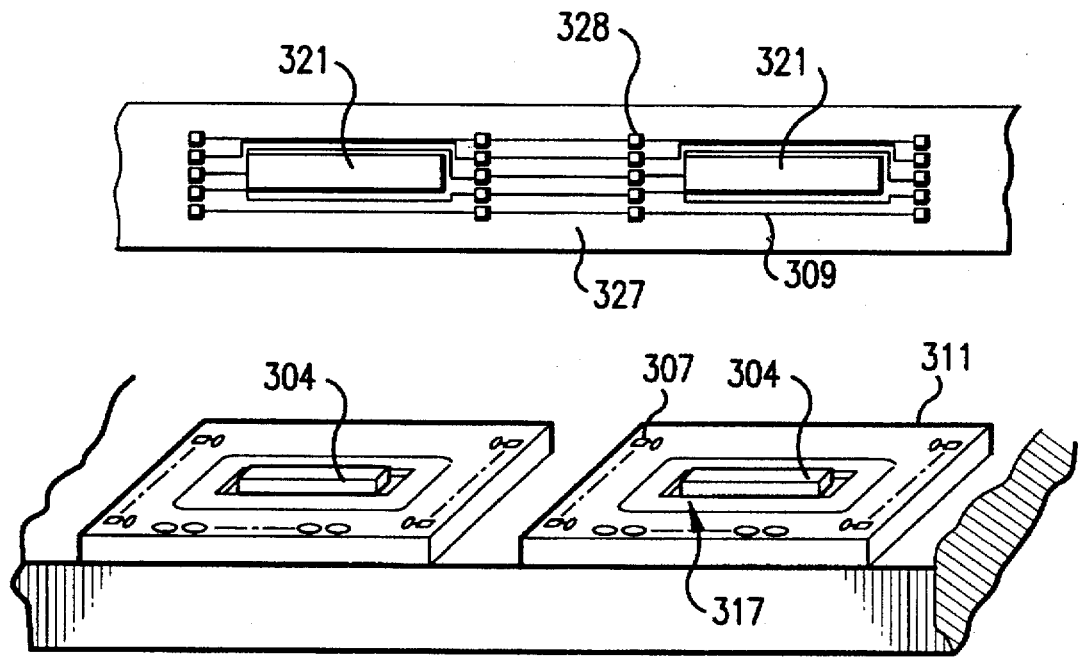
FIG. 50 illustrates a state where a plurality of semiconductor devices are mounted on a multi-layer circuit substrate according to a twenty-third embodiment of the present invention.

FIG. 50 is an exploded perspective view which illustrates each element of an embodiment of the structure for mounting a semiconductor device according to this embodiment. FIG. 50 shows an embodiment of a method of mounting a bus line in which the semiconductor device 304 according to the twentieth embodiment passes through the opening portion 320 formed in the first layer 301 of the multi-layer circuit substrate 311, and the semiconductor device 304 is face-down mounted on the second layer 302. The bus lines 309 of the multi-layer circuit substrate 311, on which a plurality of semiconductor devices 304 are mounted, are wired by using a PCB substrate 327 for wiring bus lines having a plurality of opening portions 321. This embodiment is characterized in that the PCB substrate for wiring bus lines has connection lands 328 for wiring bus lines to correspond to the lands 307 of the multi-layer circuit substrate 311. Further, the lands 307 and the lands 328 for wiring bus lines are connected to one another by soldering or by using anisotropic conductive films or the like.

Figure 51:
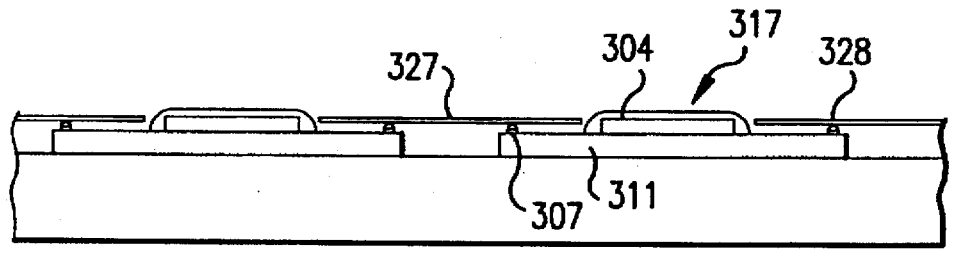
FIG. 51 is a front elevational view that illustrates a state where a plurality of semiconductor devices are mounted on a multi-layer circuit substrate according to the twenty-third embodiment of the present invention.

FIG. 51 is a front elevational view which illustrates a state where the semiconductor devices 304 shown in FIG. 50 have been mounted.

Twenty-Fourth Embodiment

A twenty-fourth embodiment will now be described with reference to FIG. 52.

Figure 52:
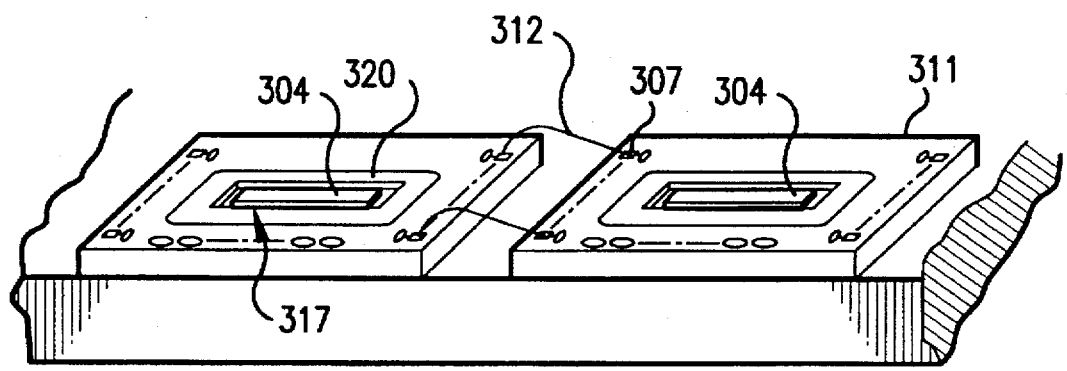
FIG. 52 is a perspective view that illustrates a state where a plurality of semiconductor devices are mounted on a multi-layer circuit substrate according to a twenty-fourth embodiment of the present invention.

FIG. 52 is a perspective view which illustrates an embodiment of the structure for mounting a semiconductor device according to this embodiment. FIG. 52 shows an embodiment of a method of mounting a bus line in which the semiconductor device 304 according to the twentieth embodiment passes through the opening portion 320 formed in the first layer 301 of the multi-layer circuit substrate 311, and the semiconductor device 304 is face-down mounted on the second layer 302. The bus lines of the multi-layer circuit substrate 311, on which a plurality of semiconductor devices 304 are mounted, are connected by using the lands 307 formed on the first layer 301 of the multi-layer circuit substrate 311 with Au wires 312 by the wire bonding mounting method.

Twenty-Fifth Embodiment

A twenty-fifth embodiment will now be described with reference to FIGS. 53 and 54.

Figure 53:
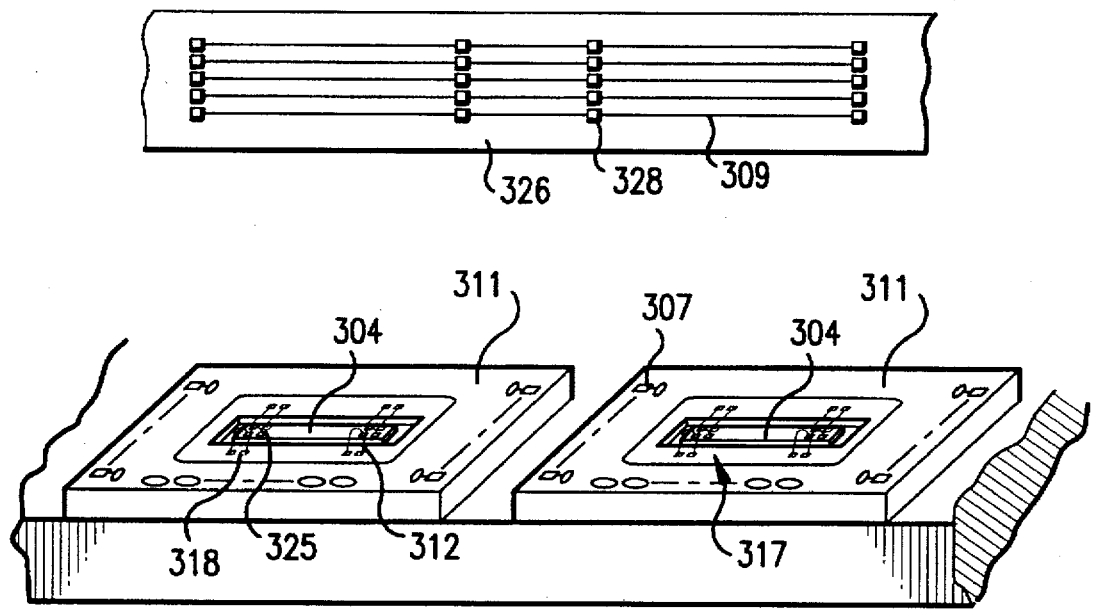
FIG. 53 illustrates a state where a plurality of semiconductor devices are mounted on a multi-layer circuit substrate according to a twenty-fifth embodiment of the present invention.

FIG. 53 is an exploded perspective view which illustrates each element of an embodiment of the structure for mounting a semiconductor device according to this embodiment. FIG. 53 illustrates an example of the mounting method in which the semiconductor device 304 according to the twentieth embodiment is secured on the second layer 302 of the multi-layer circuit substrate 311 with an adhesive agent or the like in such a manner that the active side of the semiconductor device 304 faces upwards while passing through the opening portion 320 formed in the first layer 301 of the multi-layer circuit substrate 311. Further, the electrodes 325 of the semiconductor device 304 and the wire bonding lands 318 of the first layer 301 of the multi-layer circuit substrate 311 are connected to one another by the wire bonding mounting method. The bus lines 309 of the multi-layer circuit substrate 311, on which a plurality of semiconductor devices 304 are mounted, are wired by using an FPC 326 for wiring bus lines. This embodiment is characterized in that the FPC for wiring bus lines has connection lands 328 for wiring bus lines to correspond to the lands 307 of the multi-layer circuit substrate 311. Further, the lands 307 and the connection lands 328 for wiring are connected by soldering or by using anisotropic conductive films.

Figure 54:
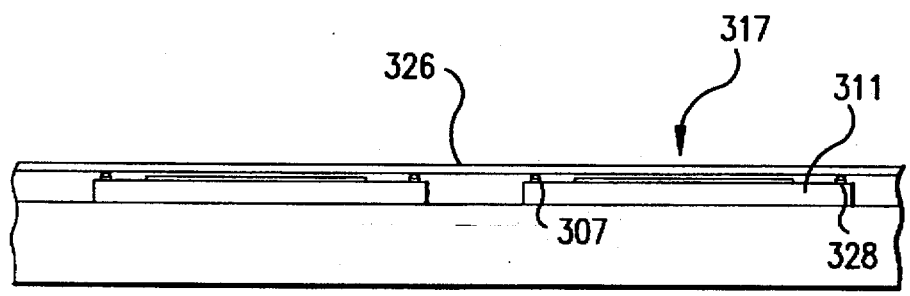
FIG. 54 is a front elevational view that illustrates a state where a plurality of semiconductor devices are mounted on a multi-layer circuit substrate according to the twenty-fifth embodiment of the present invention.

FIG. 54 is a front elevational view which illustrates a state where the semiconductor devices 304 shown in FIG. 54 have been mounted.

Twenty-Sixth Embodiment

A twenty-sixth embodiment will now be described with reference to FIGS. 55 and 56.

Figure 55:
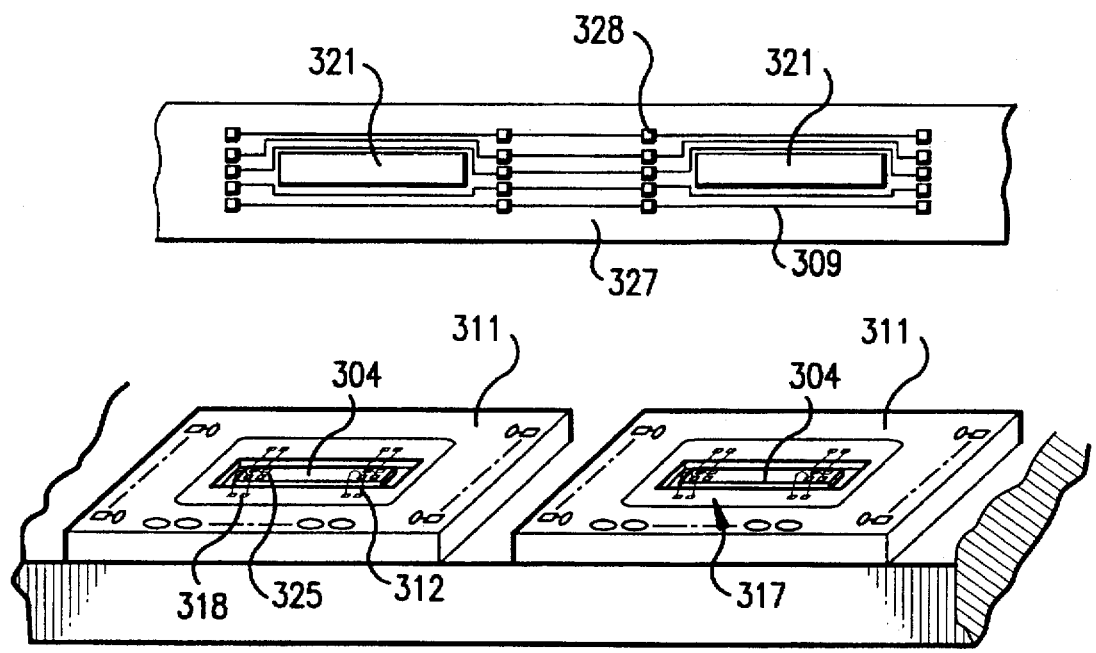
FIG. 55 illustrates a state where a plurality of semiconductor devices are mounted on a multi-layer circuit substrate according to a twenty-sixth embodiment of the present invention.

FIG. 55 is an exploded perspective view which illustrates each element of an embodiment of the structure for mounting a semiconductor device according to this embodiment. FIG. 55 illustrates an example of the mounting method in which the semiconductor device 304 according to the twentieth embodiment is secured on the second layer 302 of the multi-layer circuit substrate 311 with an adhesive agent or the like in such a manner that the active side of the semiconductor device 304 faces upwards while passing through the opening portion 320 formed in the first layer 301 of the multi-layer circuit substrate 311. Further, the electrodes 325 of the semiconductor device 304 and the wire bonding lands 318 of the first layer 301 of the multi-layer circuit substrate 311 are connected to one another by the wire bonding mounting method. The bus lines 309 of the multi-layer circuit substrate 311, on which a plurality of semiconductor devices 304 are mounted, are wired by using a PCB substrate 327 for wiring bus lines having a plurality of openings 321. This embodiment is characterized in that the PCB substrate 327 for wiring bus lines has connection lands 328 for wiring bus lines to correspond to the lands 307 of the multi-layer circuit substrate 311. Further, the lands 307 and the connection lands 328 for wiring are connected by soldering or by using anisotropic conductive films.

Figure 56:
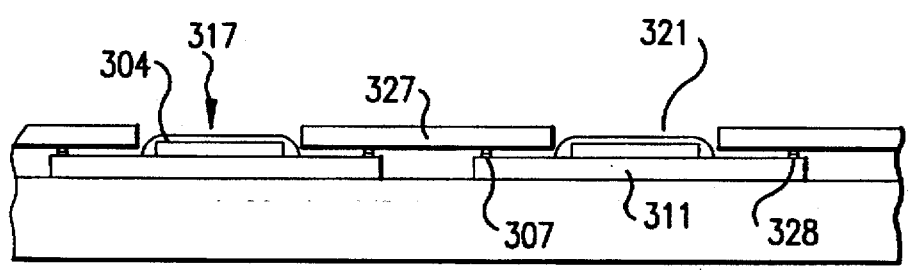
FIG. 56 is a front elevational view that illustrates a state where a plurality of semiconductor devices are mounted on a multi-layer circuit substrate according to the twenty-sixth embodiment of the present invention.

FIG. 56 is a front elevational view which illustrates a state where the semiconductor devices 304 shown in FIG. 55 have been mounted.

Twenty-Seventh Embodiment

A twenty-seventh embodiment of the present invention will now be described with reference to FIG. 57.

Figure 57:
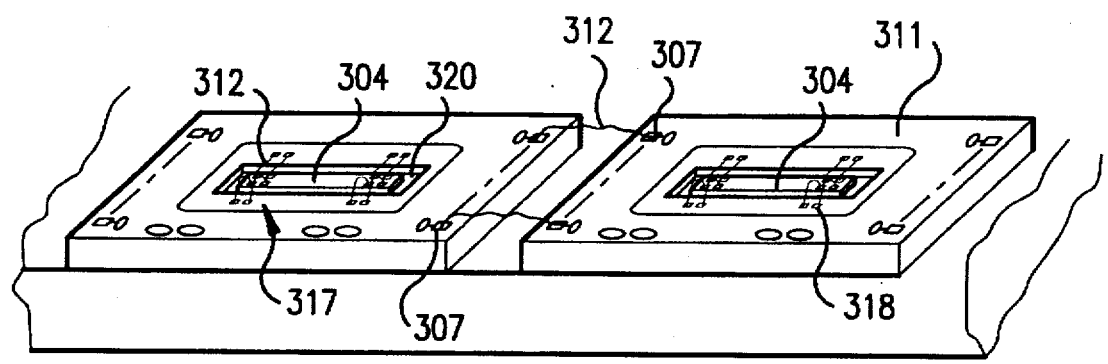
FIG. 57 is a perspective view that illustrates a state where a plurality of semiconductor devices are mounted on a multi-layer circuit substrate according to a twenty-seventh embodiment of the present invention.

FIG. 57 is a perspective view which illustrates an embodiment of the structure for mounting a semiconductor device. FIG. 57 illustrates an example of the mounting method in which the semiconductor device 304 according to the twentieth embodiment is secured on the second layer 302 of the multi-layer circuit substrate 311 with an adhesive agent or the like in such a manner that the active side of the semiconductor device 304 faces upwards while passing through the opening portion 320 formed in the first layer 301 of the multi-layer circuit substrate 311. Further, the electrodes 325 of the semiconductor device 304 and the wire bonding lands 318 of the first layer 301 of the multi-layer circuit substrate 311 are connected to one another by the wire bonding mounting method. The bus lines 309 of the multi-layer circuit substrate 311, on which a plurality of semiconductor devices 304 are mounted, are connected by using the land formed on the surface of the first layer 301 of the multi-layer circuit substrate 311 by the wire bonding method using Au wires 312.

Twenty-Eighth Embodiment

A twenty-eighth embodiment will now be described with reference to FIG. 58.

Figure 58:
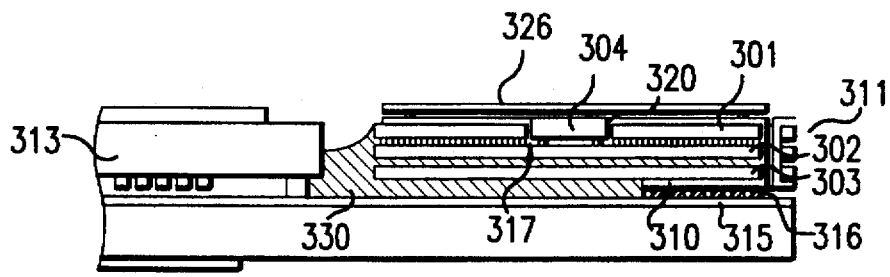
FIG. 58 is a cross sectional view that illustrates a state where multi-layer circuit substrates are mounted on an electronic optical apparatus according to a twenty-eighth embodiment.

FIG. 58 is a cross sectional view which illustrates an embodiment in which the structure for mounting the semiconductor device according to the present invention is adapted to a liquid crystal display apparatus, which is an electronic optical apparatus. FIG. 58 illustrates a state where the multi-layer circuit substrate 311, having a plurality of semiconductor devices according to the twenty-second embodiment passing through the opening portion 320 formed in the first layer 301 of the multi-layer circuit substrate 311 and face-down mounted on the second layer 302, is mounted on a liquid crystal display apparatus, the multi-layer circuit substrate 311 having the bus lines 309 mounted by using the FPC 326 for wiring bus lines. The external connection terminal 310 of the multi-layer circuit substrate 311 and the panel terminal 315 are connected to each other by an anisotropic conductive film 316. The anisotropic conductive film 316 establishes the electrical connection and somewhat secures the multi-layer circuit board 311 to the liquid crystal panel 313. If the anisotropic conductive film 316 is made of a thermo-hardening material or a blend type of a thermoplastic material and a thermo-hardening material, a heating and pressurizing head is abutted against the multi-layer substrate 311 so that the anisotropic conductive film 316 is hardened and connected. If the anisotropic conductive film 316 is made of an ultraviolet hardening type material, a pressurizing head is abutted against the multi-layer circuit substrate and ultraviolet rays are applied from a position adjacent to the panel terminal 315 (adjacent to the glass) so that the anisotropic conductive film 316 is hardened.

Further, molds 330 are provided to protect exposed portions of the panel terminals from corrosion, the molds 330 also serving to secure the multi-layer circuit substrate to the liquid crystal panel 313.

By using the multi-layer circuit substrate according to this embodiment as described above, adaption to a fine pitch of 80 μm or less, which has been previously considered difficult with the conventional TCP method can be realized.

Further, the conventional COG method in which the wiring of the bus lines in the cross manner on the liquid crystal panel requires a wide area in which the bus lines are wired. Even worse, metal lines must be used in order to reduce the circuit resistance and, accordingly, the cost cannot be reduced. However, use of the multi-layer circuit substrate 311 enables the space required to wire the bus lines and cost can be reduced as compared with the COG method.

Twenty-Ninth Embodiment

A twenty-ninth embodiment will now be described with reference to FIG. 59.

Figure 59:
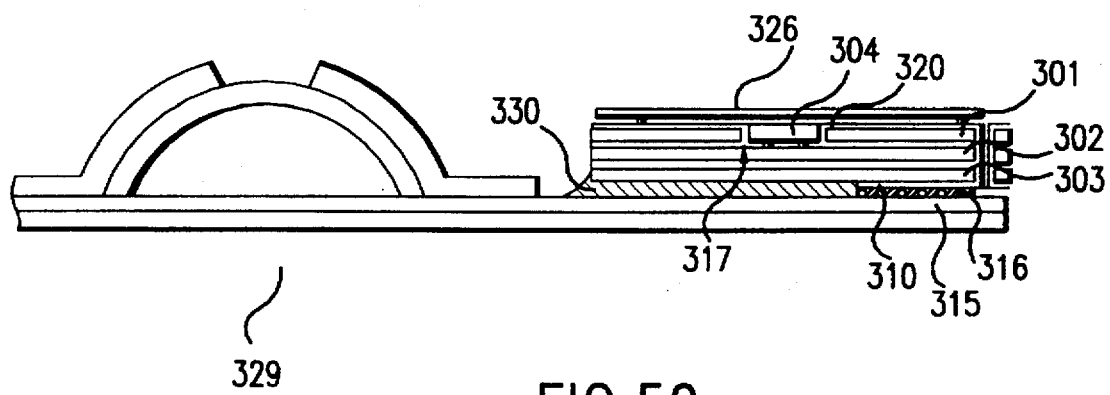
FIG. 59 is a cross sectional view that illustrates a state where multi-layer circuit substrates are mounted on an electronic printing apparatus according to a twenty-ninth embodiment.

FIG. 59 is a cross sectional view which illustrates an embodiment in which the structure for mounting the semiconductor according to the present invention is adapted to the head portion of a thermal printer 329 which is an electronic printing apparatus. In this embodiment, the multi-layer circuit substrate 311, on which a multiplicity of semiconductor devices 304 according to the twenty-second embodiment passing through the opening portion 320 of the first layer 301 of the multi-layer circuit substrate 311 and face-down mounted on the second layer 311, is mounted on the thermal printer head of the electronic printing apparatus. The external connection terminal 310 of the multi-layer substrate 311 and the panel terminal 315 are connected to each other by an anisotropic conductive film 316.

Thirtieth Embodiment

A thirtieth embodiment will now be described with reference to FIG. 60.

FIG. 60 is a cross sectional view which illustrates an embodiment in which the mounting structure of the multi-layer circuit substrate according to the twenty-third embodiment is adapted to a liquid crystal display apparatus which is the electronic optical apparatus. As contrasted with the twenty-eighth embodiment, this embodiment is characterized in that bus lines of a plurality of multi-layer circuit substrates 311 are mounted by using a PCB substrate 327 for wiring bus lines having a plurality of opening portions 321.

Thirty-First Embodiment

A thirty-first embodiment of the present invention will now be described with reference to FIG. 61.

FIG. 61 is a cross sectional view which illustrates an embodiment in which the mounting structure of the multi-layer circuit substrate according to the twenty-third embodiment is adapted to a thermal print head of an electronic printing apparatus. As contrasted with the twenty-ninth embodiment, this embodiment is characterized in that the bus lines of a plurality of multi-layer circuit substrates 311 are mounted by using a PCB substrate 327 having a plurality of opening portions 321.

Thirty-Second Embodiment

A thirty-second embodiment will now be described with reference to FIG. 62.

Figure 62:
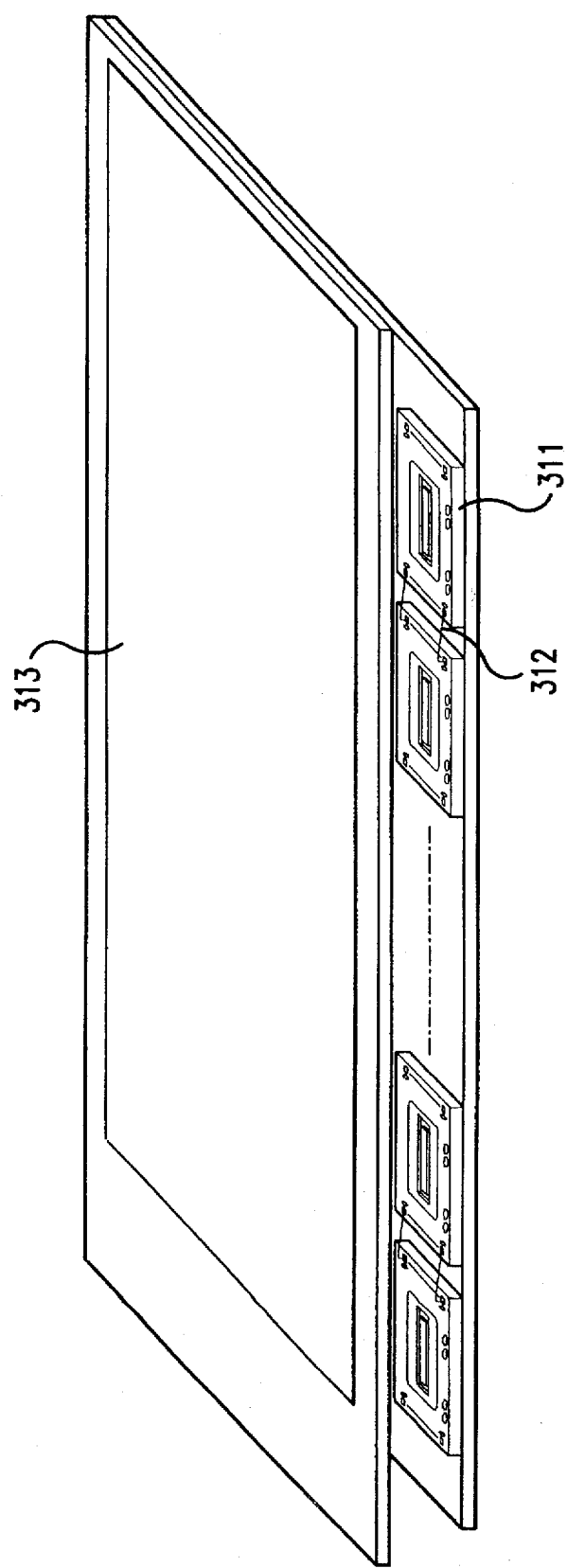
FIG. 62 is a perspective view that illustrates a state where multi-layer circuit substrates are mounted on an electronic optical apparatus according to a thirty-second embodiment.

FIG. 62 is a perspective view which illustrates an embodiment in which the mounting structure of the multi-layer circuit substrate according to the twentieth embodiment is adapted to a liquid crystal display apparatus 313 which is an electronic optical apparatus. As contrasted with the twenty-eighth embodiment, this embodiment is characterized in that the bus lines of a plurality of multi-layer circuit substrates 311 are connected by using Au wires 312 by the wire bonding method.

Thirty-Third Embodiment

A thirty-third embodiment will now be described with reference to FIG. 63.

Figure 63:
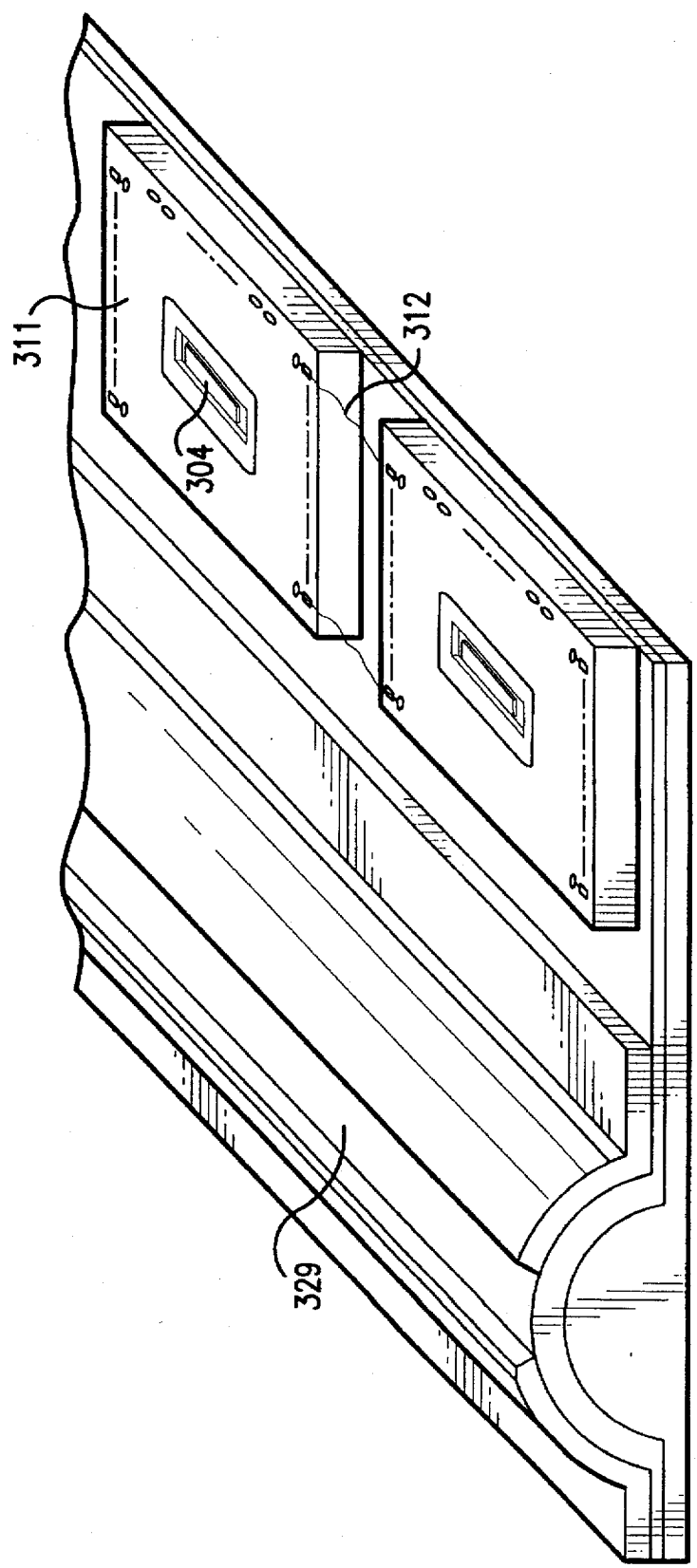
FIG. 63 is a perspective view that illustrates a state where multi-layer circuit substrates are mounted on an electronic printing apparatus according to a thirty-third embodiment.

FIG. 63 is a perspective view which illustrates an embodiment in which the mounting structure of the multi-layer circuit substrate according to the twentieth embodiment is adapted to the head portion of a thermal printer 329 which is the electronic printing apparatus. As contrasted with the twenty-ninth embodiment, this embodiment is characterized in that the bus lines of a plurality of multi-layer circuit substrates 311 are connected by using Au wires 312 by the wire bonding method.

Thirty-Fourth Embodiment

A thirty-fourth embodiment will now be described with reference to FIG. 64.

Figure 64:
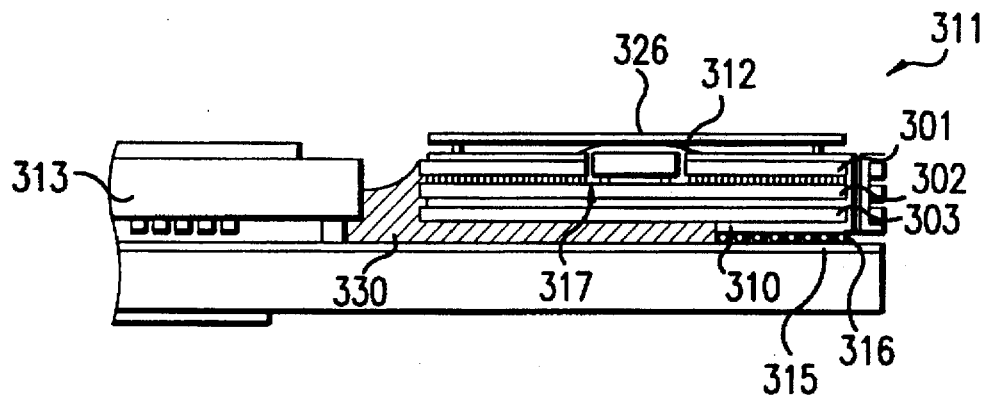
FIG. 64 is a cross sectional view that illustrates a state where multi-layer circuit substrates are mounted on an electronic optical apparatus according to a thirty-fourth embodiment.

FIG. 64 is a cross sectional view which illustrates an embodiment in which the mounting structure of the multi-layer circuit substrate according to the twenty-first embodiment is adapted to the liquid crystal display apparatus 313 which is the electronic optical apparatus. As contrasted with the twenty-eighth embodiment, the input/output terminals of the semiconductor device 304 are connected by the wire bonding method.

Thirty-Fifth Embodiment

A thirty-fifth embodiment will now be described with reference to FIG. 65.

Figure 65:
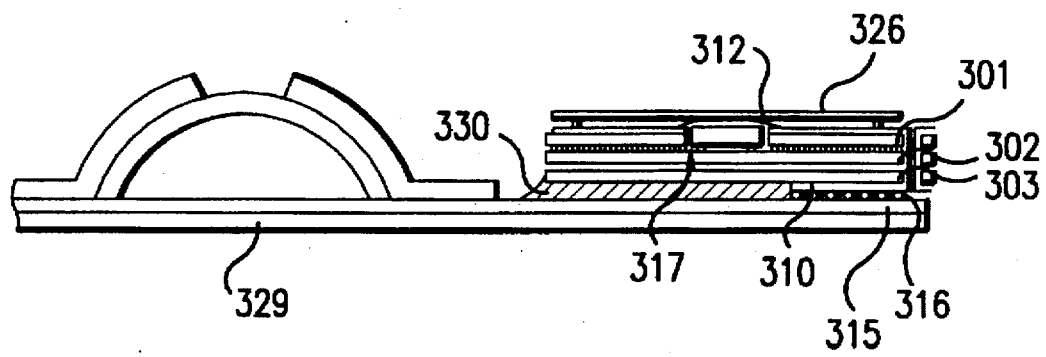
FIG. 65 is a cross sectional view that illustrates a state where multi-layer circuit substrates are mounted on an electronic printing apparatus according to a thirty-fifth embodiment.

FIG. 65 is a cross sectional view which illustrates an embodiment in which the mounting structure of the multi-layer circuit substrate according to the twenty-ninth embodiment is adapted to the head portion of a thermal printer 329 which is the electronic printing apparatus. As contrasted with the twenty-ninth embodiment, the input/output terminals of the semiconductor device 304 are connected by the wire bonding method.

Thirty-Sixth Embodiment

A thirty-sixth embodiment will now be described with reference to FIG. 66.

Figure 66:
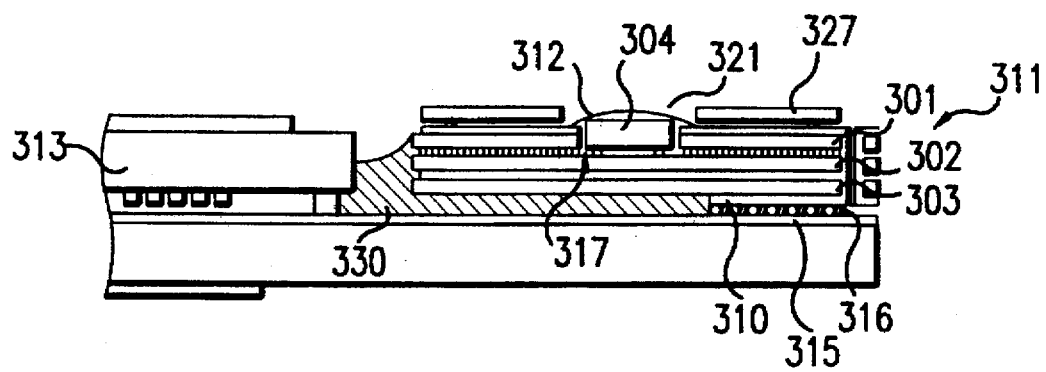
FIG. 66 is a cross sectional view that illustrates a state where multi-layer circuit substrates are mounted on an electronic optical apparatus according to a thirty-sixth embodiment.

FIG. 66 is a cross sectional view which illustrates an embodiment in which the mounting structure of the multi-layer circuit substrate according to the twenty-third embodiment is adapted to the liquid crystal display apparatus 313 which is the electronic optical apparatus. As contrasted with the thirty-fourth embodiment, this embodiment is characterized in that the bus lines of a plurality of multi-layer circuit substrates 311 are mounted by using a PCB substrate 327 having a plurality of opening portions 321.

Thirty-Seventh Embodiment

A thirty-seventh embodiment will now be described with reference to FIG. 67.

Figure 67:
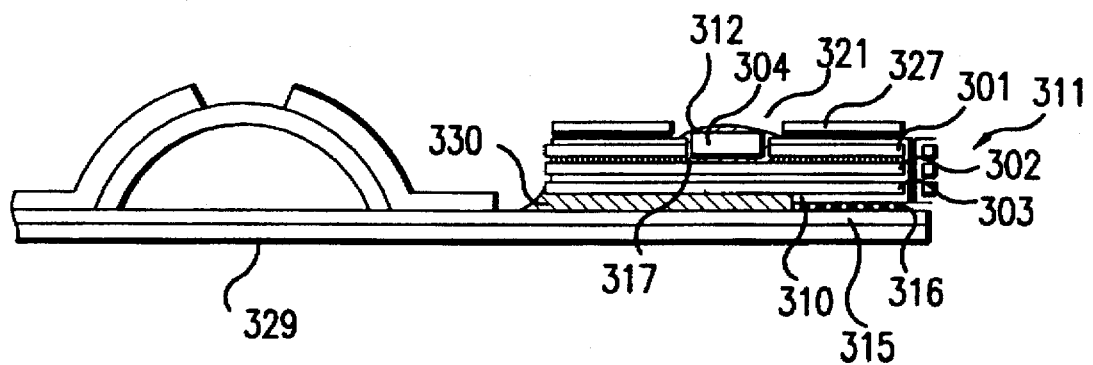
FIG. 67 is a cross sectional view that illustrates a state where multi-layer circuit substrates are mounted on an electronic printing apparatus according to a thirty-seventh embodiment.

FIG. 67 is a cross sectional view which illustrates an embodiment in which the mounting structure of the multi-layer circuit substrate according to the twenty-third embodiment is adapted to the head portion of a thermal printer which is the electronic printing apparatus. As contrasted with the thirty-fifth embodiment, this embodiment is characterized in that the bus lines of a plurality of multi-layer circuit substrates 311 are mounted by using a PCB substrate 327 having a plurality of opening portion 321.

Thirty-Eighth Embodiment

A thirty-eighth embodiment will now be described with reference to FIG. 68.

Figure 68:
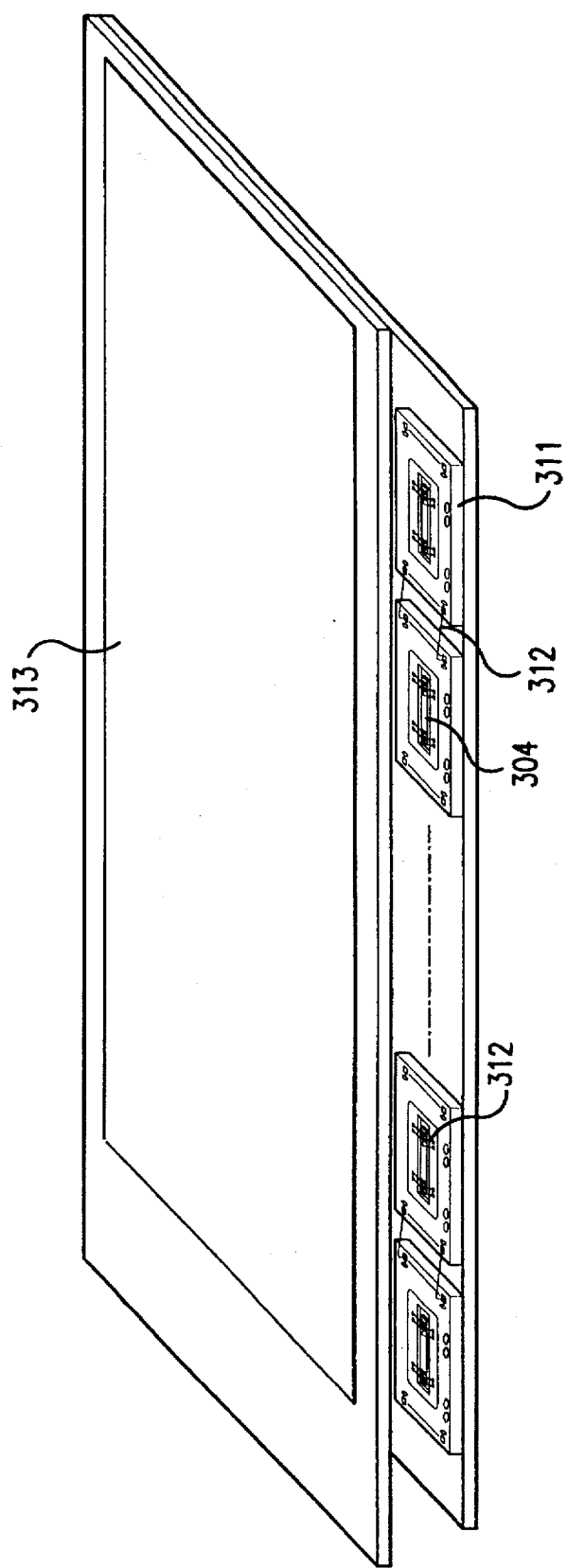
FIG. 68 is a perspective view that illustrates a state where multi-layer circuit substrates are mounted on an electronic optical apparatus according to a thirty-eighth embodiment.

FIG. 68 is a perspective view which illustrates an embodiment in which the mounting structure of the multi-layer circuit substrate according to the twenty-seventh embodiment is adapted to the liquid crystal display apparatus 313 which is the electronic optical apparatus. As contrasted with the twenty-eighth embodiment, this embodiment is characterized in that the bus lines of a plurality of multi-layer circuit boards 311 are connected by using Au wires 312 by the wire bonding method.

Thirty-Ninth Embodiment

A thirty-ninth embodiment will now be described with reference to FIG. 69.

Figure 69:
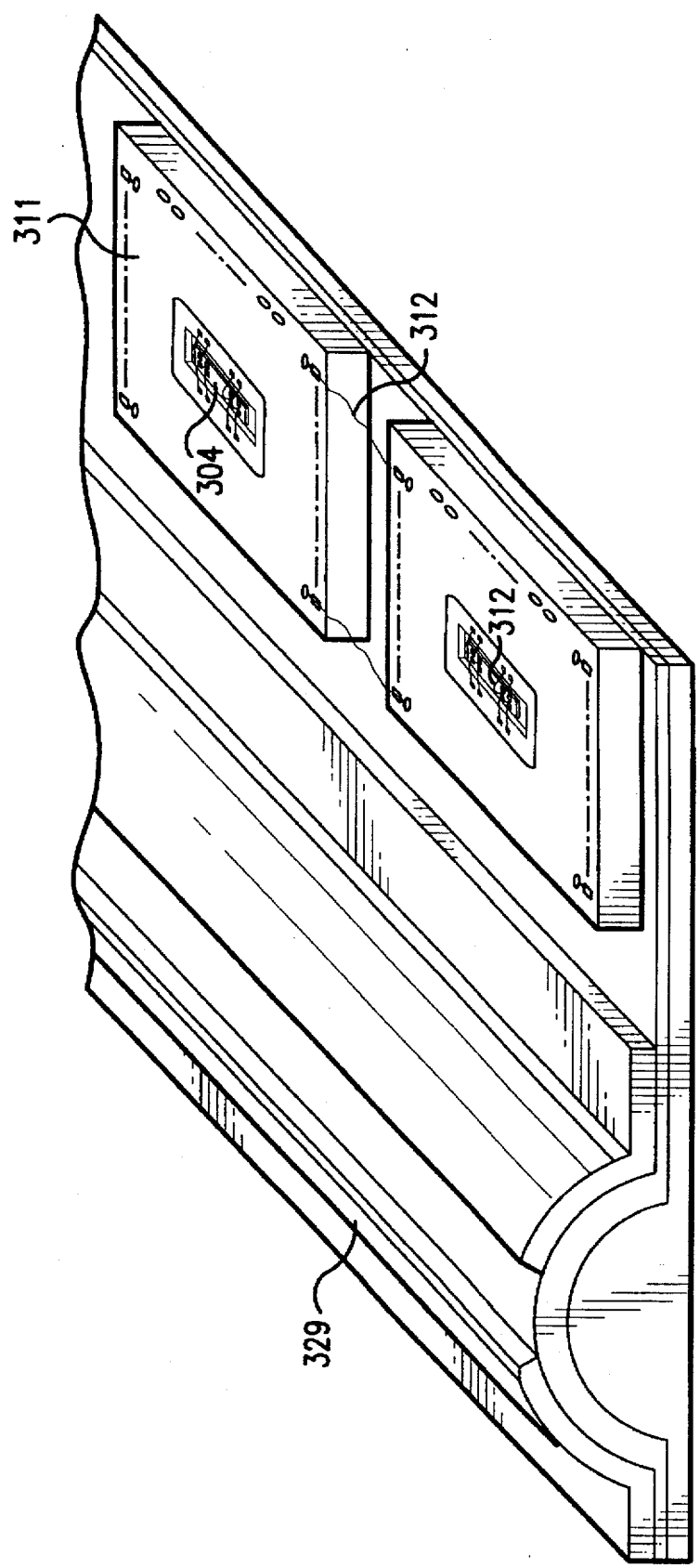
FIG. 69 is a perspective view that illustrates a state where multi-layer circuit substrates are mounted on an electronic printing apparatus according to a thirty-ninth embodiment.

FIG. 69 is a perspective view which illustrates an embodiment in which the mounting structure of the multi-layer circuit substrate according to the twenty-seventh embodiment is adapted to the head portion of a thermal printer 329 which is the electronic printing apparatus. As contrasted with the twenty-ninth embodiment, this embodiment is characterized in that the bus lines of a plurality of multi-layer circuit boards 311 are connected by using Au wires 312 by the wire bonding method.

Fortieth Embodiment

A fortieth embodiment will now be described with reference to FIG. 70.

Figure 70:
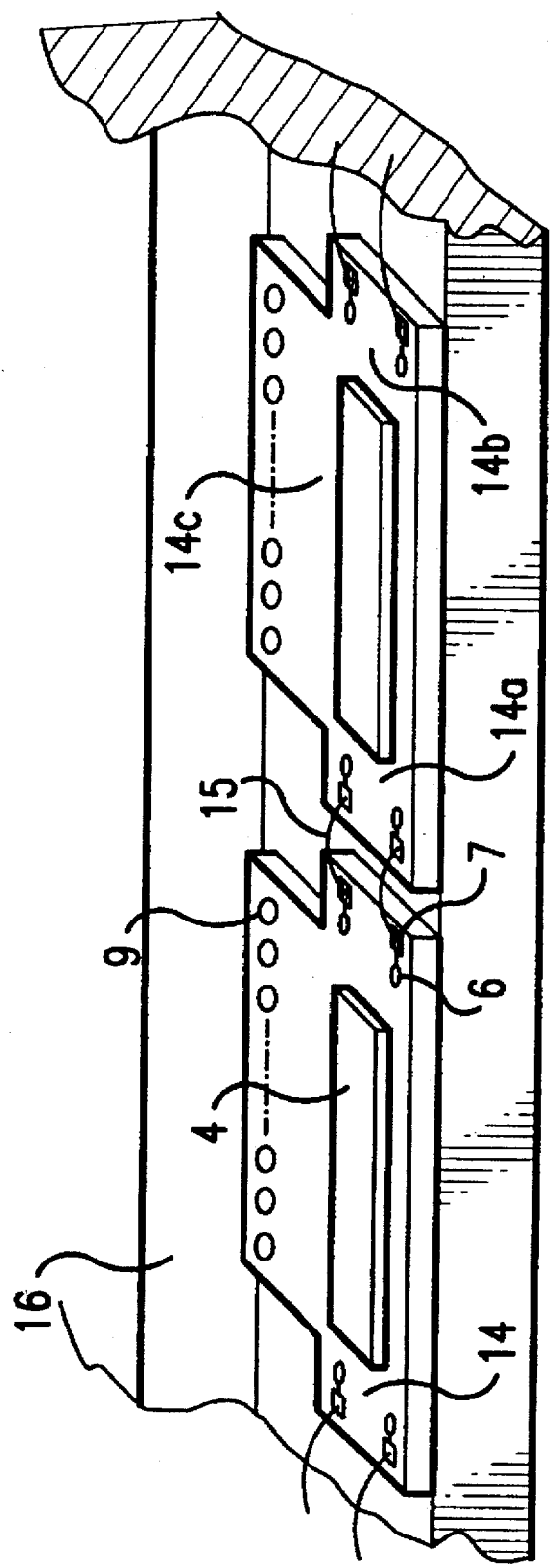
FIG. 70 is a perspective view that illustrates a portion of a liquid crystal display apparatus according to a fortieth embodiment of the present invention.

FIG. 70 illustrates a liquid crystal display apparatus according to the present invention in which a multi-layer substrate 14, on which a semiconductor chip 4 for driving liquid crystal is face-down bonded, is connected to the terminal of a liquid crystal display panel by using the connection member 19 similar to the first embodiment. The portion of the connection portion is arranged similar to that shown in FIG. 4. However, the multi-layer substrate 14 has projections 14a, 14b, 14c that are formed in only the portions which are required for wire bonding.

By using the multi-layer substrate according to this embodiment, unnecessary portions can be eliminated in the multi-layer substrate. Further, the distance between the multi-layer substrates is shortened while necessitating a minimum size so that the length of the wire for use in the wire bonding operation is shortened. As a result, generation of defective connections due to breakage of the wire 15 can be reduced and, accordingly, a low cost and reliable liquid crystal display apparatus can be provided.

Forty-First Embodiment

A forty-first embodiment will now be described with reference to FIG. 71.

Figure 71:
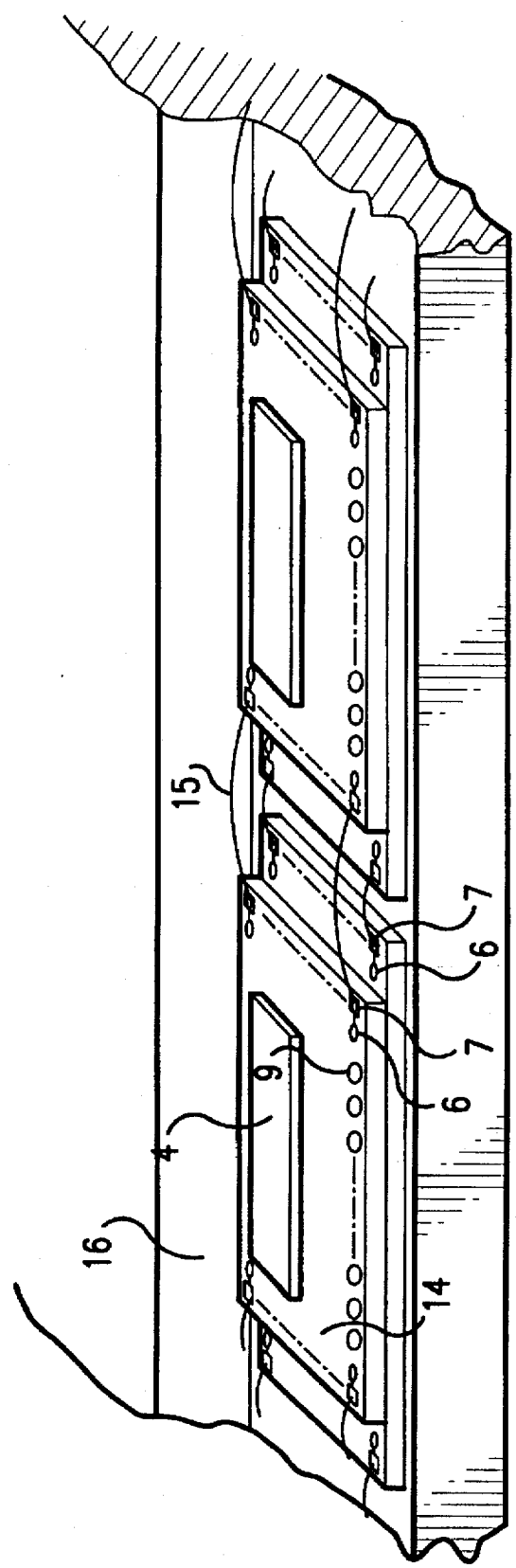
FIG. 71 is a perspective view that illustrates a portion of a liquid crystal display apparatus according to a forty-first embodiment of the present invention.

FIG. 71 illustrates a liquid crystal display apparatus according to the present invention in which a multi-layer substrate 14 on which a semiconductor chip 4 for driving liquid crystal is face-down bonded, is connected to the terminal of a liquid crystal display panel by using the connection member 19 similar to the first embodiment. The portion of the connection portion is arranged similar to that shown in FIG. 4. However, the upper layer of the multi-layer substrate is smaller than the lower layers, so that a step portion is formed at the end portion of the multi-layer substrate, and the adjacent multi-layer substrates are connected such that wire bonding is performed in each of the two sections.

As described above, use of the multi-layer substrate according to this embodiment in which wire bonding is performed in each of the two sections enables the wire bonding lands can be integrated. As a result, the size of the multi-layer substrate can be reduced. Therefore, a compact apparatus, the cost of which can be reduced, can be provided.

Forty-Second Embodiment

A forty-second embodiment will now be described with reference to FIG. 72.

Figure 72:
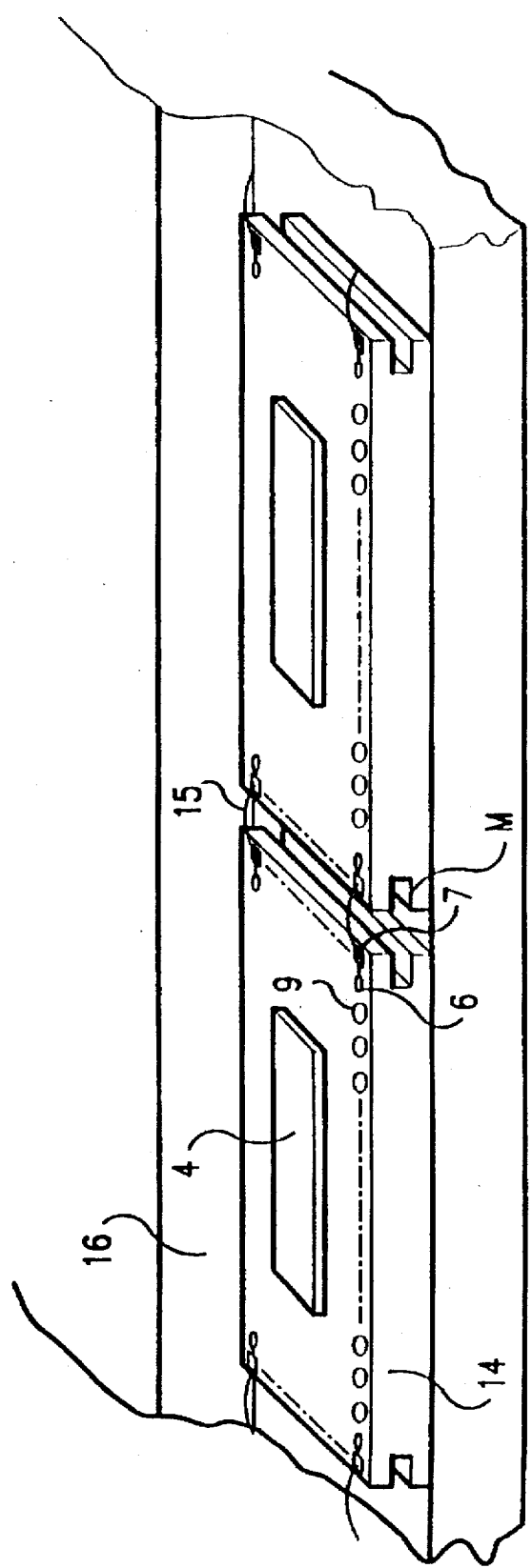
FIG. 72 is a perspective view that illustrates a portion of a liquid crystal display apparatus according to a forty-second embodiment of the present invention.

FIG. 72 illustrates a liquid crystal display apparatus according to the present invention in which the multi-layer substrates 14 having the semiconductor chips 4 for driving liquid crystal face-down bonded on the surface thereof are connected to the terminal of the liquid crystal display panel by using the connection member 19 similar to the first embodiment. The portion of the connection portion is arranged similar to that of the first embodiment shown in FIG. 4. However, portion M of the multi-layer substrate shown in FIG. 72 has one or more intermediate layers between the upper layer and the lower layer thereof. The intermediate layer and/or the lower layer has a smaller area than that of the upper layer so that a groove portion is formed.

As described above, use of the multi-layer substrate according to this embodiment, arranged such that the intermediate layer and/or the lower layer of the multi-layer substrate is arranged to have a smaller area than that of the upper layer, provides a space to which a jig and tool can be fastened. As a result, the multi-layer substrate can be handled easily at the time of the machining operations.

Forty-Third Embodiment

A forty-third embodiment will now be described with reference to FIGS. 73, 74 and 75.

Figure 73:
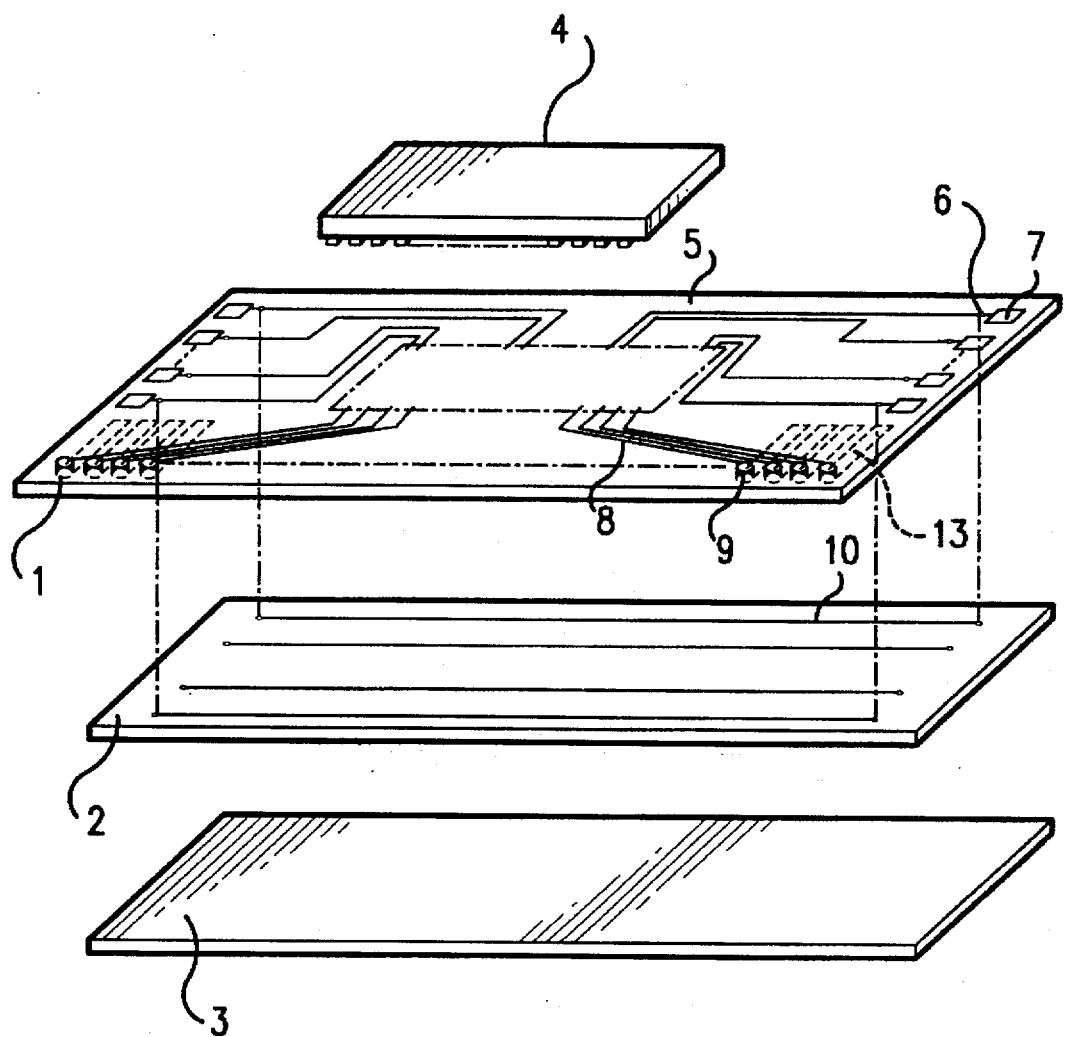
FIG. 73 is an exploded view which illustrates a multi-layer substrate according to a forty-third embodiment of the present invention.

FIG. 73 is an exploded perspective view which illustrates a liquid crystal display apparatus according to the present invention in which a multi-layer substrate has a semiconductor chip for driving liquid crystal face-down bonded on the surface thereof.

Reference numerals 1, 2 and 3 represent layers of the multi-layer substrate according to this embodiment. Reference numeral 1 represents a first layer, 2 represents a second layer and 3 represents a third layer. Similar to the first embodiment, the semiconductor chip 4 for driving liquid crystal is face-down bonded on the surface of the multi-layer substrate. After bonding has been performed, the periphery of the semiconductor chip 4 and portions between the semiconductor chip 4 and the first layer 1 are molded. The first layer 1 has, on the surface thereof, input lines 5 corresponding to the input pads of the semiconductor chip 4. The input lines 5 are connected to the bus lines 10 of the second layer 2 via through holes 6. The input lines 5 have, at the leading portions thereof, lands 7 for wire-bonding another multi-layer substrate disposed adjacently and formed similar to the multi-layer substrate.

Further, output lines 8 corresponding to the output pads of the semiconductor chip 4 are formed on the surface of the first layer by patterning. Since the pitch of the panel terminals is longer than the pitch of the output pads of the semiconductor chip 4, wiring is performed such that the pattern is widened on the first layer 1 to make the output pads coincide with the panel terminals. Further, through holes 9 are formed at the leading portions of the output lines 8 so that the output lines 8 are connected to the connection terminals 13 formed on the reverse side of the first layer for establishing the connection with the panel.

The layers 1, 2 and 3 are ceramic substrates formed by simultaneously sintering alumina substrates at low temperature.

Figure 74:
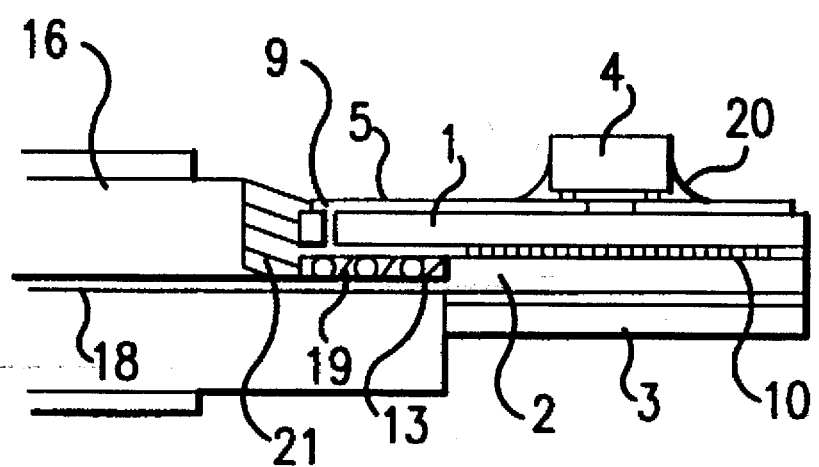
FIG. 74 is a cross sectional view which illustrates a portion of a liquid crystal display apparatus according to the forty-third embodiment of the present invention.

FIG. 74 illustrates the cross section of a portion of an embodiment in which the multi-layer substrate according to the embodiment shown in FIG. 73 is connected to a liquid crystal display panel.

As seen in FIG. 74, a portion of the multi-layer substrate is removed from (i.e., located beyond the periphery of) the panel 16. A portion of the lower layer 3 is removed so that a side of lower layer 3 contacts a side of panel 16, and a portion of the lower surface of layer 2 contacts an upper surface of panel 16.

Figure 75:
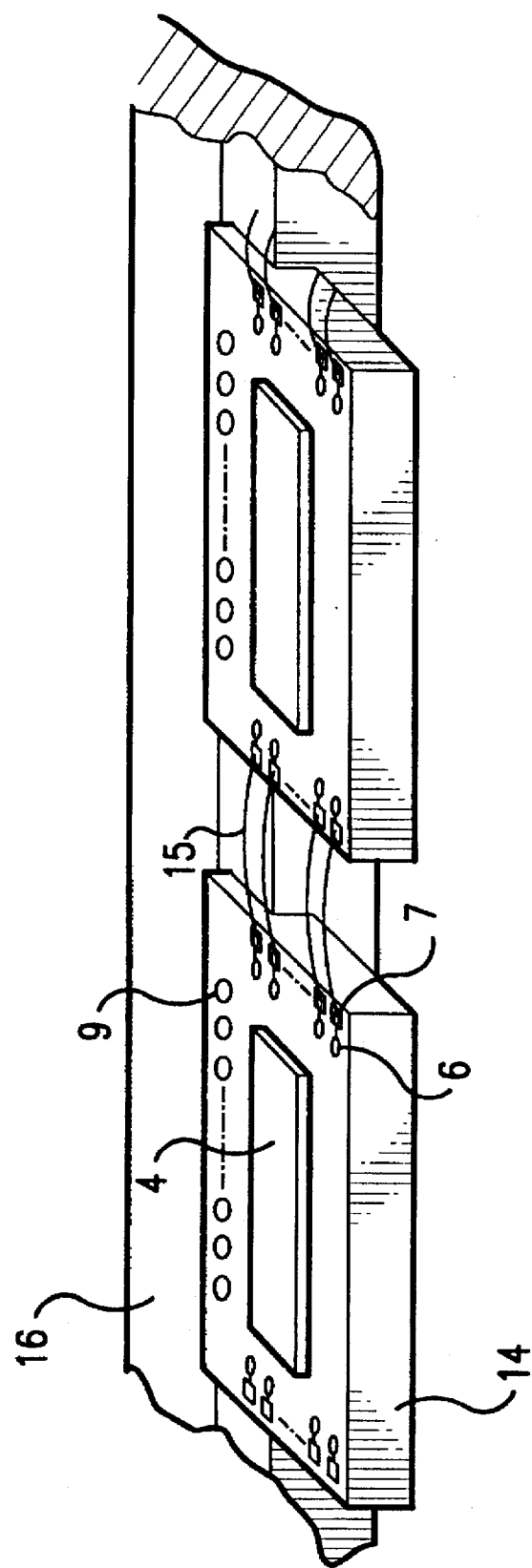
FIG. 75 is a perspective view that illustrates portion of a liquid crystal display apparatus according to the forty-third embodiment of the present invention.

FIG. 75 illustrates a portion of an embodiment in which the multi-layer substrate according to the embodiment shown in FIG. 73 is connected to a liquid crystal display panel 16.

As described above, the arrangement of the multi-layer substrate according to this embodiment in which a portion of the multi-layer substrate is removed from the upper surface of the liquid crystal display panel enables the overall thickness of the liquid crystal display apparatus to be reduced.

Further, the multi-layer substrate having the semiconductor chip for use in the foregoing embodiments mounted thereon can be mounted on another display apparatus or on an electronic printing apparatus such that it can be mounted on a plasma display or an EL display apparatus by changing the foregoing semiconductor chip to a semiconductor chip for driving the plasma display or a semiconductor chip for driving the EL. By similarly mounting a semiconductor chip for driving a thermal head on the multi-layer substrate and by similarly connecting the multi-layer substrate to the thermal head, application to an electronic printing apparatus can be realized.

Forty-Fourth Embodiment

Figure 76:
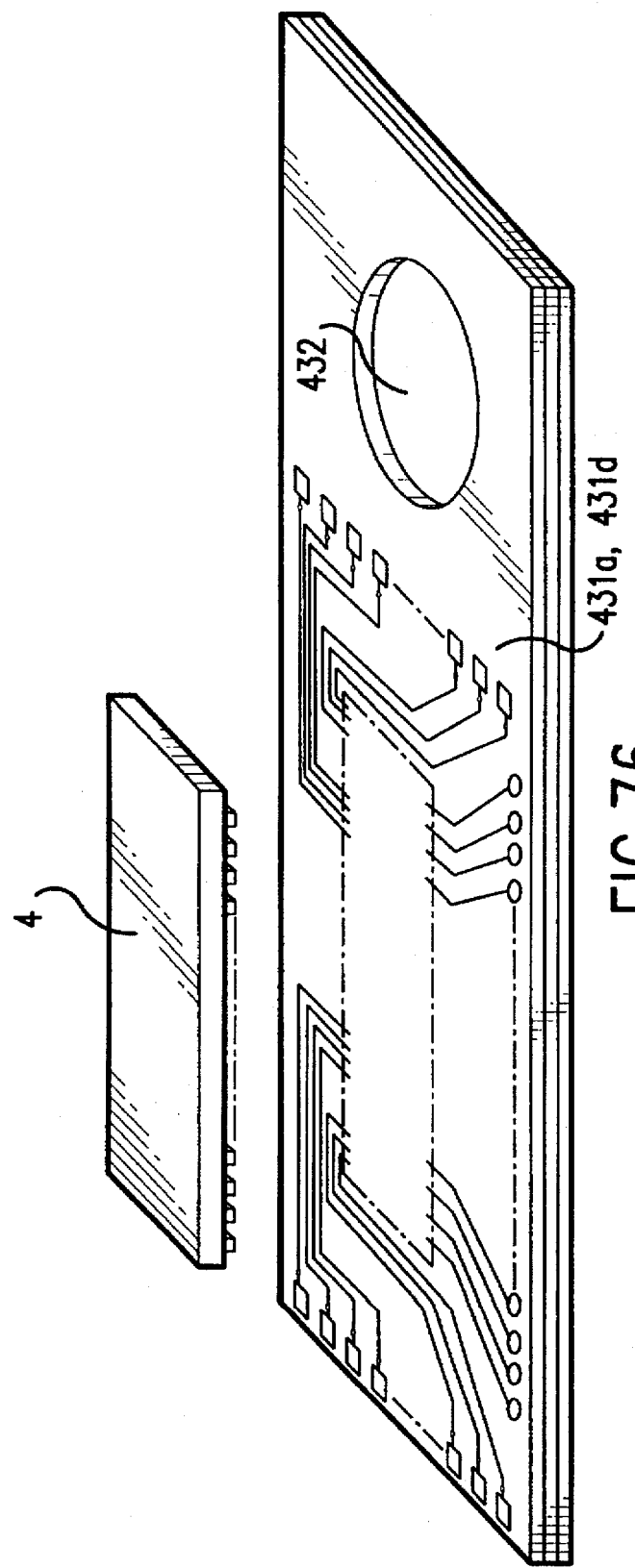
FIG. 76 is a perspective view that illustrates a liquid crystal display apparatus according to a forty-fourth embodiment of the present invention.
Figure 77:
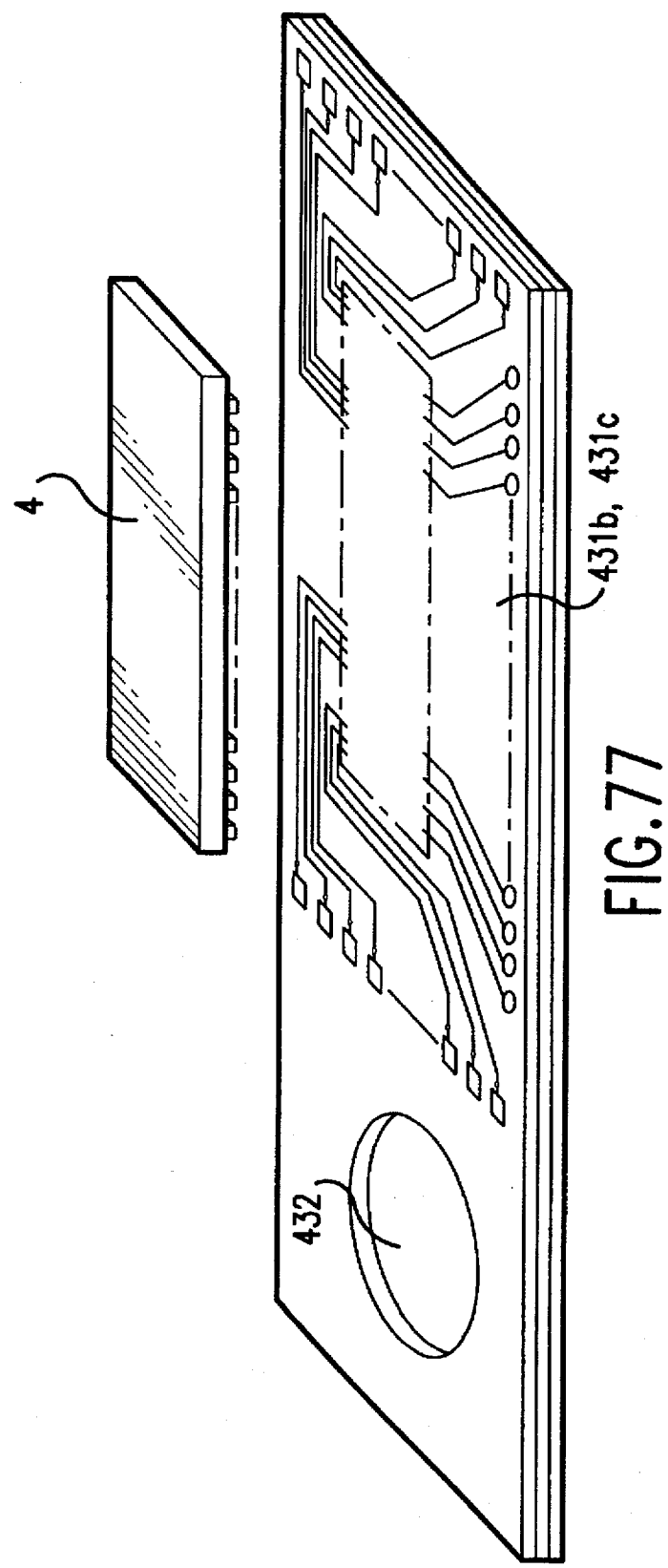
FIG. 77 is a perspective view that illustrates a fastening hole of a multi-layer substrate according to the forty-fourth embodiment of the present invention.

Another embodiment of the present invention will now be described with reference to FIGS. 76, 77 and 78. FIGS. 76 and 77 are perspective views which illustrate a liquid crystal display apparatus according to the present invention which comprises a multi-layer substrate according to the embodiment and having a semiconductor chip for driving liquid crystal which is face-down-bonded on to the surface thereof. Although the material and the constitution of the multi-layer substrate according to this embodiment are the same as those of the multi-layer substrate according to first embodiment, a fastening hole 432 is formed in the multi-layer substrate. Although the drawings illustrate the circular fastening hole 432 to be round, the shape may be formed into a rectangle, an ellipse, a square or an elongated hole.

Figure 78:
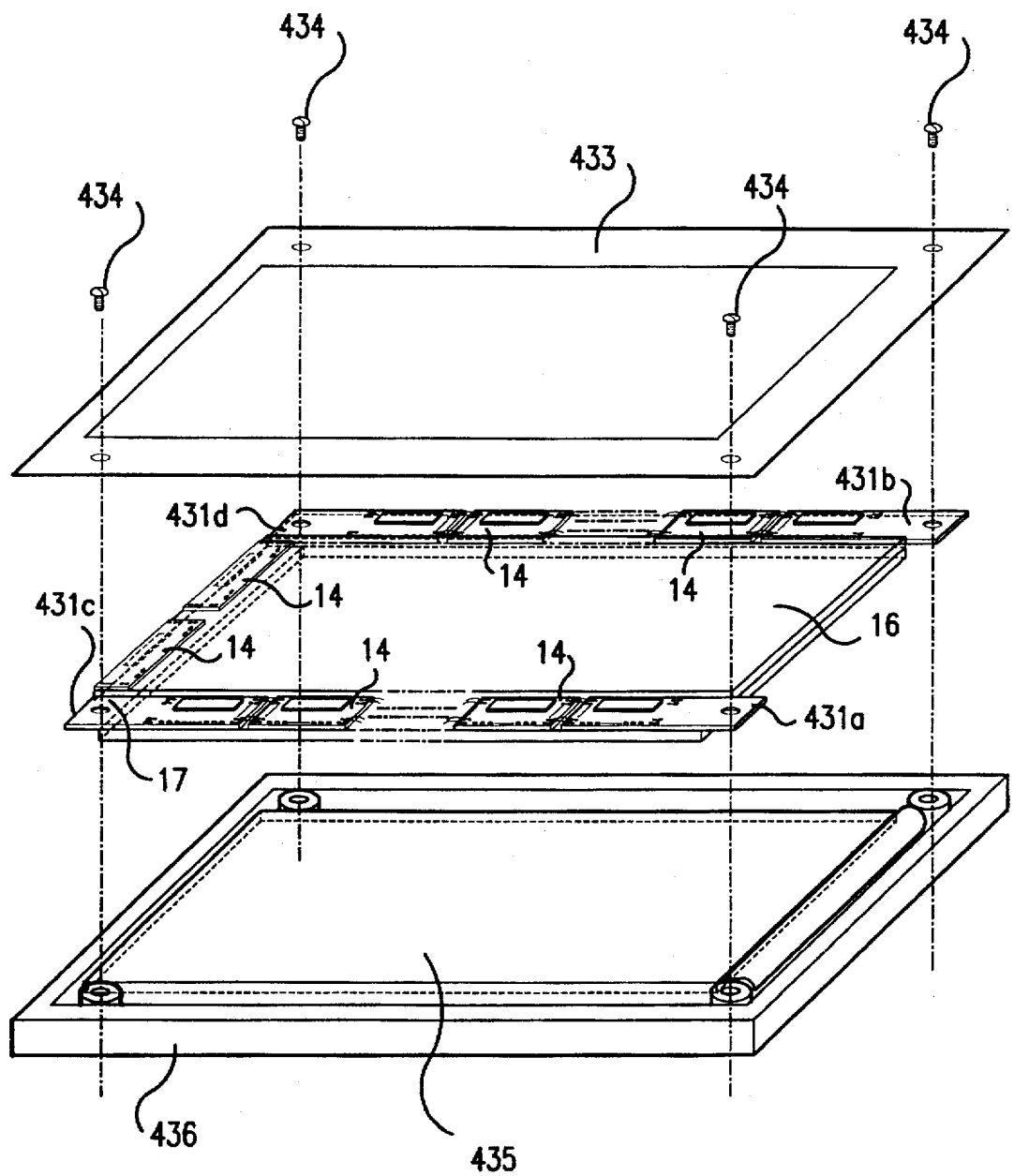
FIG. 78 is an exploded view that illustrates a fastening hole of a multi-layer substrate according to the forty-fourth embodiment of the present invention.

FIG. 78 illustrates the liquid crystal display apparatus making use of multi-layer substrates 14 and 431a to 431d shown in FIGS. 76 and 77, respectively. The multi-layer substrates 14 and 431a to 431d having the semiconductor chips 4 for driving liquid crystal mounted on the surfaces thereof are connected to a panel 16. The panel 16, a member formed by integrating a backlight unit 435 and an exterior decoration case 436 and an exterior decoration case 433 are, by fixing screws 434, fixed to the multi-layer substrates 431a to 431d by way of the fastening hole 432. As a result, the exterior decoration case of the liquid crystal display apparatus according to the present invention is able to also serve as the exterior case of a PC (Personal Computer) or the like. Therefore, the elements, such as the frame and the metal frame and the like that have been required for the conventional liquid crystal display apparatus as individual elements, can be omitted. As a result, the cost of the elements can be reduced. Further, the number of assembling processes can be simplified and the number of machining processes can be decreased.

Although the multi-layer substrates 14 and 431a to 431d and the panel terminal 18 are, similar to first embodiment, connected to one another by an adhesive member 19 and bonded and reinforced by a mold 21, the mold 21 may be provided for the side surfaces or the reverse surfaces of the panel 16 and the multi-layer substrates 14 and 431a to 431d in order to improve the strength (strength against vibrations) realized after the foregoing elements have been assembled into the frame. The mold 21 is made of a material selected from a group consisting of epoxy, acrylic, urethane and polyester compound or mixtures thereof as a solvent, a photo-setting type material or as a thermo-setting type material.

Since the positional accuracy between the pattern of the multi-layer substrate and the fastening cut portion 432 can be made to be ±0.1 mm or less, the positional accuracy between the panel pattern and the fastening hole can be maintained at ±0.2 mm or less. Since the foregoing fastening hole is used to assemble the elements to the exterior decoration case 436, the position reproducibility with respect to the backlight unit 435 and that of the exterior decoration case 433 with respect to a panel display can be maintained and improved. Further, the elements can be reworked and reassembled easily if the fastening screw 434 is used to assemble the elements. If a plastic, rivet-like element having a flange is used, assembling and fixing can be performed by simply pushing the rivet-like element into place. Therefore, assembling can be performed easily. The backlight 435 and the exterior decoration case 436 also may be fixed by a method using a double-coated tape or a fastening claw.

Forty-Fifth Embodiment

Figure 79:
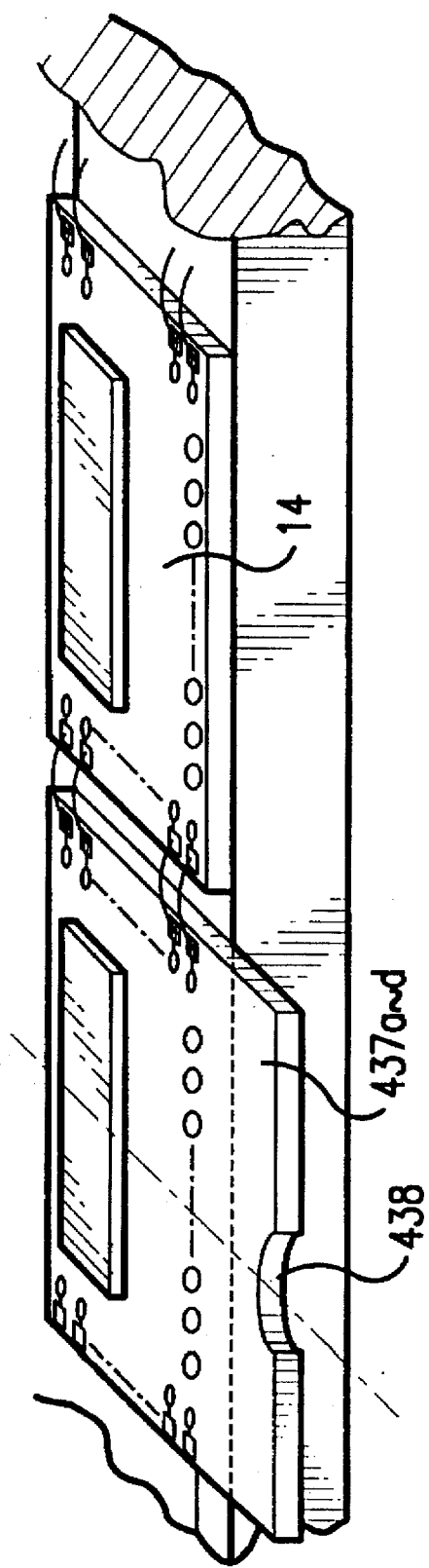
FIG. 79 is a perspective view which illustrates another-shape fastening hole of a multi-layer substrate according to a forty-fifth embodiment of the present invention.

Another embodiment of the present invention will now be described with reference to FIGS. 79, 80 and 81. As shown in FIGS. 79 and 81, the sizes of the multi-layer substrates 437a to 437d are designed to extend beyond the end surface of the panel 16 so that the fastening cut portion projects over the end surface of the panel 16. Although the material and the structure of the multi-layer substrate are the same as those of the multi-layer substrate according to first embodiment, the portion 438 is formed, and is useful for fastening. Although the portion 438 is formed into a semi-circular shape in this embodiment, it may be formed into a partial or full rectangle, square, rhomboid, ellipse or an elongated hole. If the fastening portion 438 is disposed at the central portion of the multi-layer substrates 437a to 437d to form the shape to be laterally symmetrical with respect to the central line in the direction of the longitudinal side of the multi-layer substrate, the standardization of the elements can be realized such that four different elements can be replaced by four similar elements.

Figure 80:
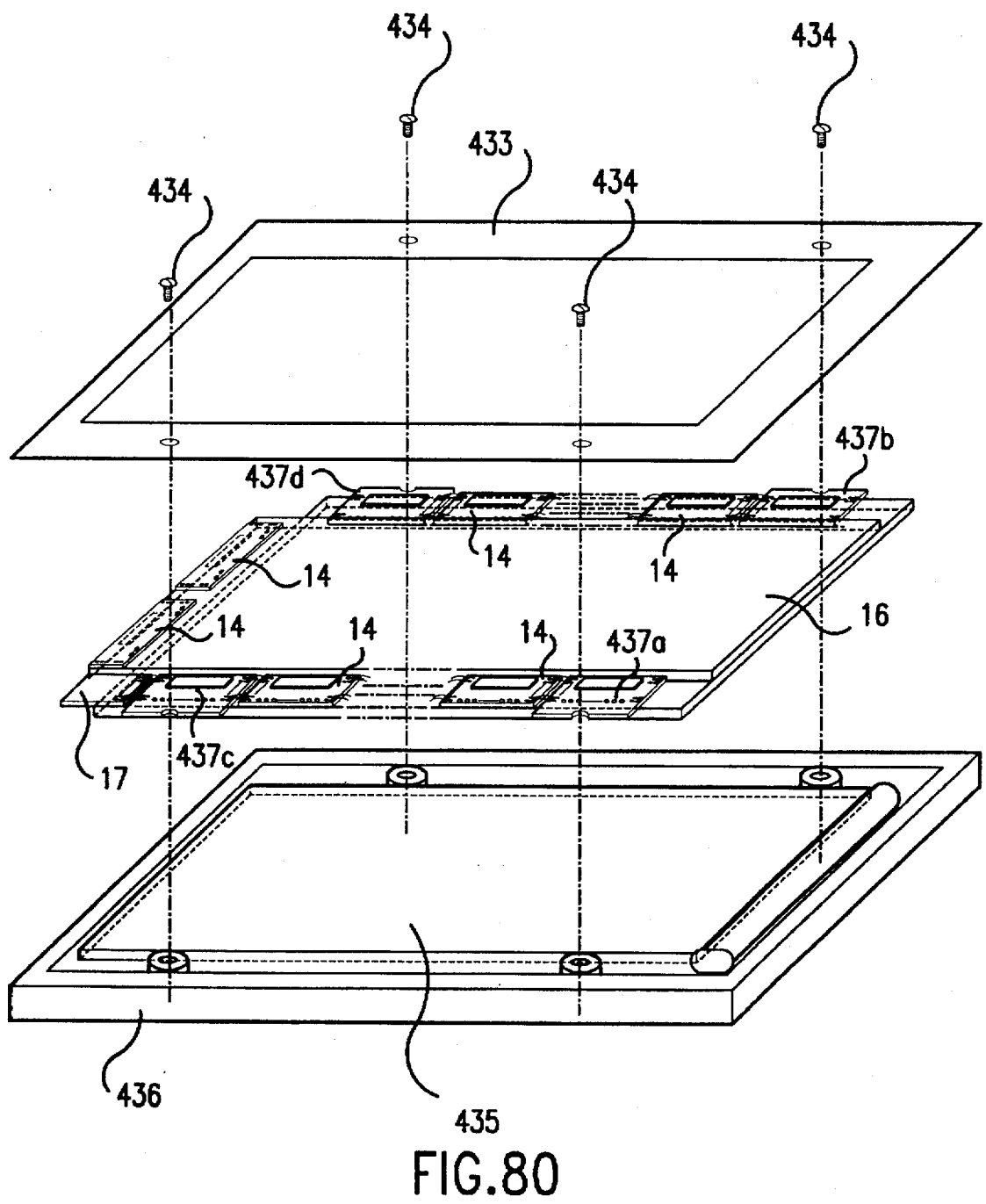
FIG. 80 is an exploded view which illustrates a liquid crystal display apparatus according to the forty-fifth embodiment of the present invention.
Figure 81:
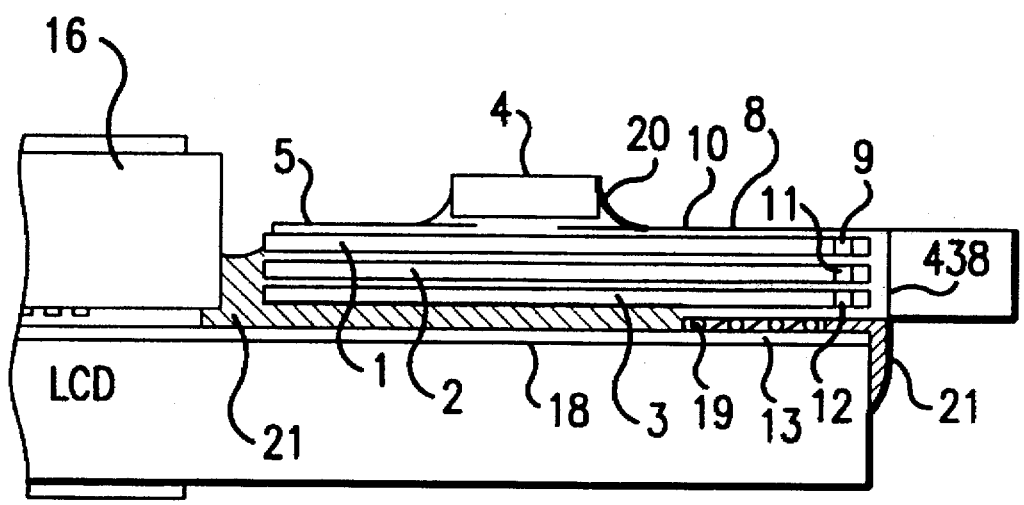
FIG. 81 is a cross sectional view which illustrates a liquid crystal display apparatus according to the forty-fifth embodiment of the present invention.

FIG. 80 illustrates a liquid crystal display apparatus according to the present invention that makes use of the multi-layer substrates 437a to 437d shown in FIG. 79. The multi-layer substrates 14 and 437a to 437d having the semiconductor chips 4 for driving liquid crystal mounted on the surfaces thereof are connected to a panel 16. The panel 16, a member formed by integrating a backlight unit 435 and an exterior decoration case 436 and an exterior decoration case 433 are, by fixing screws 434, fixed to the multi-layer substrates 437a to 437d by way of the fastening portions 438. As a result, the exterior decoration case of the liquid crystal display apparatus according to the present invention is able to also serve as the exterior case of a PC (Personal Computer) or the like. Therefore, the elements, such as the frame and the metal frame and the like that have been required for the conventional liquid crystal display apparatus as individual elements, can be omitted. Further, the standardization of the elements can be realized by forming the fastening portions 438 of the multi-layer substrates 437a to 437d to be in a uniform shape. As a result, the cost of the elements can be reduced. Further, the assembling processes can be simplified and the number of machining processes can be decreased because the number of elements can be decreased.

FIG. 81 illustrates the cross section of a portion in which the multi-layer substrates 437a to 437d of the liquid crystal display apparatus according to the present invention are connected. Although the multi-layer substrates 14 and 437a to 437d and the panel terminal 18 are bonded and reinforced by an adhesive member 19 and a mold 21, the mold 21 may be provided for the end surface of the panel terminal 18 and the side surfaces or the reverse surfaces of the multi-layer substrates 14 and 437a to 437d in order to improve the strength (strength against vibrations) realized after the foregoing elements have been assembled into the frame. The mold is made of a material selected from a group consisting of epoxy, acrylic, urethane and polyester compound or a solvent containing a mixture thereof, or a photo-setting mixture thereof.

Since the positional accuracy between the pattern of the multi-layer substrate and the fastening portion can be made to be ±0.1 mm or less, the positional accuracy between the panel pattern and the fastening portion can be maintained at ±0.2 mm or less. Since the foregoing fastening hole is used to assemble the elements to the exterior decoration case 436, the position reproducibility with respect to the backlight unit 435 and that of the exterior decoration case 433 with respect to a panel display can be maintained and improved. Further, the elements can be reworked and reassembled easily if the fastening screw 434 is used to assemble the elements. If a plastic, rivet-like element having a flange is used, assembling and fixing can be performed by simply pushing the rivet-like element into place. Therefore, assembling can be performed easily. The backlight 435 and the exterior decoration case 436 also may be fixed by a method using a double-coated tape or a fastening claw.

Forty-Sixth Embodiment

An embodiment of the present invention will now be described with reference to FIGS. 82, 83, 84, 85, 86, 87, 88 and 89.

Figure 82:
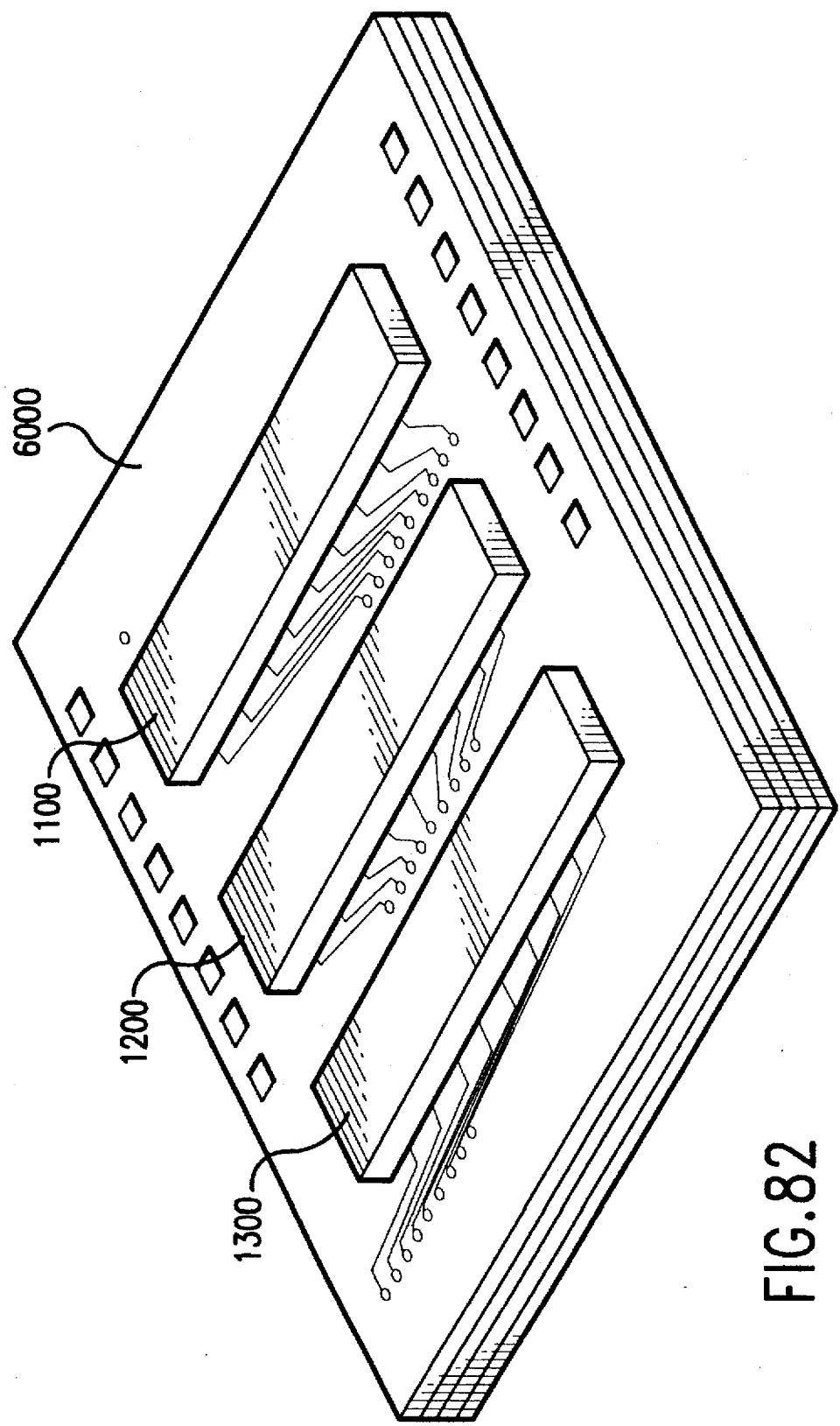
FIG. 82 is a perspective view which illustrates a multi-layer substrate according to a forty-sixth embodiment of the present invention.

FIG. 82 illustrates an embodiment of a multi-layer substrate 6000 of a liquid crystal display apparatus according to the present invention in which three semiconductor chips 1100, 1200, 1300 for driving liquid crystal are face-down-bonded on the surface of multi-layer substrate 6000.

Figure 83:
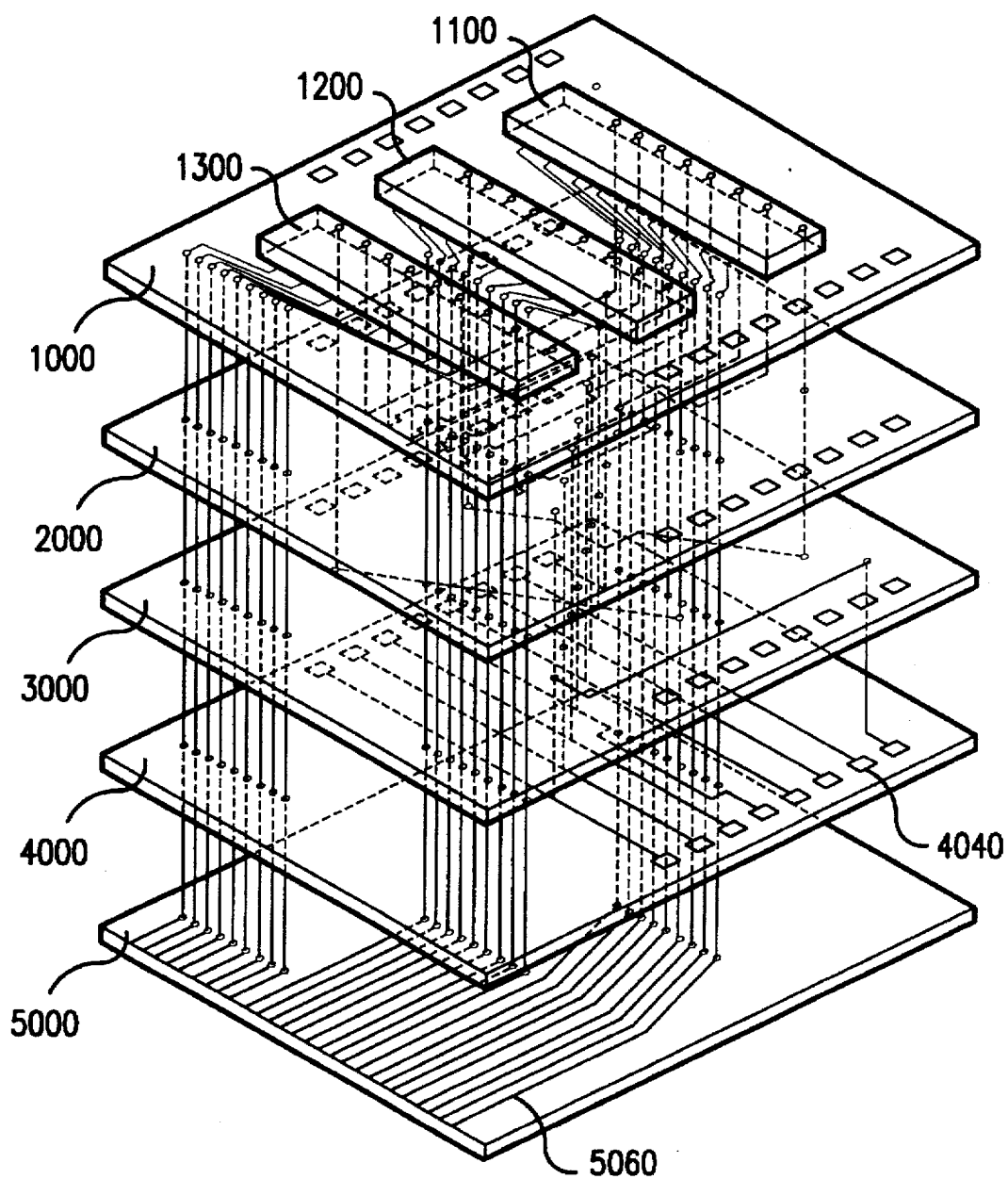
FIG. 83 is an exploded perspective view which illustrates a multi-layer substrate according to the forty-sixth embodiment of the present invention.

FIG. 83 is a perspective view which illustrates the multi-layer substrate 6000 shown in FIG. 82. Pad pitch P1 on the output side on each of semiconductor chips 1100, 1200 and 1300 is 80 µm and pitch P2 of a panel terminal is 50 µm, where a relationship P1>P2 is held. The foregoing panel terminal pitch P2=50 µm is a fine connection pitch required for a 6-inch class VGA-color liquid crystal display apparatus.

Reference numerals 1000, 2000, 3000, 4000 and 5000 represent layers of the multi-layer substrate 6000 according to this embodiment. Reference numeral 1000 represents a first layer, 2000 represents a second layer, 3000 represents a third layer, 4000 represents a fourth layer and 5000 represents a fifth layer. The semiconductor chips 1100, 1200 and 1300 are face-down-bonded on the surface of the first layer 1000 by a known method (for example, a method in which the Au bumps of the semiconductor are connected to the substrate by making use of Ag paste, or a method making use of an anisotropic conductive film or a flip-chip method making use of soldering bumps). After bonding has been performed, molds 20 (omitted from illustration) are applied to the peripheries of the semiconductor chips 1100, 1200 and 1300 and the spaces among the semiconductor chips 1100, 1200 and 1300 and the surface of the first layer 1000 for the purpose of preventing corrosion and reinforcing the elements. The molds are made of material selected from a group consisting of epoxy, acrylic, urethane and polyester compound or a solvent containing mixtures thereof, or a photo-setting mixture thereof.

Figure 84:
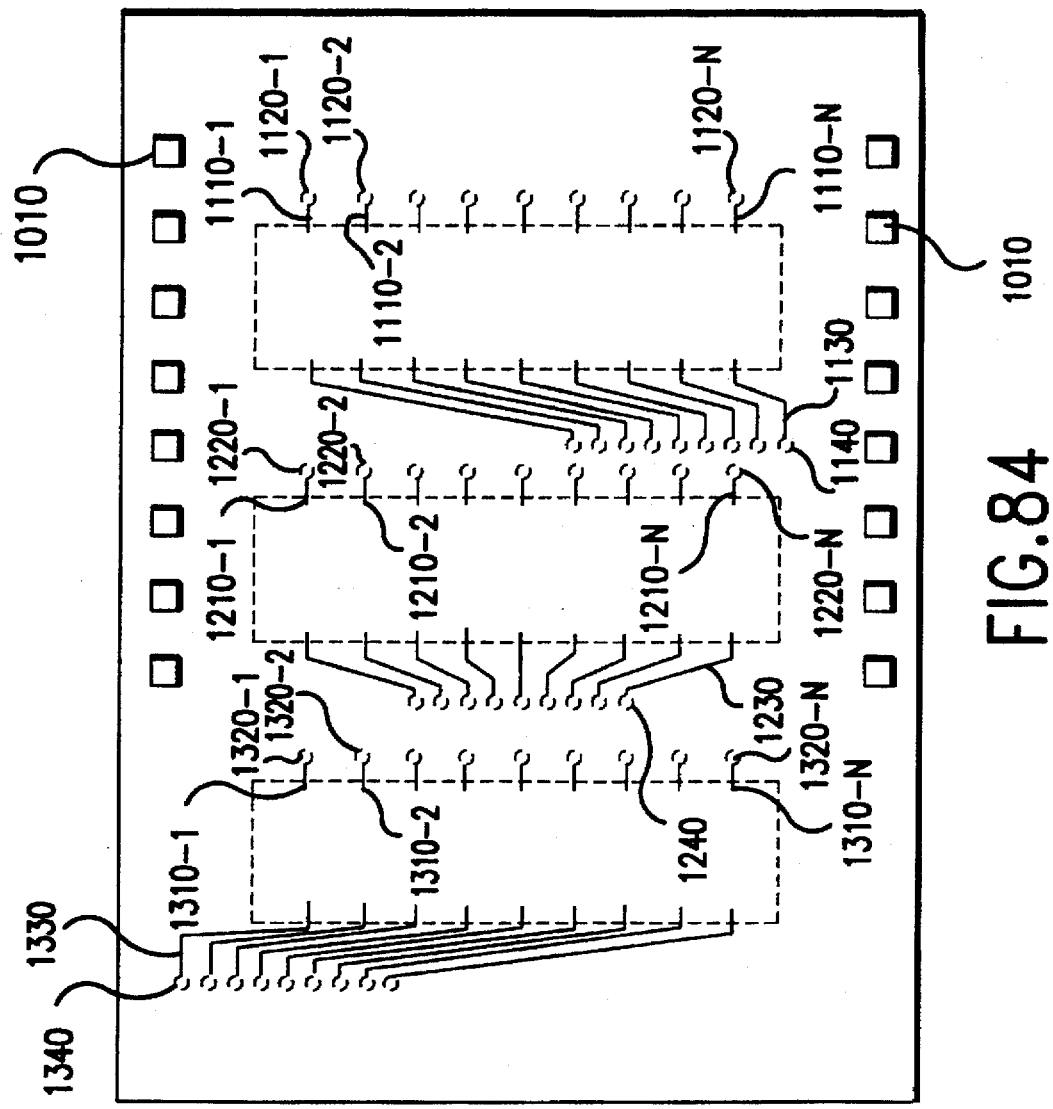
FIG. 84 is a plan view that illustrates a first layer of the multi-layer substrate according to the forty-sixth embodiment of the present invention.

FIG. 84 is a plan view which illustrates circuit lines, through holes and penetrating holes of the first layer 1000.

Figure 85:
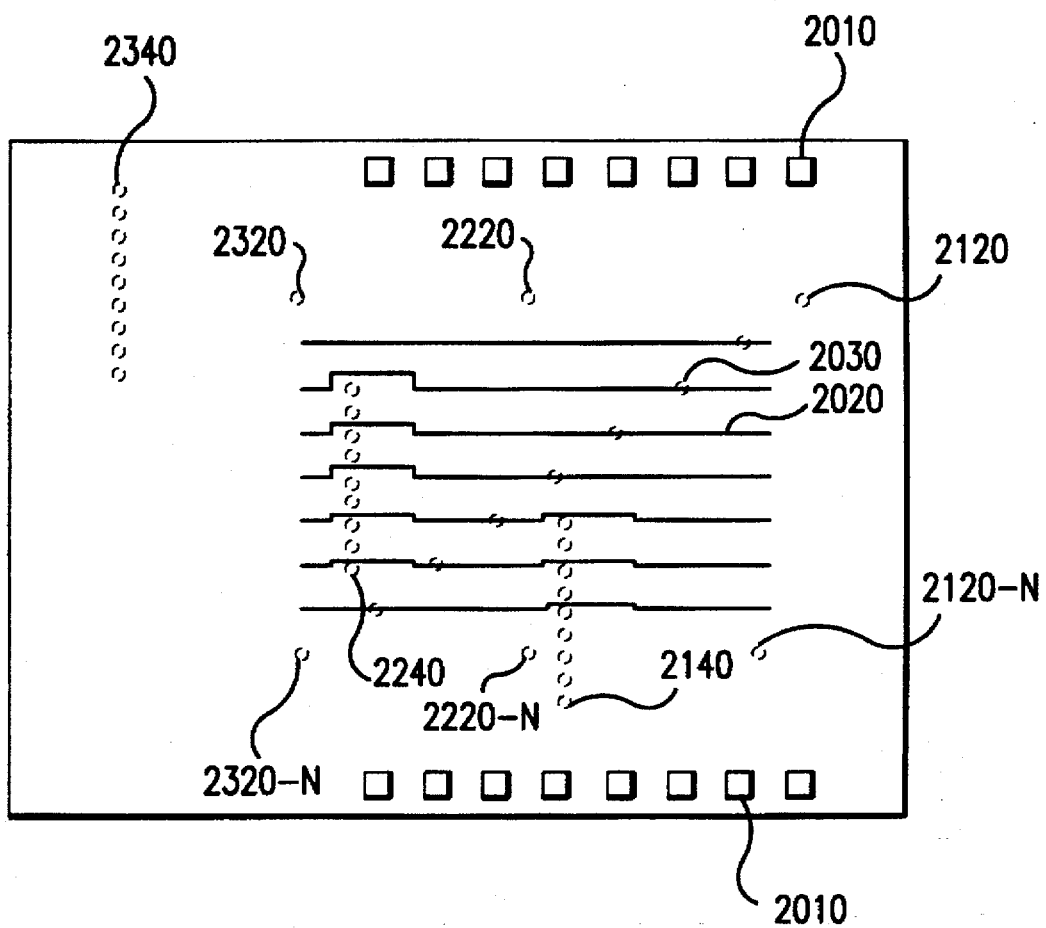
FIG. 85 is a plan view that illustrates a second layer of the multi-layer substrate according to the forty-sixth embodiment of the present invention.

FIG. 85 is a plan view which illustrates circuit lines, through holes and penetrating holes of the second layer 2000.

Figure 86:
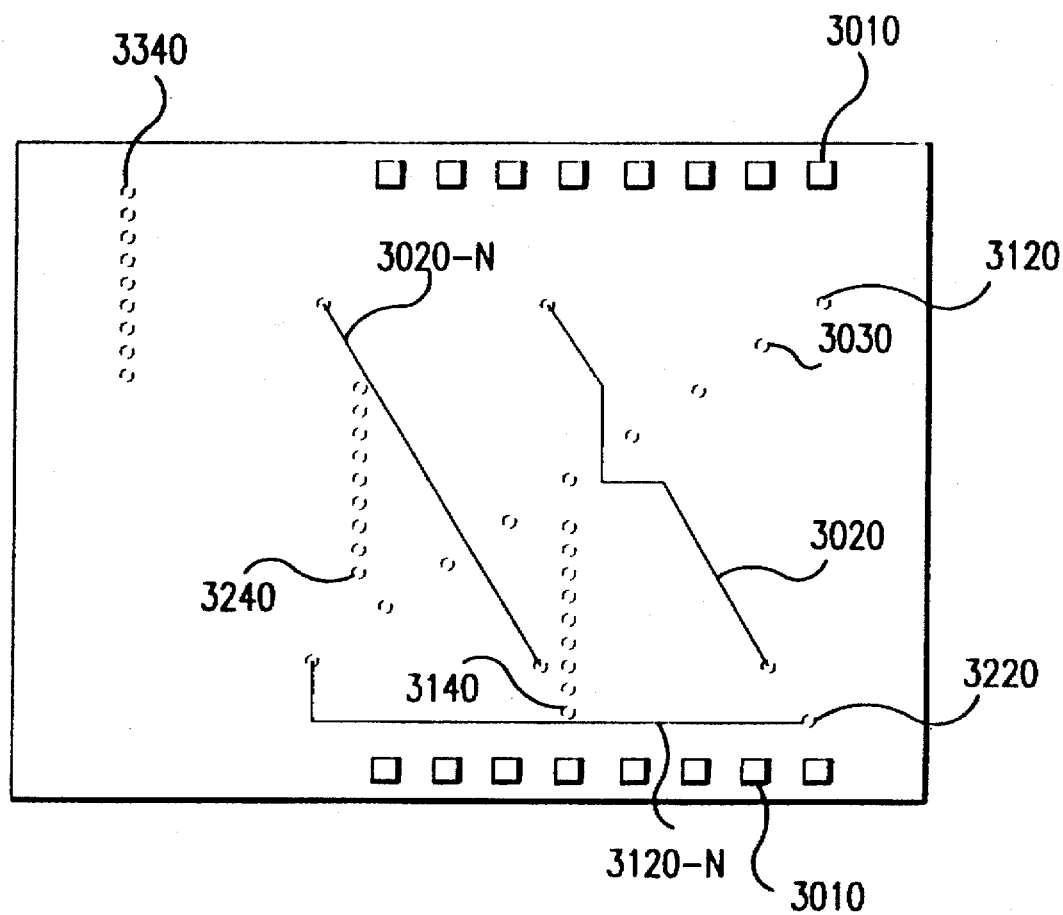
FIG. 86 is a plan view that illustrates a third layer of the multi-layer substrate according to the forty-sixth embodiment of the present invention.

FIG. 86 is a plan view which illustrates circuit lines, through holes and penetrating holes of the third layer 3000.

Figure 87:
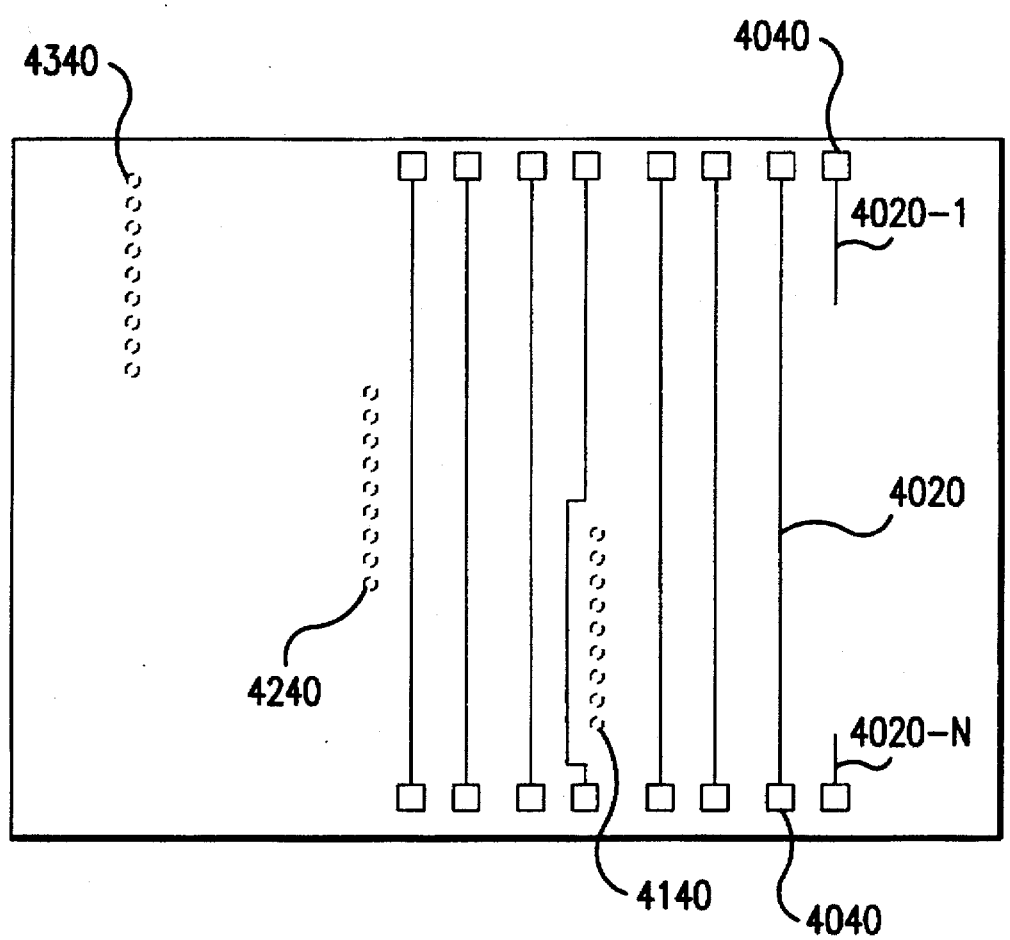
FIG. 87 is a plan view that illustrates a fourth layer of the multi-layer substrate according to the forty-sixth embodiment of the present invention.

FIG. 87 is a plan view which illustrates circuit lines, through holes and lands of the fourth layer 4000.

Figure 88:
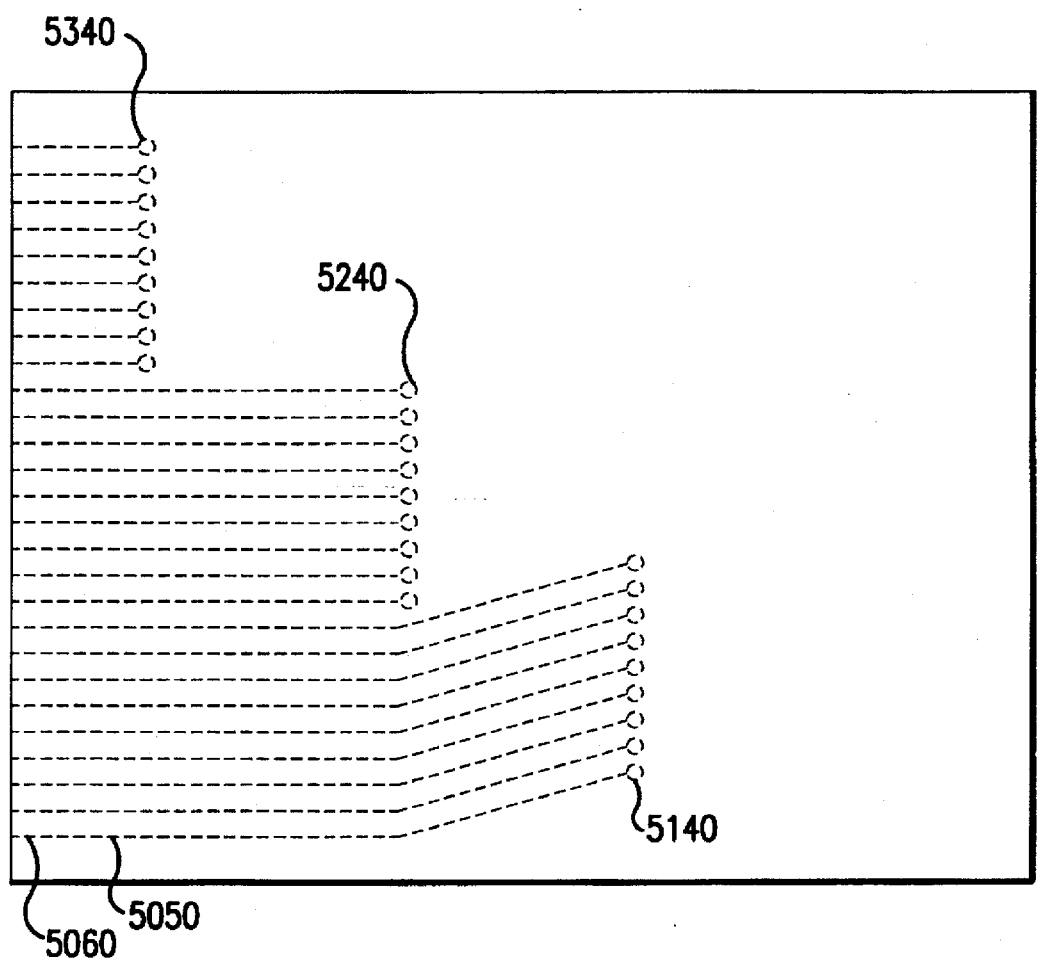
FIG. 88 is a plan view that illustrates a fifth layer of the multi-layer substrate according to the forty-sixth embodiment of the present invention.

FIG. 88 is a plan view which illustrates circuit lines, through holes and connection terminals of the fifth layer 5000.

On the surface of the first layer 1000, input lines 1110, 1210 and 1310 corresponding to input pads of chips 1100, 1200 and 1300 are formed by patterning. Further, the input lines 1110, 1210 and 1310 (but not input lines 1110-1, 1110-N, 1210-1, 1210-N, 1310-1 and 1310-N) are connected to a bus line 2020 of the second layer 2000 by way of their through holes 1120, 1220 and 1320. In addition, the bus line 2020 of the second layer 2000 is connected to a bus line 4020 of the fourth layer 4000 by way of a through hole 2030 of the second layer 2000 and a through hole 3030 of the third layer 3000. Since the input lines 1110-1, 1110-N, 1210-1, 1210-N, 1310-1 and 1310-N are cascade-connected, they are wired in a manner different from the manner for wiring the other lines. That is, the input line 1110-1 of the semiconductor chip 1100 is connected to a line 4020-1 via a through hole 1120-1 of the first layer 1000 and a through hole 2120 of the second layer 2000 and a through hole 3120 of the third layer 3000. The input line 1110-N of chip 1100 is connected to line 3020 of third layer 3000 via a through hole 1120-N of layer 1000 and through hole 2120-N of layer 2000. The input line 1210-1 of the semiconductor chip 1200 also is connected to a line 3020 of the third layer 3000 via a through hole 1220-1 of the first layer 1000 and a through hole 2220 of the second layer 2000. The input line 1210-N is connected to a line 3020-N of the third layer 3000 via a through hole 1220-N of the first layer 1000 and a through hole 2220-N of the second layer 2000. The input line 1310-1 of the semiconductor chip 1300 is connected to a line 3020-N via a through hole 1320-1 of the first layer 1000 and a through hole 2320 of the second layer 2000. The input line 1310-N of the semiconductor chip 1300 is connected to a line 3120-N of the third layer 3000 via a through hole 1320-N of the first layer 1000 and a through hole 2320-N of the second layer 2000. Further, the line 3020-N is connected to a line 4020-N of the fourth layer 4000 via a through hole 3220 of the third layer 3000. The lines 4020, 4020-1, 4020-N, etc. have lands 4040 for establishing a wire bonding connection with another multi-layer substrate. Through holes 1010, 2010 and 3010 are formed in the first, second and third layers 1000, 2000 and 3000 to correspond to the land 4040 so that wire bonding is facilitated.

The first layer 1000 has, on the surface thereof, output lines 1130, 1230 and 1330 corresponding to the output pads of the semiconductor chips 1100, 1200 and 1300 and formed by patterning, the output lines 1130, 1230 and 1330 being connected to lines 5050 and a connection terminal 5060 via through holes 1140, 1240 and 1340 of the first layer 1000, through holes 2140, 2240 and 2340 of the second layer 2000, through holes 3140, 3240 and 3340 of the third layer 3000 and through holes 4140, 4240 and 4340 of the fourth layer 4000 and through holes 5140, 5240 and 5340 of the fifth layer 5000. Since the pitch of the terminals of the panel is smaller than the pitch of the output pads of the semiconductor chips 1100, 1200 and 1300, the wiring pattern is narrowed on the first layer 1000 to make the output pads correspond to the terminals of the panel. Although this embodiment is arranged so that the through holes 1140, 1240, 1340, 2140, 2240, 2340, 3140, 3240, 3340, 4140, 4240 and 4340 are disposed to form a line, they may be disposed to form a zigzag shape composed of plural lines. The alignment between the pitch of the output pads and the pitch of the terminals of the panel may be performed over a plurality of layers.

The first, second, third, fourth and fifth layers 1000, 2000, 3000, 4000 and 5000 are ceramic substrates made by simultaneously sintering alumina substrates at a low temperature and each having a thickness of 0.25 mm. The input lines 1110, 1210, 1310, 1110-1, 1210-1, 1310-1, 1110-N, 1210-N, 1310-N, the output lines 1130, 1230 and 1330 and the lines 2020, 3020, 4020 and 5050, etc. are made of material obtained by sintering metal paste such as Au, Ag, AgPd or Cu. Also the through holes 1120, 1220, 1320, 1120-1, 1220-1, 1320-1, 1120-N, 1220-N, 1320-N, 1140, 1240, 1340, 2030, 2120, 2220, 2320, 2340, 3030, 3120, 3140, 3240, 3340, 4140, 4240, 4340, 5140, 5240 and 5340 are made of material obtained by sintering metal paste, such as Au, Ag, AgPd or Cu. The foregoing elements are formed by patterning by a known printing method for each layer, followed by stacking the layers and by sintering them to be formed into an integrated shape. The thickness of the metal subjected to patterning and sintering is usually about 0.001 mm to about 0.05 mm, the thickness being permitted to be about 0.05 mm to about 0.2 mm in order to reduce the resistance value.

Depending upon the pitch of wiring and the dimension accuracy, the input lines 1110, 1210, 1310, 1110-1, 1210-1, 1310-1, 1110-N, 1210-N, 1310-N and the output lines 1130, 1230 and 1330 on the surface of the first layer 1000 and the line 5050 and the connection terminal 5060 on the reverse side of the fifth layer 5000 may be formed by printing metal paste, such as Au, Ag, AgPd or Cu, onto the entire surface of the first layer 1000 (or the reverse surface of layer 5000) followed by photolithographic patterning. The thickness of the pattern thus-formed is about 0.001 mm to about 0.2 mm. The pattern may be formed by photolithography or plating after a thin film has been formed by evaporating or sputtering Au, Ag or Cu. The thickness of the pattern thus-formed may be about 0.0005 mm to about 0.1 mm.

Although the multi-layer substrate according to this embodiment is composed of the five layers, the number of layers may be determined arbitrarily. Further, one or more ground layers may be formed at an intermediate position in order to eliminate noise or prevent static electricity.

In the foregoing case where the relationship P1>P2 is held such that the pad pitch P1 on the outside of the semiconductor chip for driving liquid crystal is 80 μm and the connection pitch P2 of the panel terminals is 50 μm, the problems experienced with the conventional example, in which a plurality of semiconductor chips for driving liquid crystal are mounted on a liquid crystal display apparatus by TCPs, can be overcome, the problems being problems raised in that the adjacent TCPs undesirably overlap or the substrate having the bus line cannot easily be connected to the input terminal. However, use of the multi-layer substrate according to this embodiment prevents the overlap of the adjacent multi-layer substrates. Therefore, the semiconductor chips for driving liquid crystal can be mounted on a small area. As a result, a liquid crystal display apparatus can be provided which exhibits a large capacity (the VGA or XGA specification), reduced weight, small thickness and small size can be provided to serve as a display apparatus for small-size PDA (Personal Digital Assistants) information terminal equipment which is expected to be widely used in the future.

Further, the structure in which the three semiconductor chips for driving liquid crystal on one multi-layer substrate enables the input and output lines to be wired efficiently as compared with a structure comprising three multi-layer substrates on each of which one semiconductor chip for driving liquid crystal is mounted. In addition, the semiconductor chips can be disposed efficiently, resulting in that the area required for the multi-layer substrates can be decreased and the element cost can be reduced. Moreover, the process for separating (dicing or breaking) the multi-layer substrate and the process for setting and resetting the multi-layer substrate for bonding and molding can be reduced. As a result, the cost can be reduced, resulting in that a low-cost liquid crystal display apparatus can be provided.

Figure 89:
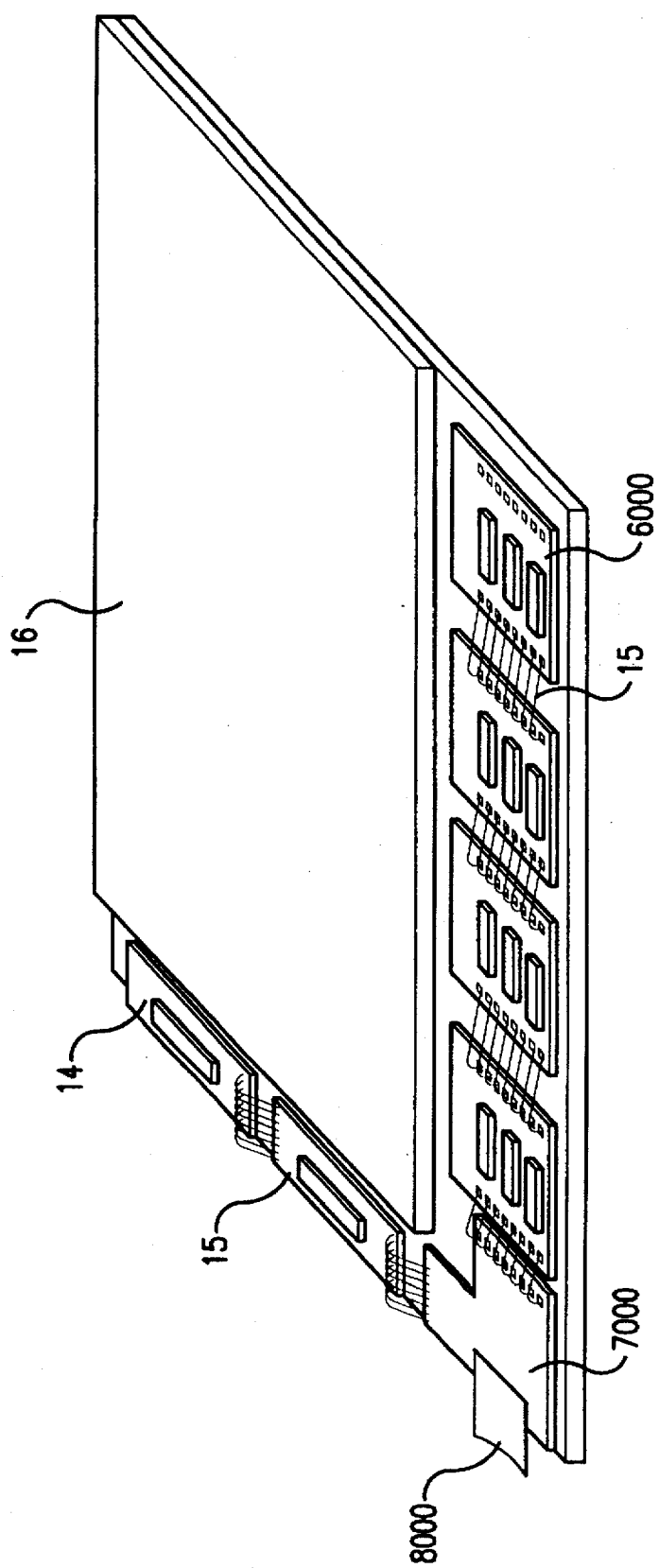
FIG. 89 is a perspective view that illustrates a liquid crystal display apparatus according to the forty-sixth embodiment of the present invention.
Figure 90:
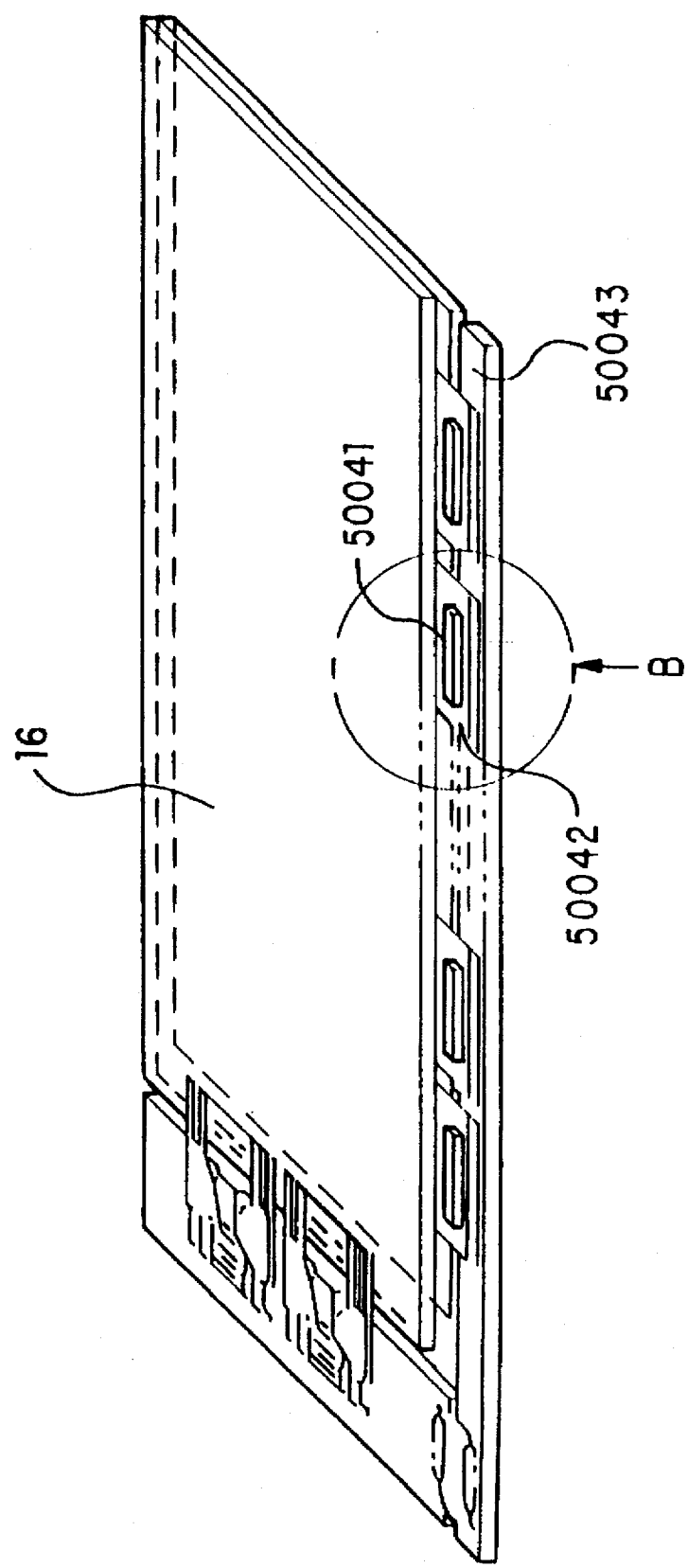
FIG. 90 is a perspective view which illustrates a conventional liquid crystal display apparatus.
Figure 91:
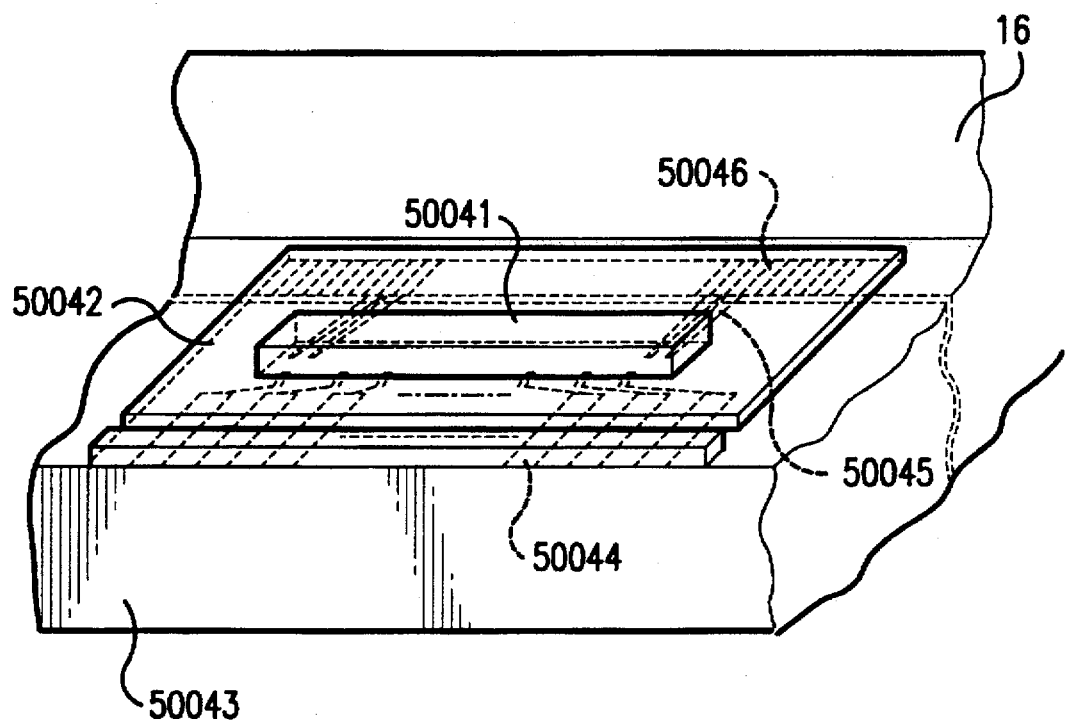
FIG. 91 illustrates a portion of the conventional liquid crystal display apparatus.
Figure 92:
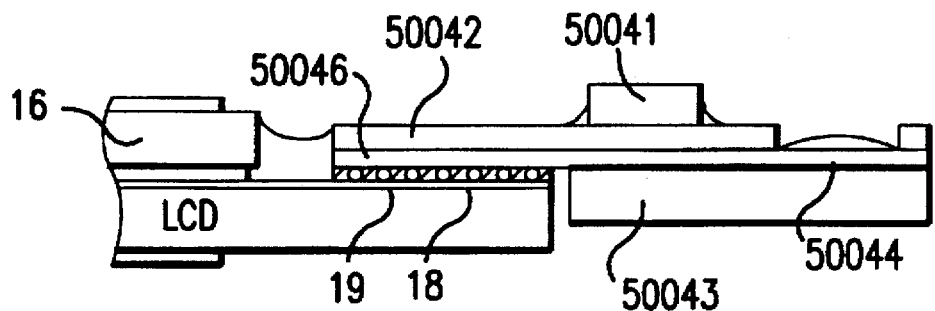
FIG. 92 is a cross sectional view which illustrates portion of the conventional liquid crystal display apparatus.
Figure 93:
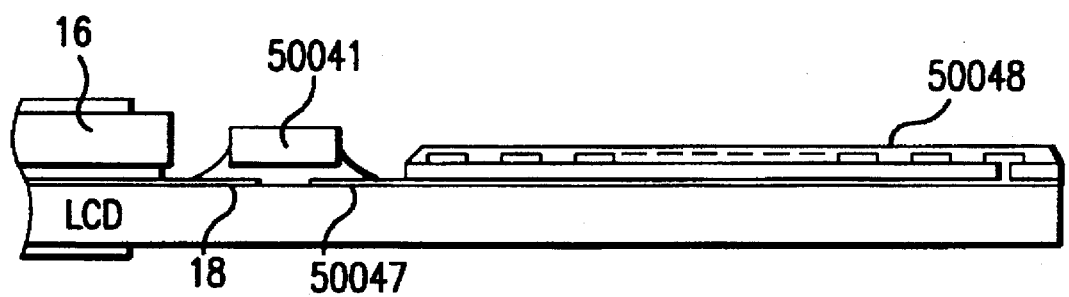
FIG. 93 is a cross sectional view which illustrates a portion of another conventional liquid crystal display apparatus.
Figure 94:
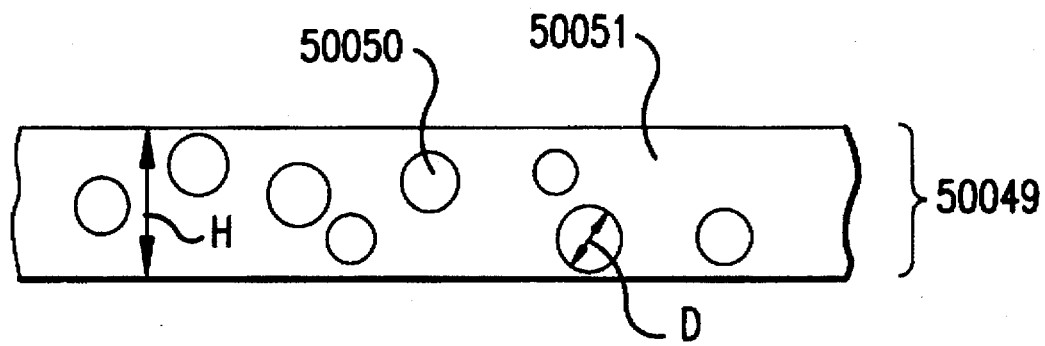
FIG. 94 is a cross sectional view which illustrates a conventional anisotropic conductive film.
Figure 95:
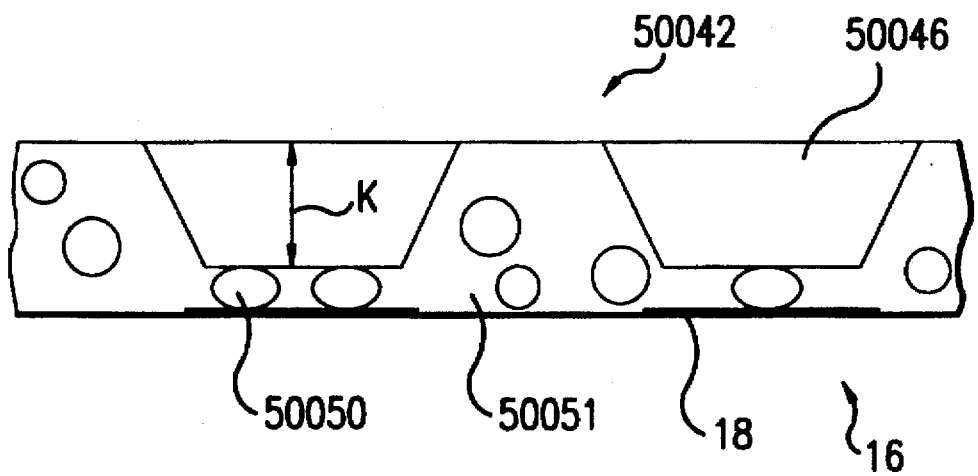
FIG. 95 is a cross sectional view which illustrates a portion of a connection portion of the conventional anisotropic conductive film.
Figure 96:
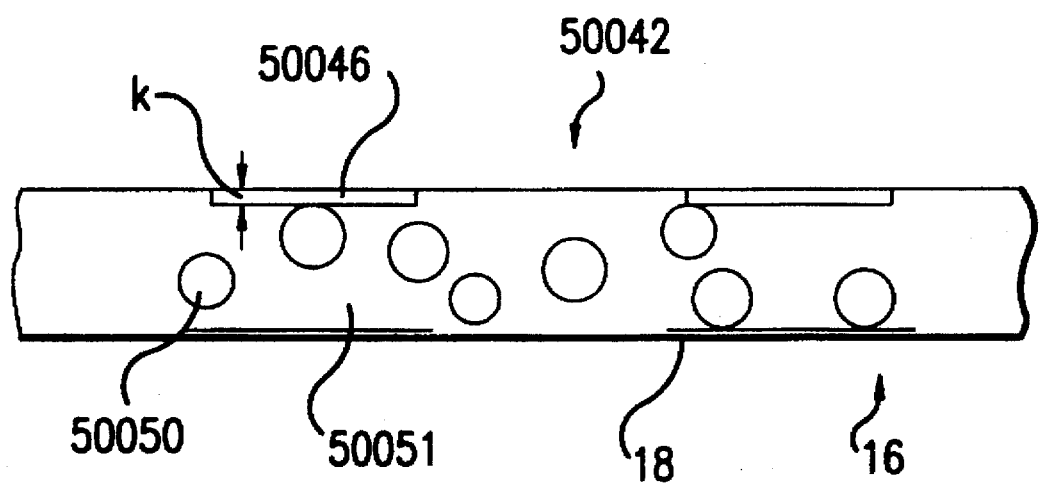
FIG. 96 is a. cross sectional view which illustrates a portion of a connection portion of the conventional anisotropic conductive film.
Figure 97:
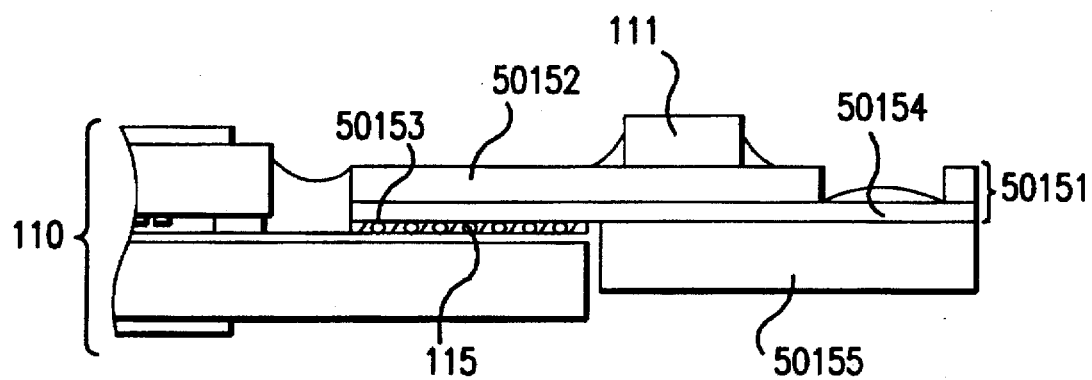
FIG. 97 is a cross sectional view which illustrates a conventional structure for mounting a semiconductor device and a state where it is mounted on a display device.
Figure 98:
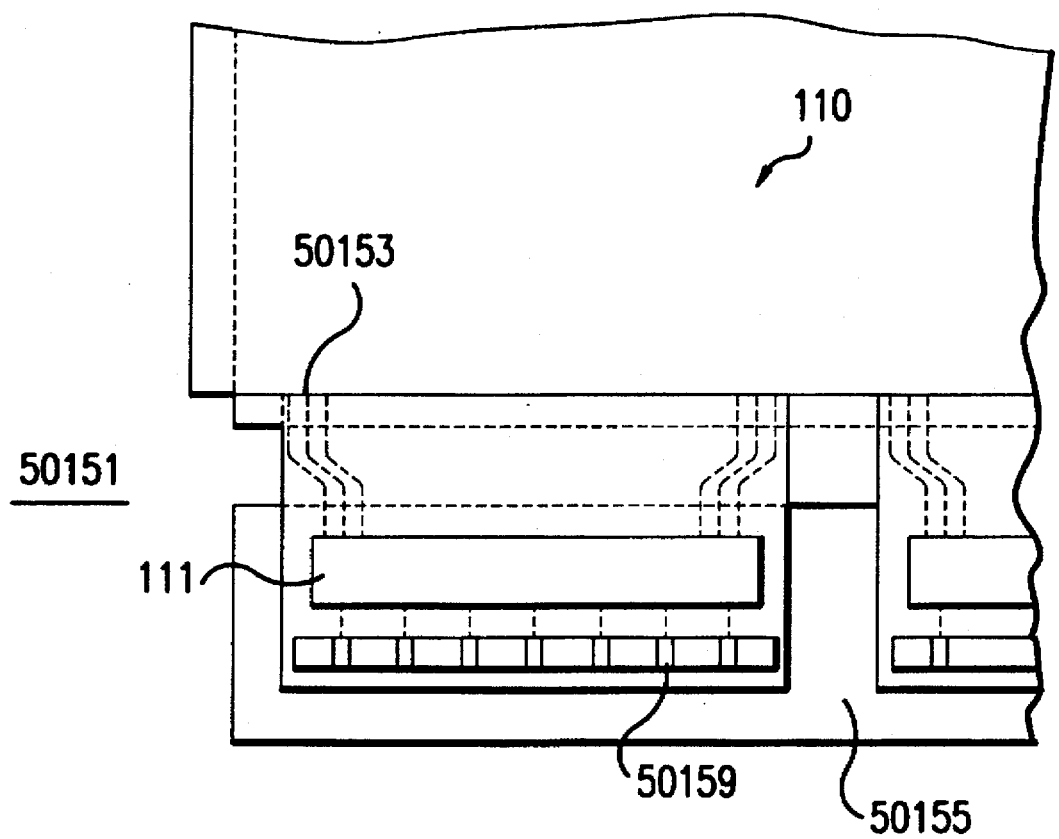
FIG. 98 is a cross sectional view which illustrates a conventional structure for mounting a semiconductor device and a state where it is mounted on a display device.
Figure 99:
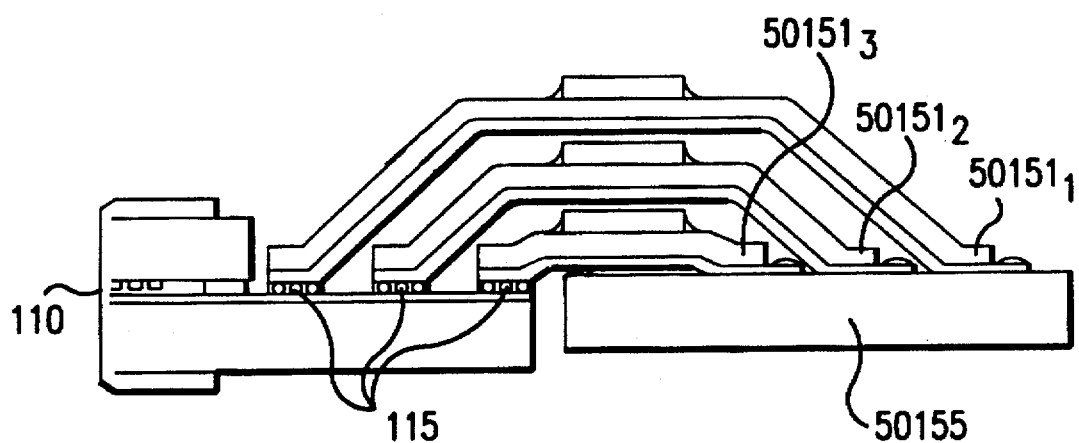
FIG. 99 is a cross sectional view which illustrates another conventional structure for mounting a semiconductor device and a state where it is mounted on a display device.

FIG. 89 illustrates an embodiment in which the multi-layer substrate according to the embodiment shown in FIG. 82 is connected to a liquid crystal display panel. In this embodiment, the color liquid crystal display-type panel 16 (for example, 640×3×480 dot display) has four multi-layer substrates 6000 (on which three 160-output-semiconductor chips for driving liquid crystal are mounted) disposed on the side X and two multi-layer substrates 14 (on which one 240-output-semiconductor chip for driving liquid crystal is mounted) disposed on the side Y such that the substrates are connected to a panel terminal 18. In FIG. 89, the panel lines and the lines on the multi-layer substrate are omitted. Connection terminals 13 and 5060 of the multi-layer substrates 14 and 6000 and the panel terminal 18 are connected to one another by a connection member 19 similarly to first embodiment. Conductive member 19 establishes the electrical connection and somewhat secures the panel 16 to the multi-layer substrates 14 and 6000.

The connection member 19 for use in this embodiment is made of an anisotropic conductive film mainly composed of conductive particles and an adhesive agent. The conductive particles are composite metal particles of Ni, Au, Ag, Cu, Pb or Sn or mixtures thereof made by mixing, alloying or soldering, or particles made by plating Ni, Au, Cu or Fe or mixtures thereof on to plastic particles (polystyrene, polycarbonate or acryl) or carbon particles. The adhesive agent is solely styrene butadiene styrene (SBS), epoxy, acryl, polyester or urethane adhesive agent or mixtures or compounds thereof. If the anisotropic conductive film is disposed between the panel terminal 18 and the connection terminals 13 and 5060 of the multi-layer substrates 14 and 6000 and if the anisotropic conductive film is a thermo-hardening agent or a blended agent of a thermoplastic agent and a thermo-hardening agent, a heating and pressurizing head is abutted against the multi-layer substrates 14 and 6000 so that the agent is hardened and connected. If the anisotropic conductive film is an ultraviolet hardening type adhesive, a pressurizing head is abutted against the multi-layer substrates 14 and 6000 and ultraviolet rays are applied to the anisotropic conductive film from a position adjacent to the panel terminal 18 (adjacent to the glass) to harden the ultraviolet hardening type film.

A molding 21 (not shown in FIG. 89) can be provided to protect the exposed portion of the panel terminal 18. The molding 21 also serves to fix the multi-layer substrates 14 and 6000 to the panel. The molding 21 is made of solely epoxy, acryl, urethane or polyester material or mixtures or compounds thereof of any one of solvent type, thermo-hardening type, or light hardening type or mixtures thereof.

The bus lines between adjacent multi-layer substrates 14 and between the multi-layer substrates 6000 are connected by wire bonding with wires 15 via the lands 7 and 4040. The input lines on either side of the multi-layer substrates 14 and 6000 positioned at ends on the side X and side Y of the panel are wire-bonded to a relay substrate 7000 by the wires 15. Further, a connection member 8000 for receiving signals and electric power from outside is connected to the relay substrate 7000. The connection member 8000 has one or more wiring pattern layers (omitted from illustration) and may have electronic parts or the like. The wires 15 may be made of metal such as Au, Al or Cu or the like or their alloy (alloy containing Be, Si or Mg or the like included). In order to protect the wire-bonded portion and the wire portion and the like from corrosion to mechanically reinforce the same, the molds 21 (omitted from illustration) are similarly applied. The width of the wire-bonded portion is determined so as to be narrower than the width of the multi-layer substrate, resulting in that the wire-bonded portion can be mounted in a satisfactorily compact manner.

Since this embodiment is arranged so that three semiconductor chips for driving liquid crystal are bonded on to one multi-layer substrate, the number of connection portions required to connect the multi-layer substrates to one another can be reduced by eight (from 11 places to 3 places) as compared with a case where semiconductor chips for driving liquid crystal, each of which is bonded on to one multi-layer substrate, are connected to one another. As a result, the number of the wires 15 can be decreased and the number of wire bonding processes can be decreased.

As described above, use of the multi-layer substrate according to this embodiment enables the lines to be wired in the cross manner in the same multi-layer substrate as contrasted with the conventional TAB method using individual bus substrate to wire the bus lines in the cross manner. Therefore, the overall size can be reduced as compared with the TAB method by raising the density of the lines wired on the substrate. Further, the cost can be reduced because individual bus lines are not used.

Since the conventional COG method has the arrangement that the cross wiring of the bus lines is performed on the panel substrate, a wide area is required to wire the bus lines. Further, metal lines must be used to reduce the resistance value of the wired lines, resulting in an increase of the cost. However, use of the multi-layer substrate according to this embodiment enables the space required to wire the bus lines and the cost to be reduced as compared with the COG method.

In the case where the relationship P1>P2 is held such that the pad pitch P1 on the output side of the semiconductor chip for driving liquid crystal is 80 µm and the connection pitch P2 of the panel terminals is 50 µm, the overlap of the adjacent multi-layer substrates can be prevented and the semiconductor chips for driving liquid crystal can be mounted on a small area. As a result, a liquid crystal display apparatus can be provided which exhibits a large capacity (the VGA or XGA specification), reduced weight, small thickness and small size can be provided to serve as a display apparatus for small-size PDA (Personal Digital Assistants) information terminal equipment which is expected to be widely used in the future.

As described above, the present invention is arranged so that the input and output lines of the semiconductor device, the bus lines and the connection terminals are formed on the laminated substrate, and a plurality of semiconductor devices are mounted and connected to the electrodes of the display device. Therefore, the drive control circuit substrate can be omitted, and the number of the mutual connection lines for the semiconductor devices can be decreased. Therefore, the reliability can be improved and the size of the apparatus can be reduced. Further, semiconductor device outputs are supplied for corresponding colors so that an effect can be obtained in that the quality of display can be improved.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A liquid crystal display apparatus comprising:
   a panel containing a liquid crystal and a panel terminal for receiving driving signals for driving the liquid crystal;
   a semiconductor chip for driving said liquid crystal of said liquid crystal display apparatus;
   a multi-layer substrate having said semiconductor chip mounted thereon, said multilayer substrate including a first layer having an input line pattern coupled to said semiconductor chip and an output line pattern coupled to said semiconductor chip, a second layer, and at least one intermediate layer located between said first layer and said second layer;
   said at least one intermediate layer having a portion of at least one of said input lines and said output lines as a circuit pattern located on a surface thereof, at least said first layer and said at least one intermediate layer having through holes through which the lines thereon are connected to one another and to said panel terminal.

2. A liquid crystal display apparatus according to claim 1, wherein contacts of said semiconductor chip are bonded directly to said input line pattern and to said output line pattern of said first layer of said multi-layer substrate.

3. A liquid crystal display apparatus according to claim 1, wherein said multi-layer substrate includes an output terminal, and further comprising an anisotropic conductive film connecting said output terminal to said panel terminal.

4. A liquid crystal display apparatus according to claim 1, wherein a plurality of said multi-layer substrates, each having at least one of said semiconductor chips mounted thereon, are attached to said panel, the plurality of said multi-layer substrates are electrically coupled to a plurality of said panel terminals on said panel, and the plurality of said multi-layer substrates are electrically connected to each other by conductive connection means.

5. A liquid crystal display apparatus according to claim 4, wherein said conductive connection means are heat seal connections.

6. A liquid crystal display apparatus according to claim 4, wherein said conductive connection means are flexible substrate connections.

7. A liquid crystal display apparatus according to claim 4, wherein said conductive connection means are conductive lines on said panel.

8. A liquid crystal display apparatus according to claim 7, wherein said conductive lines on said panel are disposed on a portion of said panel containing said panel terminals.

9. A liquid crystal display apparatus according to claim 7, wherein said conductive lines on said panel include conductive terminals connected to said input lines of said multi-layer substrate, said conductive terminals extending in a common line with said panel terminals.

10. A liquid crystal display apparatus according to claim 9, wherein an anisotropic conductive film connects said input lines to said conductive terminals and connects output terminals of said multi-layer substrate to said panel terminals.

11. A liquid crystal display apparatus according to claim 7, wherein an anisotropic conductive film connects said conductive lines on said panel to said plurality of multi-layer substrates.

12. A liquid crystal display apparatus according to claim 1, wherein a plurality of said semiconductor chips are mounted on said multi-layer substrate.

13. A circuit substrate comprising:
   a multi-layer substrate including:
   a first layer having an input line pattern and an output line pattern;
   a second layer having connection terminals for connection to an electronic device to be controlled;
   input terminals on one of said first and said second layers coupled to said input pattern; and
   at least one intermediate layer located between said first layer and said second layer, a plurality of bus lines formed on said at least one intermediate layer;
   a semiconductor device mounted on said multi-layer substrate and having inputs coupled to said input line pattern, and outputs coupled to said connection terminals;
   said first layer, said second layer and said at least one intermediate layer including through holes through which said input terminals are coupled to said bus lines and said semiconductor device outputs are coupled to said connection terminals.

14. A circuit substrate according to claim 13, wherein said input terminals are located on said first layer.

15. A circuit substrate according to claim 13, wherein said input terminals are located on said second layer and are coupled to said input line pattern through said through holes.

16. A circuit substrate according to claim 13, wherein a plurality of said semiconductor devices are mounted on said multi-layer substrate.

17. A circuit substrate according to claim 13, wherein said semiconductor devices is a large scale integrated circuit.

18. An electronic device comprising:
   a panel having a plurality of electronic elements mounted thereon, and coupled to panel terminals for receiving signals for driving said electronic elements;
   a circuit substrate mounted on said panel, comprising:
   a multi-layer substrate including:
   a first layer having an input line pattern and an output line pattern;
   a second layer having connection terminals coupled to said panel terminals;
   input terminals on one of said first and said second layers coupled to said input pattern; and
   at least one intermediate layer located between said first layer and said second layer, a plurality of bus lines formed on said at least one intermediate layer;
   a semiconductor device mounted on said multi-layer substrate and having inputs coupled to said input line pattern, and outputs coupled to said connection terminals;
   said first layer, said second layer and said at least one intermediate layer including through holes through which said input terminals are coupled to said bus lines and said semiconductor device outputs are coupled to said connection terminals.

19. An electronic device according to claim 18, wherein said electronic elements are pixels, and thus said electronic device is a display device.

20. An electronic device according to claim 18, wherein said electronic elements are liquid crystal light valves, and thus said electronic device is a liquid crystal display device.

21. An electronic device according to claim 18, wherein said electronic elements are thermal print elements, and thus said electronic device is a thermal printing device.

22. An electronic device according to claim 18, further comprising an anisotropic conductive film connecting said connection terminals to said panel terminals.

23. An electronic device according to claim 18, wherein a plurality of said multi-layer substrates, each having at least one of said semiconductor devices mounted thereon, are attached to said panel, the connection terminals of said plurality of said multi-layer substrates are electrically coupled to said panel terminals on said panel, and the input terminals of said plurality of said multi-layer substrates are electrically connected to each other by conductive connection means.

24. An electronic device according to claim 23, wherein said conductive connection means are wires.

25. An electronic device according to claim 23, wherein said conductive connection means are heat seal connections.

26. An electronic device according to claim 23, wherein said conductive connection means are flexible substrate connections.

27. An electronic device according to claim 18, wherein a plurality of said semiconductor devices are mounted on said multi-layer substrate.

28. An electronic device according to claim 22, wherein said anisotropic conductive film includes conductive particles having a diameter, and a layer of an adhesive agent, said layer having a thickness less than the diameter of said conductive particles.

* * * * *